US012645086B2

(12) United States Patent
Yamazaki et al.

(10) Patent No.: US 12,645,086 B2
(45) Date of Patent: Jun. 2, 2026

(54) ELECTRONIC DEVICE AND COMMUNICATION SYSTEM

(71) Applicant: Semiconductor Energy Laboratory Co., Ltd., Atsugi (JP)

(72) Inventors: Shunpei Yamazaki, Setagaya (JP); Yosuke Tsukamoto, Atsugi (JP); Kiyoshi Kato, Atsugi (JP); Tatsuya Onuki, Atsugi (JP); Yoshiaki Oikawa, Atsugi (JP); Kensuke Yoshizumi, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 50 days.

(21) Appl. No.: 18/691,535

(22) PCT Filed: Sep. 9, 2022

(86) PCT No.: PCT/IB2022/058492
§ 371 (c)(1),
(2) Date: Mar. 13, 2024

(87) PCT Pub. No.: WO2023/047236
PCT Pub. Date: Mar. 30, 2023

(65) Prior Publication Data
US 2024/0385456 A1 Nov. 21, 2024

(30) Foreign Application Priority Data

Sep. 22, 2021 (JP) ................................. 2021-153833
Oct. 7, 2021 (JP) ................................. 2021-165556

(51) Int. Cl.
*G02B 27/01* (2006.01)
*G06F 1/16* (2006.01)
(Continued)

(52) U.S. Cl.
CPC ..... *G02B 27/0176* (2013.01); *G02B 27/0172* (2013.01); *G06F 1/163* (2013.01);
(Continued)

(58) Field of Classification Search
CPC ............ G02B 27/0172; G02B 27/0176; G02B 27/0101; G02B 27/0149; G02B 2027/0156; G06T 19/006; G06F 3/011
See application file for complete search history.

(56) References Cited

U.S. PATENT DOCUMENTS 7,248,232 B1 7/2007 Yamazaki et al.
8,605,010 B2 12/2013 Yamazaki et al.
(Continued)

FOREIGN PATENT DOCUMENTS

CN 107003523 A 8/2017
CN 109937443 A 6/2019
(Continued)

OTHER PUBLICATIONS

International Search Report (Application No. PCT/IB2022/058492) Dated Nov. 22, 2022.
(Continued)

*Primary Examiner* — Yuzhen Shen
(74) *Attorney, Agent, or Firm* — Eric J. Robinson; Robinson Intellectual Property Law Office, P.C.

(57) ABSTRACT

A multifunctional display apparatus or electronic device is provided. An electronic device that can switch between VR display and AR display is provided. The electronic device includes a first display apparatus, a second display apparatus, a lens, a screen, a wearing tool, and a housing. The wearing tool has a function of fixing the housing to a head. The housing has a function of being transformed into a first mode that closes to block view and a second mode that opens to allow a front side to be viewed. The electronic (Continued)

device has a function of providing a first image displayed on the first display apparatus through the lens and the screen in the first mode, and a function of providing a second image projected to the screen from the second display apparatus in the second mode.

15 Claims, 44 Drawing Sheets

(51) Int. Cl.
 *G02B 27/00* (2006.01)
 *H10K 59/12* (2023.01)
(52) U.S. Cl.
 CPC .. *G02B 27/0093* (2013.01); *G02B 2027/0154* (2013.01); *H10K 59/12* (2023.02)

(56) References Cited

U.S. PATENT DOCUMENTS

| | | | |
|---|---|---|---|
| 9,366,871 B2 | 6/2016 | Ghosh et al. | |
| 9,733,481 B2 | 8/2017 | Carollo et al. | |
| D800,118 S * | 10/2017 | Xing | D14/372 |
| 10,345,602 B2 | 7/2019 | Carollo et al. | |
| 10,578,879 B2 | 3/2020 | Carollo et al. | |
| 11,079,599 B1 | 8/2021 | Wheelwright et al. | |
| 11,256,102 B2 | 2/2022 | Carollo et al. | |
| 11,785,827 B2 | 10/2023 | Yamazaki et al. | |

| | | | |
|---|---|---|---|
| 2007/0097021 A1 | 5/2007 | Yamazaki et al. | |
| 2016/0116748 A1* | 4/2016 | Carollo | H04N 13/286 359/632 |
| 2019/0346918 A1 | 11/2019 | Akkaya et al. | |
| 2020/0057330 A1 | 2/2020 | Yamazaki et al. | |
| 2022/0197033 A1* | 6/2022 | Liang | H04N 13/332 |
| 2022/0350559 A1* | 11/2022 | Yoon | G06F 3/1423 |
| 2023/0113155 A1 | 4/2023 | Yamazaki et al. | |
| 2023/0228970 A1 | 7/2023 | Hirose et al. | |
| 2024/0087487 A1 | 3/2024 | Yamazaki et al. | |

FOREIGN PATENT DOCUMENTS

| | | | |
|---|---|---|---|
| JP | 2000-002856 A | 1/2000 | |
| JP | 2017-535207 | 11/2017 | |
| JP | 2018-189937 A | 11/2018 | |
| JP | 2020-201569 A | 12/2020 | |
| KR | 2017-0090419 A | 8/2017 | |
| KR | 2019-0076045 A | 7/2019 | |
| WO | WO-2015/194017 | 12/2015 | |
| WO | WO-2016/069398 | 5/2016 | |
| WO | WO-2018/087625 | 5/2018 | |
| WO | WO-2019031593 A1 * | 2/2019 | G02B 27/02 |
| WO | WO-2019/217115 | 11/2019 | |

OTHER PUBLICATIONS

Written Opinion (Application No. PCT/IB2022/058492) Dated Nov. 22, 2022.

* cited by examiner

Electronic device 500

Figure 10:
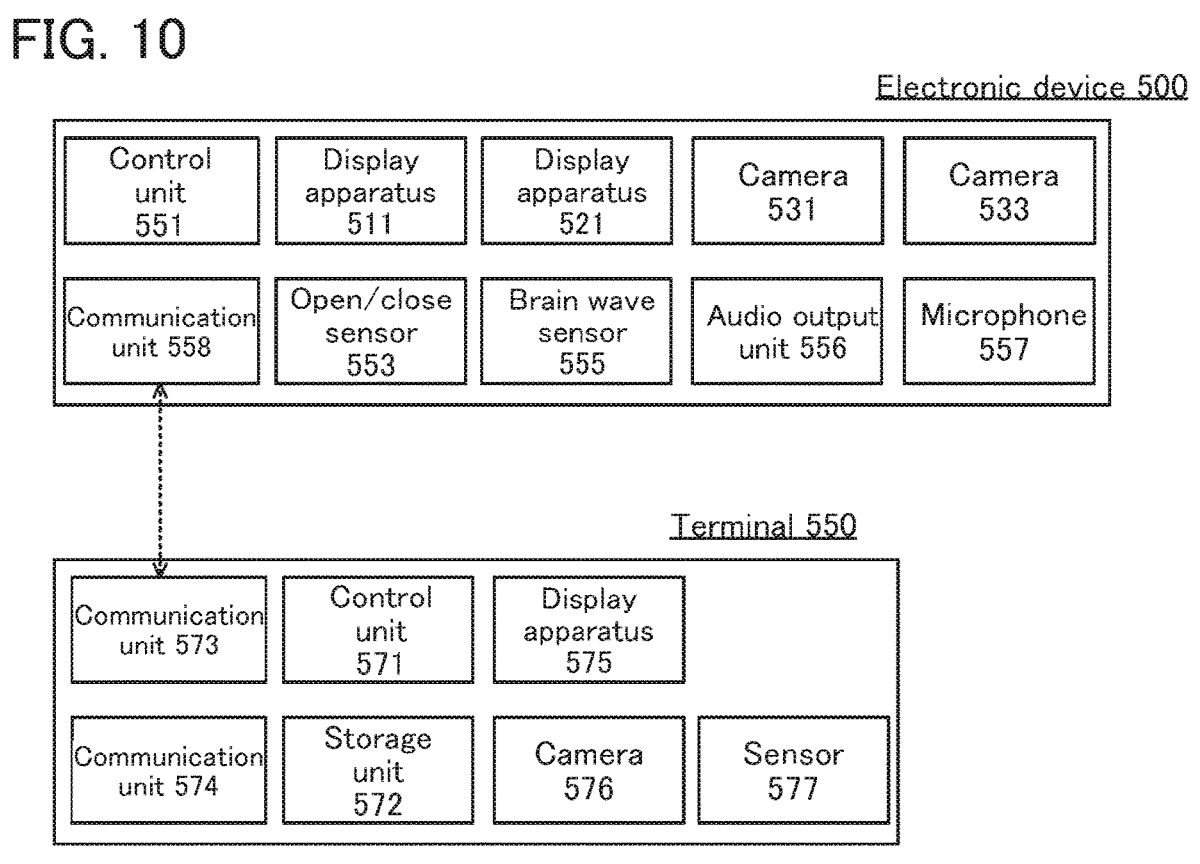

Electronic device 500

| Control unit 551 | Display apparatus 511 | Display apparatus 521 | Camera 531 | Camera 533 |
|---|---|---|---|---|
| Communication unit 558 | Open/close sensor 553 | Brain wave sensor 555 | Audio output unit 556 | Microphone 557 |

Terminal 550

| Communication unit 573 | Control unit 571 | Display apparatus 575 | |
|---|---|---|---|
| Communication unit 574 | Storage unit 572 | Camera 576 | Sensor 577 |

FIG. 14A     FIG. 14B
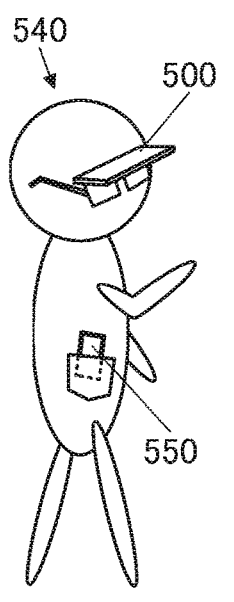
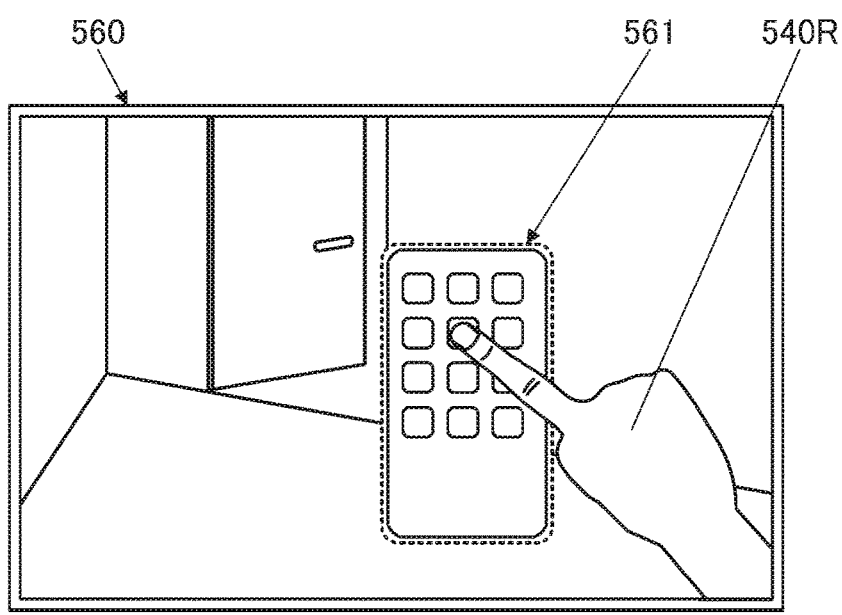
FIG. 14C
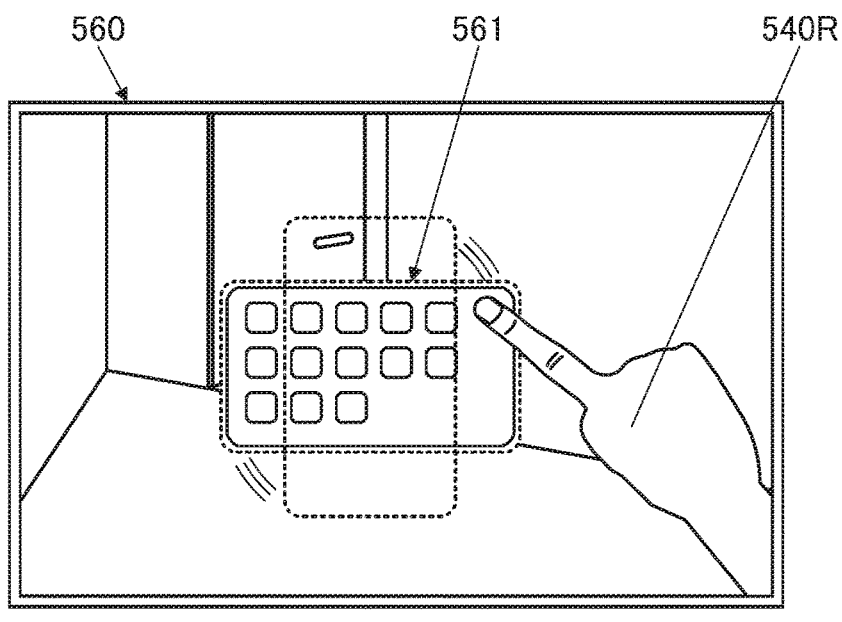

40
Functional circuit

| 33 [1,8] | 33 [2,8] | 33 [3,8] | 33 [4,8] |
| 33 [1,7] | 33 [2,7] | 33 [3,7] | 33 [4,7] |
| 33 [1,6] | 33 [2,6] | 33 [3,6] | 33 [4,6] |
| 33 [1,5] | 33 [2,5] | 33 [3,5] | 33 [4,5] |

| 31 [1,8] | 31 [2,8] | 59 [1,8] | 59 [2,8] | 59 [3,8] | 59 [4,8] | 31 [3,8] | 31 [4,8] |
| 31 [1,7] | 31 [2,7] | 59 [1,7] | 59 [2,7] | 59 [3,7] | 59 [4,7] | 31 [3,7] | 31 [4,7] |
| 31 [1,6] | 31 [2,6] | 59 [1,6] | 59 [2,6] | 59 [3,6] | 59 [4,6] | 31 [3,6] | 31 [4,6] |
| 31 [1,5] | 31 [2,5] | 59 [1,5] | 59 [2,5] | 59 [3,5] | 59 [4,5] | 31 [3,5] | 31 [4,5] |
| 31 [1,4] | 31 [2,4] | 59 [1,4] | 59 [2,4] | 59 [3,4] | 59 [4,4] | 31 [3,4] | 31 [4,4] |
| 31 [1,3] | 31 [2,3] | 59 [1,3] | 59 [2,3] | 59 [3,3] | 59 [4,3] | 31 [3,3] | 31 [4,3] |
| 31 [1,2] | 31 [2,2] | 59 [1,2] | 59 [2,2] | 59 [3,2] | 59 [4,2] | 31 [3,2] | 31 [4,2] |
| 31 [1,1] | 31 [2,1] | 59 [1,1] | 59 [2,1] | 59 [3,1] | 59 [4,1] | 31 [3,1] | 31 [4,1] |

| 33 [1,4] | 33 [2,4] | 33 [3,4] | 33 [4,4] |
| 33 [1,3] | 33 [2,3] | 33 [3,3] | 33 [4,3] |
| 33 [1,2] | 33 [2,2] | 33 [3,2] | 33 [4,2] |
| 33 [1,1] | 33 [2,1] | 33 [3,1] | 33 [4,1] |

| 59<br>[1,8] | 59<br>[2,8] | 59<br>[3,8] | 59<br>[4,8] |
| 59<br>[1,7] | 59<br>[2,7] | 59<br>[3,7] | 59<br>[4,7] |
| 59<br>[1,6] | 59<br>[2,6] | 59<br>[3,6] | 59<br>[4,6] |
| 59<br>[1,5] | 59<br>[2,5] | 59<br>[3,5] | 59<br>[4,5] |
| 59<br>[1,4] | 59<br>[2,4] | 59<br>[3,4] | 59<br>[4,4] |
| 59<br>[1,3] | 59<br>[2,3] | 59<br>[3,3] | 59<br>[4,3] |
| 59<br>[1,2] | 59<br>[2,2] | 59<br>[3,2] | 59<br>[4,2] |
| 59<br>[1,1] | 59<br>[2,1] | 59<br>[3,1] | 59<br>[4,1] |

| 31<br>[1,8] | 31<br>[2,8] | 31<br>[3,8] | 31<br>[4,8] |
| 31<br>[1,7] | 31<br>[2,7] | 31<br>[3,7] | 31<br>[4,7] |
| 31<br>[1,6] | 31<br>[2,6] | 31<br>[3,6] | 31<br>[4,6] |
| 31<br>[1,5] | 31<br>[2,5] | 31<br>[3,5] | 31<br>[4,5] |
| 31<br>[1,4] | 31<br>[2,4] | 31<br>[3,4] | 31<br>[4,4] |
| 31<br>[1,3] | 31<br>[2,3] | 31<br>[3,3] | 31<br>[4,3] |
| 31<br>[1,2] | 31<br>[2,2] | 31<br>[3,2] | 31<br>[4,2] |
| 31<br>[1,1] | 31<br>[2,1] | 31<br>[3,1] | 31<br>[4,1] |

30b

20

14

| 33<br>[1,8] | 33<br>[2,8] | 33<br>[3,8] | 33<br>[4,8] |
| 33<br>[1,7] | 33<br>[2,7] | 33<br>[3,7] | 33<br>[4,7] |
| 33<br>[1,6] | 33<br>[2,6] | 33<br>[3,6] | 33<br>[4,6] |
| 33<br>[1,5] | 33<br>[2,5] | 33<br>[3,5] | 33<br>[4,5] |
| 33<br>[1,4] | 33<br>[2,4] | 33<br>[3,4] | 33<br>[4,4] |
| 33<br>[1,3] | 33<br>[2,3] | 33<br>[3,3] | 33<br>[4,3] |
| 33<br>[1,2] | 33<br>[2,2] | 33<br>[3,2] | 33<br>[4,2] |
| 33<br>[1,1] | 33<br>[2,1] | 33<br>[3,1] | 33<br>[4,1] |

30a

40
Functional circuit

200A

<u>200B</u>

200C

200D

200E

200E

200G

ELECTRONIC DEVICE AND COMMUNICATION SYSTEM

TECHNICAL FIELD

One embodiment of the present invention relates to a display apparatus. One embodiment of the present invention relates to an electronic device including a display apparatus. One embodiment of the present invention relates to a communication system of an electronic device.

Note that one embodiment of the present invention is not limited to the above technical field. Examples of a technical field of one embodiment of the present invention disclosed in this specification and the like include a semiconductor device, a display apparatus, a light-emitting apparatus, a power storage device, a storage device, an electronic device, a lighting device, an input device, an input/output device, a driving method thereof, and a fabricating method thereof. A semiconductor device refers to any device that can function by utilizing semiconductor characteristics.

BACKGROUND ART

As electronic devices with display apparatuses for augmented reality (AR) or virtual reality (VR), wearable electronic devices, stationary electronic devices, and the like are becoming widespread. Examples of wearable electronic devices include a head-mounted display (HMD) and an eyeglass-type electronic device. Examples of stationary electronic devices include a head-up display (HUD).

When using an electronic device such as an HMD with a short distance between a display portion and a user, the user is likely to perceive pixels and strongly feels granularity, whereby the sense of immersion and realistic sensation of AR or VR might be diminished. Thus, an HMD is preferably provided with a display apparatus that has minute pixels so that the pixels are not perceived by the user. Patent Document 1 discloses a method in which an HMD including minute pixels is achieved by using minute transistors capable of high-speed operation.

REFERENCE

Patent Document

[Patent Document 1] Japanese Published Patent Application No. 2000-2856

SUMMARY OF THE INVENTION

Problems to be Solved by the Invention

An object of one embodiment of the present invention is to provide a multifunctional display apparatus or electronic device. Another object is to provide a display apparatus or an electronic device that can switch between VR display and AR display. Another object is to provide a wearable electronic device with a novel structure. Another object is to provide a display apparatus or an electronic device with high visibility. Another object is to provide a display apparatus or an electronic device with low-power consumption. Another object is to provide a display apparatus or an electronic device capable of intuitive operation. Another object is to provide an electronic device that can be easily reduced in size. Another object is to provide an electronic device that can be easily reduced in weight.

An object of one embodiment of the present invention is to provide a display apparatus with a novel structure or an electronic device with a novel structure. Another object of one embodiment of the present invention is to provide a driving method of the display apparatus with a novel structure or a driving method of the electronic device with a novel structure. Another object of one embodiment of the present invention is to provide a driving method of the display apparatus with a novel structure or a driving method of the electronic device with a novel structure. An object of one embodiment of the present invention is to at least alleviate at least one of problems of the conventional technique.

Note that the description of these objects does not preclude the existence of other objects. Note that one embodiment of the present invention does not have to achieve all the objects. Note that objects other than these can be derived from the description of the specification, the drawings, the claims, and the like.

Means for Solving the Problems

One embodiment of the present invention is an electronic device including a first display apparatus, a second display apparatus, a lens, a screen, a wearing tool, and a housing. The wearing tool has a function of fixing the housing to a head. The housing has a function of being transformed into a first mode that closes to block view and a second mode that opens to allow a front side to be viewed. The electronic device has a function of providing a first image displayed on the first display apparatus through the lens and the screen in the first mode, and a function of providing a second image projected to the screen from the second display apparatus in the second mode.

Another embodiment of the present invention is an electronic device including a first display apparatus, a second display apparatus, a lens, a screen, a wearing tool, a housing, and a communication unit. The wearing tool has a function of fixing the housing to a head. The housing has a function of being transformed into a first mode that closes to block a field of view and a second mode that opens to allow a front side to be viewed. The electronic device has a function of providing a first image displayed on the first display apparatus through the lens and the screen in the first mode, and a function of providing a second image projected to the screen from the second display apparatus in the second mode. The communication unit has a function of performing wired or wireless communication with a terminal. First image data supplied to the first display apparatus and second image data supplied to second display apparatus are each supplied from the terminal.

In any of the above, it is preferable that the housing include a first portion that opens and closes and a second portion that is fixed to the first screen. Furthermore, it is preferable that the first display apparatus and the lens be provided in the first portion, and the second display apparatus be provided in the second portion In any of the above, it is preferable that a display region of the first display apparatus have a larger area than a display region of the second display apparatus.

In any of the above, it is preferable that the second display apparatus have a higher resolution than the first display apparatus.

In any of the above, it is preferable that each of the first display apparatus and the second display apparatus have a resolution greater than or equal to 3000 ppi and less than or equal to 10000 ppi.

In any of the above, it is preferable that a display region of the first display apparatus have a diagonal size greater than or equal to 1.3 inches and less than or equal to 1.7 inches.

In any of the above, it is preferable that a pair of first cameras and a pair of second cameras be further included. In this case, it is preferable that the first camera have a function of capturing an image of a front side of the housing, and the second camera have a function of capturing an image of a user's eye. Furthermore, it is preferable that the electronic device have a function of obtaining gesture information using the first camera, and a function of obtaining information on an iris or information on movement of a visual line using the second camera.

In the above, it is preferable that a pair of third cameras be further included. It is preferable that the third camera have a function of capturing an image of a front side of the housing. In that case, it is preferable that the third camera have a narrower angle of view than the first camera.

Another embodiment of the present invention is a communication system including the electronic device and the terminal that are described above, and a server. In the communication system, the electronic device and the terminal are capable of communicating with each other, and the terminal and the server are connected to each other via a network

Effect of the Invention

According to one embodiment of the present invention, a multifunctional display apparatus or electronic device can be provided. Alternatively, a display apparatus or an electronic device that can switch between VR display and AR display can be provided. Alternatively, a wearable electronic device with a novel structure can be provided. Alternatively, a display apparatus or an electronic device with high visibility can be provided. Alternatively, a display apparatus or an electronic device with low power consumption can be provided. Alternatively, a display apparatus or an electronic device capable of intuitive operation can be provided. Alternatively, an electronic device that can be easily reduced in size can be provided. Alternatively, an electronic device that can be easily reduced in weight can be provided.

According to one embodiment of the present invention, a display apparatus with a novel structure or an electronic device with a novel structure can be provided. According to another embodiment of the present invention, a driving method of the display apparatus with a novel structure or a driving method of the electronic device with a novel structure can be provided. According to another embodiment of the present invention, a driving method of the display apparatus with a novel structure or a driving method of the electronic device with a novel structure can be provided. Alternatively, it is possible to at least reduce at least one of problems of conventional art.

Note that the description of these effects does not preclude the existence of other effects. Note that one embodiment of the present invention does not need to have all the effects. Note that effects other than these can be derived from the description of the specification, the drawings, the claims, and the like.

BRIEF DESCRIPTION OF THE DRAWINGS

FIG. 10 is a block diagram illustrating a structure example of an electronic device and a terminal.

FIG. 14A to FIG. 14C are diagrams illustrating examples of images of an electronic device.

FIG. 31 is a diagram illustrating a structure example of a display apparatus.

FIG. 32 is a diagram illustrating a structure example of a display apparatus.

MODE FOR CARRYING OUT THE INVENTION

Figure 1A:
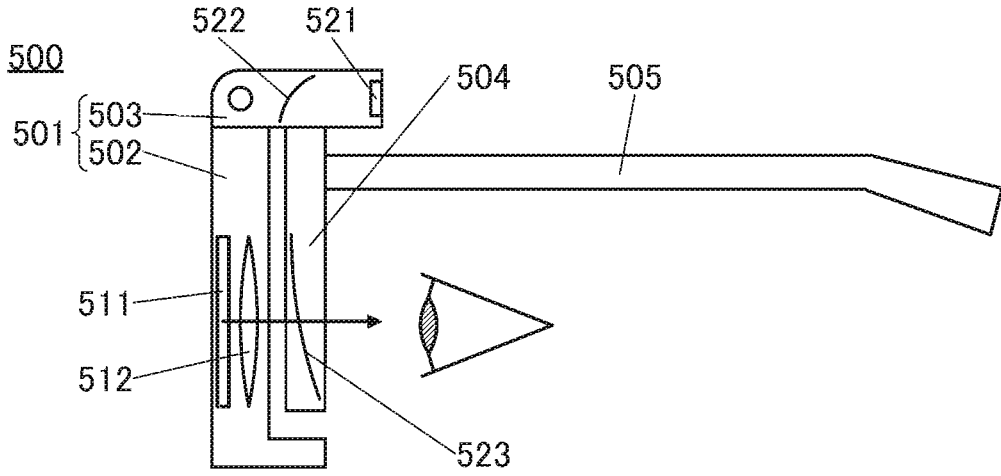
FIG. 1A and FIG. 1B are diagrams illustrating a structure example of an electronic device.

Hereinafter, embodiments are described with reference to the drawings. Note that the embodiments can be implemented in many different modes, and it is readily understood by those skilled in the art that modes and details thereof can be changed in various ways without departing from the spirit and scope thereof. Thus, the present invention should not be interpreted as being limited to the following description of the embodiments.

Note that in structures of the invention described below, the same portions or portions having similar functions are denoted by the same reference numerals in different drawings, and the description thereof is not repeated. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, they are not limited to the illustrated scale.

Note that in this specification and the like, the ordinal numbers such as "first" and "second" are used in order to avoid confusion among components and do not limit the number. Note that in this specification, an EL layer means a layer containing at least a light-emitting substance (also referred to as a light-emitting layer) or a stack including the light-emitting layer provided between a pair of electrodes of a light-emitting element.

In this specification and the like, a display panel that is one embodiment of a display apparatus has a function of displaying (outputting) an image or the like on (to) a display surface. Therefore, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Embodiment 1

In this embodiment, a display apparatus of one embodiment of the present invention and an electronic device including a display apparatus are described.

One embodiment of the present invention is an electronic device that can be worn on a head. The electronic device has a function of performing display in a variety of display modes. For example, the electronic device can switch an AR display mode and a VR display mode. The AR display mode is a mode in which a real-world scenery viewed through a screen can be displayed to be superposed on an image displayed on the screen. The VR mode is a mode in which an image can be displayed while the view is blocked such that a real-world scenery cannot be viewed.

The electronic device of one embodiment of the present invention includes a housing including a mechanism capable of opening and closing and a wearing tool for wearing on a head. The housing includes two display apparatuses (a first display apparatus and a second display apparatus). In the VR mode, an image displayed on a display portion of the first display apparatus placed inside the housing is presented to the user while the housing closes to block the user's view. In the AR mode, an image projected from the second display apparatus to the screen is presented to the user while the housing opens to allow the user to see a real-world scenery through the light-transmitting screen.

The housing is preferably provided with a plurality of image sensors (cameras). When an image of hands is captured by a camera pointed at the outside of the housing, hand movement (gesture) can be acquired as information, which enables gesture operation and thus enables intuitive operation. When an image of the user's eyes is captured by a camera pointed at the inner side of the housing, eye information, visual-line movement information, or the like used for authentication processing, health management, or eye tracking can be obtained. The information may be processed by the electronic device itself or may be sent to a terminal different from the electronic device or a server and processed.

It is preferable that the first display apparatus and the second display apparatus have an extremely high resolution. For example, it is possible to use display apparatuses with a resolution of higher than or equal to 1000 ppi, preferably higher than or equal to 2000 ppi, further preferably higher than or equal to 3000 ppi, still further preferably higher than or equal to 4000 ppi, yet further preferably higher than or equal to 5000 ppi, and yet still further preferably higher than or equal to 6000 ppi, and lower than or equal to 10000 ppi, lower than or equal to 9000 ppi, or lower than or equal to 8000 ppi.

It is preferable that the number of pixels (definition) be as large as possible in the first display apparatus and the second display apparatus. For example, the definition can be HD (number of pixels: 1280×720), FHD (number of pixels: 1920×1080), or WQHD (number of pixels: 2560×1440). Furthermore, it is preferable that the first display apparatus and the second display apparatus have extremely high definition such as WQXGA (number of pixels: 2560×1600), 4K2K (number of pixels: 3840×2160), or 8K4K (number of pixels: 7680×4320). In particular, definition of 4K2K, 8K4K, or higher is preferable. Note that in the case where the aspect ratio of the display region of each of the first display apparatus and the second display apparatus is 1:1 or in the neighborhood thereof, one embodiment of the present invention is not limited to the above, and it is preferable that the number of signal lines and the number of scan lines be both 1000 or more.

There is no particular limitation on the screen ratio (aspect ratio) of each of the first display apparatus and the second display apparatus. For example, each of the first display apparatus and second display apparatus can be compatible with a variety of screen ratios such as 1:1 (a square), 4:3, 16:9, and 16:10.

It is preferable that the size (area) of the display region of the first display apparatus, which is used as a direct-view type, be larger than that of the second display apparatus. Accordingly, a lens or the like included in a direct-view optical system can be thin and image distortion due to the lens can be small. For example, the diagonal size of the first display apparatus is preferably 0.5 inches or more, further preferably 0.7 inches or more, still further preferably 1 inch or more, yet further preferably 1.3 inches or more, and 2 inches or less or 1.7 inches or less. Specifically, 1.5 inches or a similar size is preferable.

Meanwhile, the second display apparatus, which is used as a projection type, can project an enlarged image on a screen; thus, a small display apparatus can be used as the second display apparatus, leading to a reduction in weight of the electronic device. The resolution of the second display apparatus is preferably higher than that of the first display apparatus. In this case, even an image enlarged on the screen can be displayed without showing graininess and losing the sense of immersion.

Here, the electronic device is preferably capable of wired or wireless communication with an information terminal (hereinafter also referred to as a terminal). An information terminal such as a computer, a game console, a smartphone, a tablet terminal, or a watch-type terminal can be used as the terminal. Data transmission and reception are performed between the electronic device and the terminal, and part or the whole image data displayed on the screen of the terminal can be displayed on the first display apparatus or the second display apparatus of the electronic device. That is, image data to be supplied to the first display apparatus (first image data) and image data to be supplied to the second display apparatus (second image data) are supplied from the terminal to the electronic device. The image displayed on the electronic device may be an image processed by a processing method such as upconversion or downconversion.

The terminal preferably includes a first communication unit for communication with the electronic device and a second communication unit for connection with a communication network such as the Internet and an intranet to perform communication. For example, contents displayed on the electronic device are transmitted to the electronic device through the terminal and executed.

The terminal can have a function of controlling each component of the electronic device. For example, the terminal can have a function of controlling the first display apparatus, the second display apparatus, the plurality of cameras, a variety of sensors, and the like included in the electronic device. Installation of a variety of device drivers for driving the electronic device, application software, and the like in the terminal enables the terminal to control the electronic device. Thus, the electronic device itself does not need to perform large-scale operation, which results in simplification of the structure, thereby facilitating reductions in size and weight of the electronic device. The electronic device, which is worn on a head, is preferably as lightweight as possible.

The terminal preferably includes a battery for supplying electric power to the electronic device, a circuit for charging the battery, and the like. The structure of supplying electric power from the terminal to the electronic device makes it possible to reduce the weight of the electronic device, whereby the burden on the user can be reduced. A battery may also be provided in the electronic device. With a battery provided also in the electronic device, the electronic device can be driven alone. Note that the battery mounted on the electronic device preferably has smaller capacity than that of the terminal because an increase in weight of the electronic device can be reduced.

More specific examples will be described below with reference to drawings.

[Structure Examples of Electronic Device]

Figure 1B:
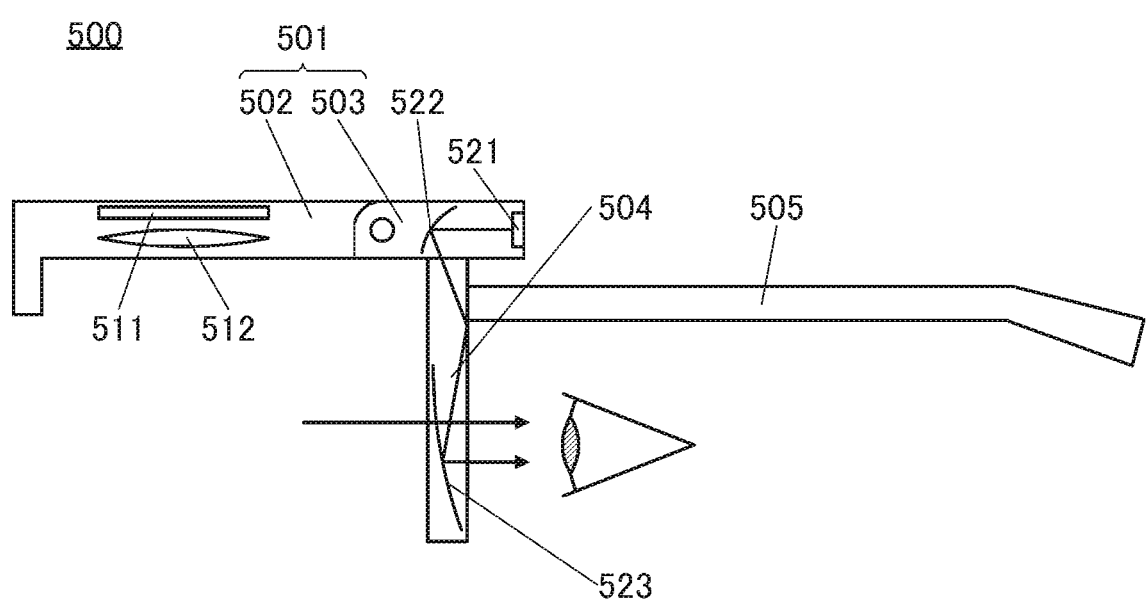

FIG. 1A and FIG. 1B are each a schematic cross-sectional view of an electronic device 500. FIG. 1A corresponds to an embodiment in a VR mode and FIG. 1B corresponds to an embodiment in an AR mode.

The electronic device 500 has a function of a portable information terminal and can execute a variety of programs and reproduce a variety of contents when connected to the Internet, for example. For example, the electronic device 500 has a function of displaying augmented reality contents in the AR mode and a function of displaying virtual reality contents in the VR mode. Note that the electronic device 500 may also have a function of displaying substitutional reality (SR) contents or mixed reality (MR) contents, in addition to AR and VR contents.

The electronic device 500 can be operated intuitively by a gesture operation with one hand or both hands. Conventional smartphones, tablet terminals, and the like have been inconvenient because, for example, the main body needs to be grasped by one hand and the screen needs to be operated by finger(s) of the hand grasping the main body or the other hand, so that at least one hand is occupied by the device even when the screen is small. Meanwhile, the electronic device 500 of one embodiment of the present invention is capable of hands-free operation and thus is preferable.

The electronic device 500 includes a housing 501, an optical member 504, a wearing tool 505, and the like. The housing 501 includes a first portion 502 and a second portion 503. The second portion 503 is fixed to the optical member 504 and the wearing tool 505. The first portion 502 has a mechanism that opens and closes.

The first portion 502 includes a display apparatus 511 and a lens 512. The user can see an image displayed on the display apparatus 511 through the optical member 504 and the lens 512.

The first portion 502 preferably includes a mechanism that adjusts the distance between the display apparatus 511 and the lens 512 or the angle therebetween. This enables focus adjustment and zooming in/out of an image. One or both of the display apparatus 511 and the lens 512 are configured to be movable in the high-axis direction, for example.

The second portion 503 includes a display apparatus 521 and a reflective plate 522. A reflective surface 523 serving as a screen is formed in the optical member 504. The reflective surface 523 functions as a half mirror and transmits light. As indicated by an arrow in FIG. 1B, light emitted from the display apparatus 521 is reflected by the reflective plate 522 and then enters the optical member 504. The light is totally reflected in the optical member 504 and reaches the reflective surface 523, whereby an image is projected on the reflective surface 523. The user can see the image projected on the reflective surface 523 so that the image is superimposed on an image transmitted through the reflective surface 523.

The wearing tool 505 can employ various modes as long as it can be fixed to the user's head. The wearing tool 505 has a shape like a temple of glasses in the example illustrated in FIG. 1A and the like; however, one embodiment of the present invention is not limited thereto. The wearing tool

505 can have any shape with which the user can wear the electronic device, for example, a shape of a helmet or a band.

Figure 2:
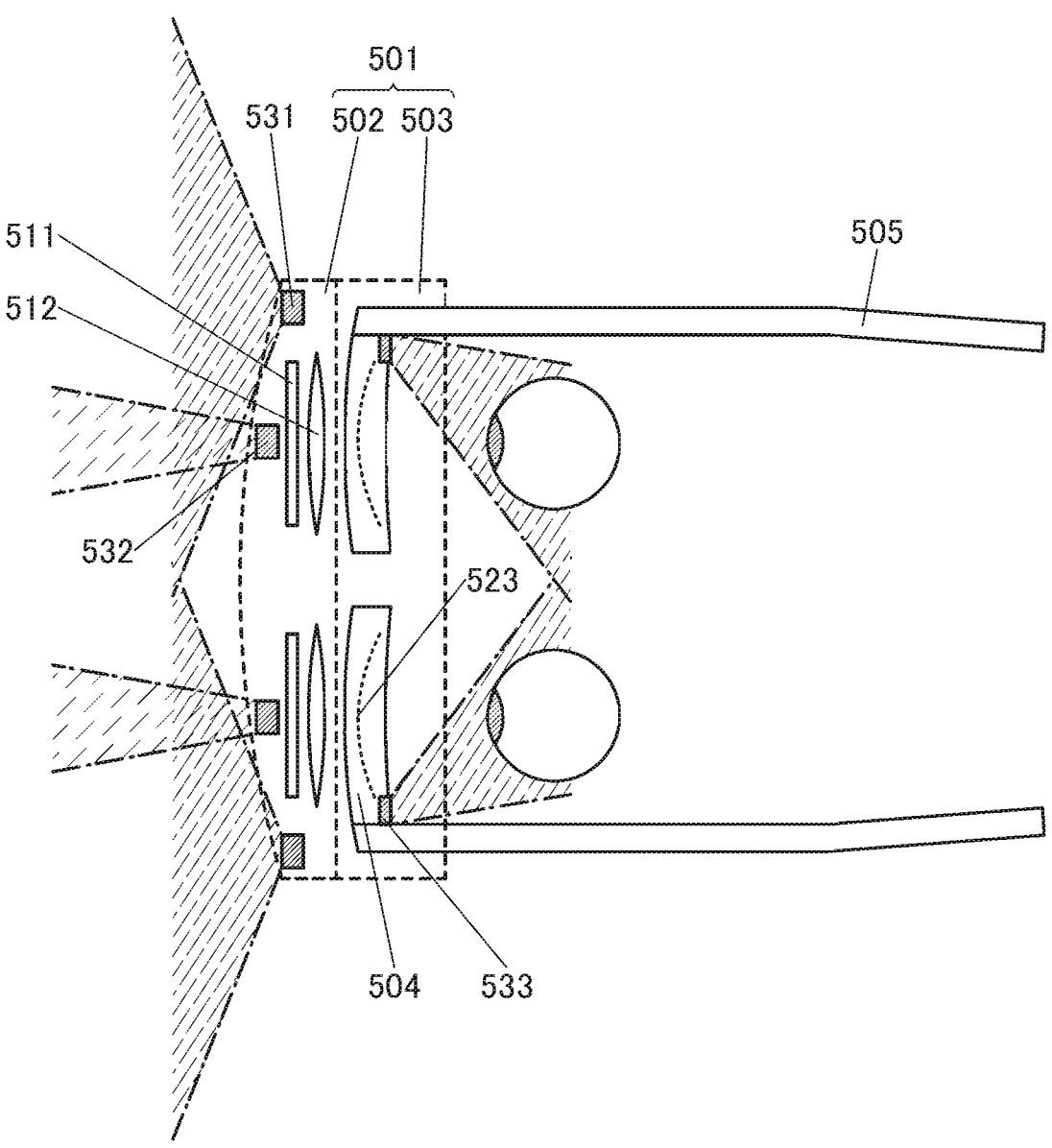
FIG. 2 is a diagram illustrating a structure example of an electronic device.

FIG. 2 is a schematic view of the electronic device 500 seen from above. As illustrated in FIG. 2, the electronic device 500 includes a pair of optical members 504, a pair of wearing tools 505, a pair of display apparatuses 511, and a pair of lenses 512. Note that one display apparatus may be provided instead of the pair of display apparatuses 511.

The electronic device 500 includes two types of imaging devices (a camera 531 and a camera 532) for capturing images of the outside of the electronic device 500. The camera 531 has a function of capturing an image of the front side of the housing 501, and includes a wide-angle lens for capturing an image within a range of about one meter from the electronic device 500, for example. The camera 531 is an imaging device mainly used for capturing an image for performing gesture operation with user's hands movement. The camera 532 is an imaging device mainly used for capturing the scenery and has a lens that is more telephoto than that of the camera 531. That is, the camera 532 has a longer focal length and a narrower angle of view than the camera 531. The camera 531 and the camera 532 may each include a zooming mechanism for changing the focal length. In that case, the camera 532 is selected such that the maximum focal length of the camera 531 is greater than the maximum focal length of the camera 531.

In the structure illustrated in FIG. 2, the electronic device 500 includes a pair of cameras 531 and a pair of cameras 532. The structure enables stereo imaging, making it possible to capture a 3D image and calculate a distance to the object. Note that the electronic device 500 may have a structure including one camera 531 and one camera 532.

The electronic device 500 includes a pair of imaging devices (cameras 533) for capturing an image of the inner side of the electronic device 500. Each of the pair of cameras 533 is a camera for capturing an image of the right eye or the left eye. The cameras 533 preferably have sensitivity to infrared light. Since the cameras 533 can capture images of the use's right and left eyes independently, the images can be used for iris authentication, health care, or eye tracking, for example. Although not illustrated, a light source that emits infrared light used for lighting is preferably included. Note that the electronic device 500 may have a structure including one camera 533 that captures an image of both eyes.

FIG. 2 illustrates examples of image-capturing ranges of the cameras 531, the cameras 532, and the cameras 533 using dashed-dotted lines.

Although the camera 531 is provided in the example shown here, a range sensor capable of measuring a distance to an object (hereinafter also referred to as a detection portion) may be provided as the camera 531. In other words, the camera 531 is one embodiment of the detection portion. As the detection portion, an image sensor or a range image sensor such as LIDAR (Light Detection and Ranging) can be used, for example. By using images obtained by the camera and images obtained by the range image sensor, more information can be obtained and a gesture operation with higher accuracy is possible.

Figure 5A:
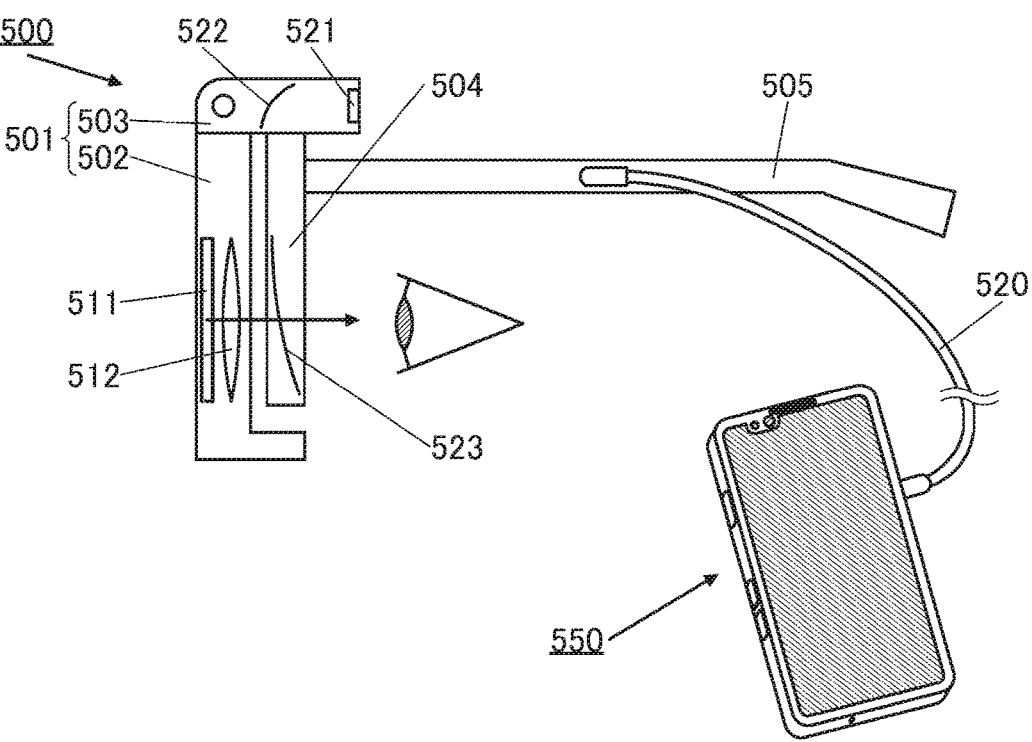
FIG. 5A and FIG. 5B are diagrams illustrating a structure example of an electronic device and a terminal.
Figure 5B:
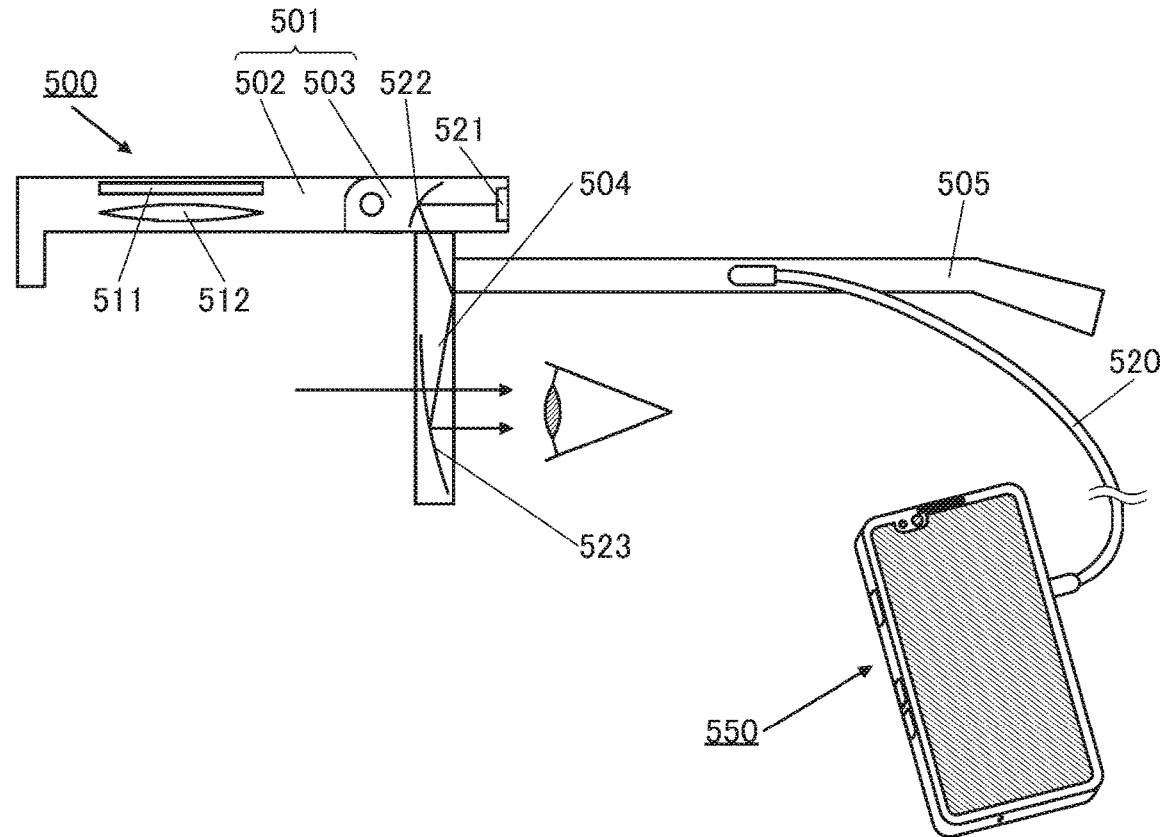
Figures 6A, 6B:
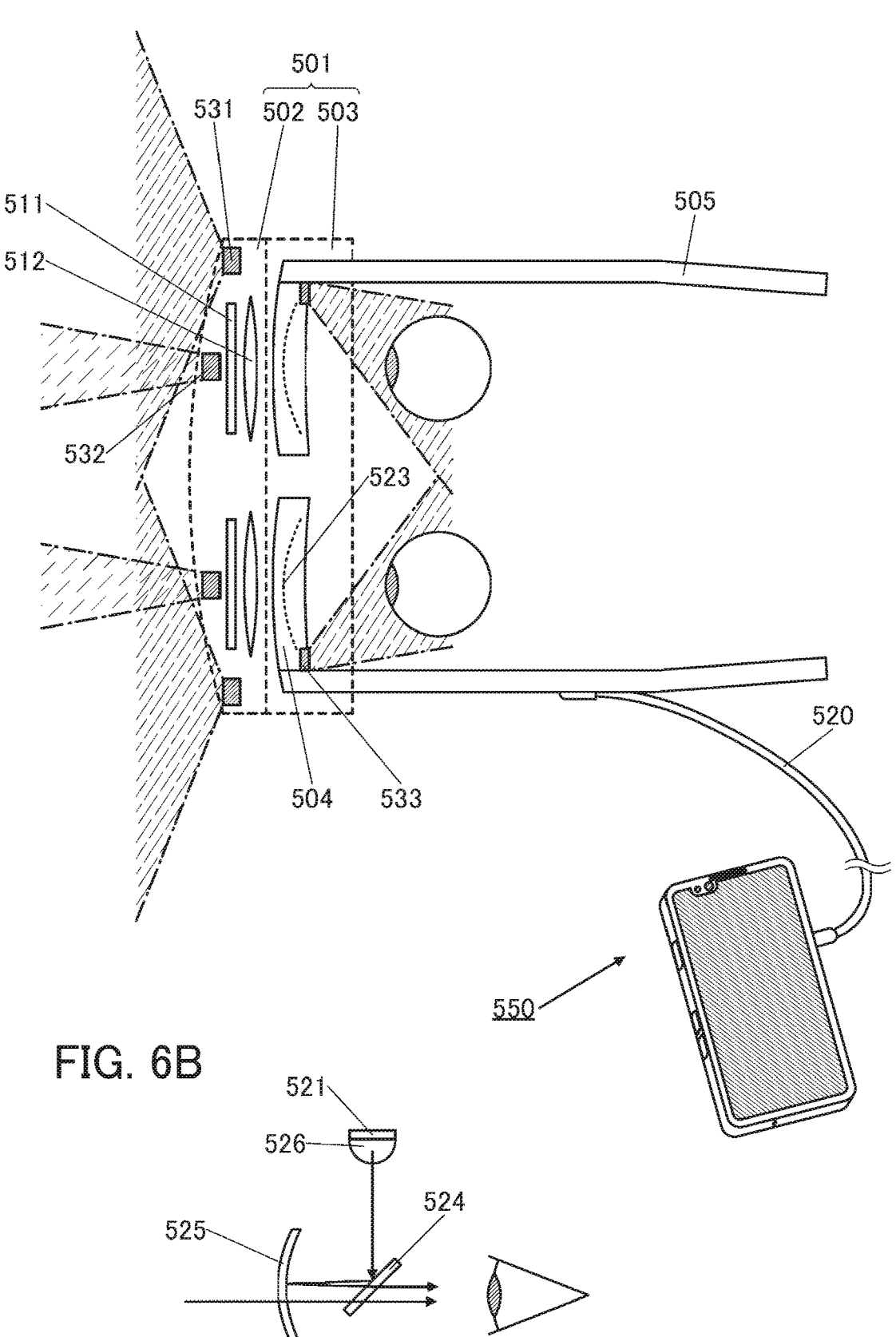
FIG. 6A is a diagram illustrating a structure example of an electronic device and a terminal.
FIG. 6B is a diagram illustrating a structure example of the electronic device.

Next, FIG. 5A, FIG. 5B, and FIG. 6A illustrate an example including the electronic device 500 and a terminal 550. The electronic device 500 is connected to the terminal 550 with a cable 520. In the example illustrated here, a smartphone is used as the terminal 550.

The electronic device 500 can display image contents output from the terminal 550. The electronic device 500 can also be regarded as having a function of an image display device. The electronic device 500 may have a function of displaying SR or MR contents in addition to AR and VR contents, for example.

The electronic device 500 may have a function of a portable information terminal. For example, the electronic device 500 itself may be capable of executing a variety of programs and reproducing a variety of contents when connected to the Internet.

Although image display using the display apparatus 521 is performed with the use of the reflective plate 522 and the reflective surface 523 in the examples illustrated in FIG. 1B and FIG. 5B, a different structure can be employed. For example, FIG. 6B illustrates a structure including an optical member 524 and an optical member 525. The display apparatus 521 is placed to emit an image (light) downward. Part of the light emitted from the display apparatus 521 is reflected by the optical member 524 toward the optical member 525 side and projected on the optical member 525. Part of the light reflected by the optical member 525 passes through the optical member 524 and then reaches the user's eye. Accordingly, an image from the display apparatus 521 can be displayed to be superimposed on actual scenery.

A lens 526 may be provided on the surface side of the display apparatus 521. Furthermore, a microlens array may be provided between the display apparatus 521 and the lens 526.

The optical member 524 and the optical member 525 can each include a polarizing plate, a circularly polarizing plate, a lens, a half mirror, or the like. For example, the optical member 524 functions as a beam splitter and has a function of transmitting light with predetermined polarization and reflecting light with other polarization. The optical member 525 has a function of condensing and reflecting light reflected from the optical member 524 and polarizing the light so that the light can pass through the optical member 524.

Figure 3A:
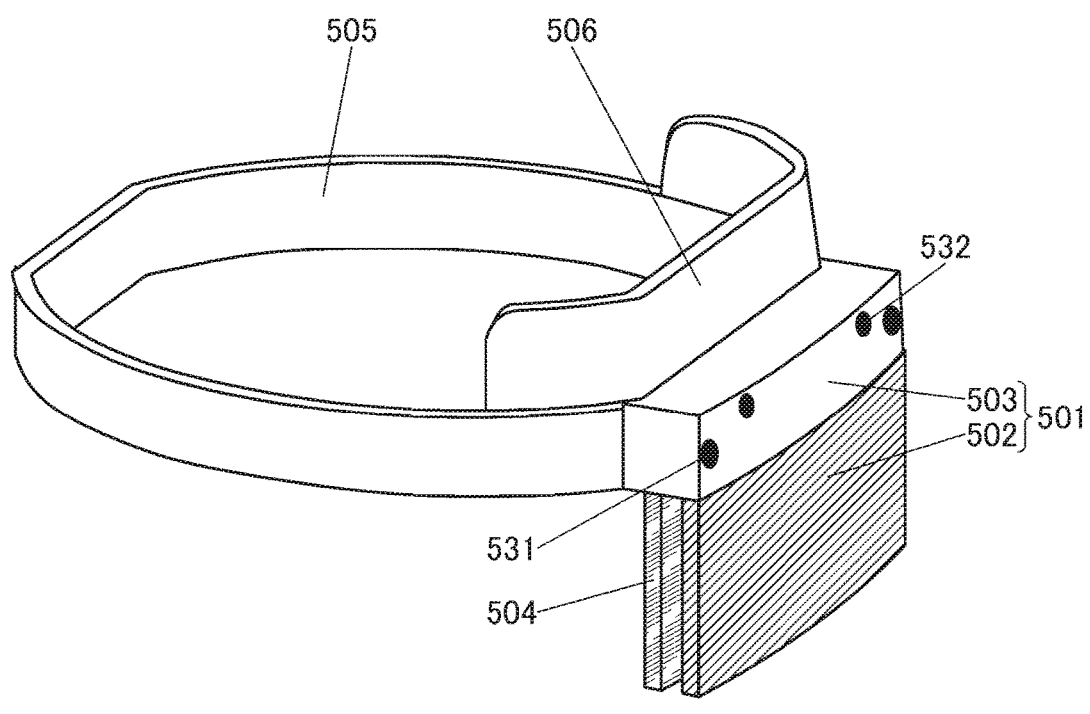
FIG. 3A and FIG. 3B are diagrams illustrating a structure example of an electronic device.
Figure 3B:
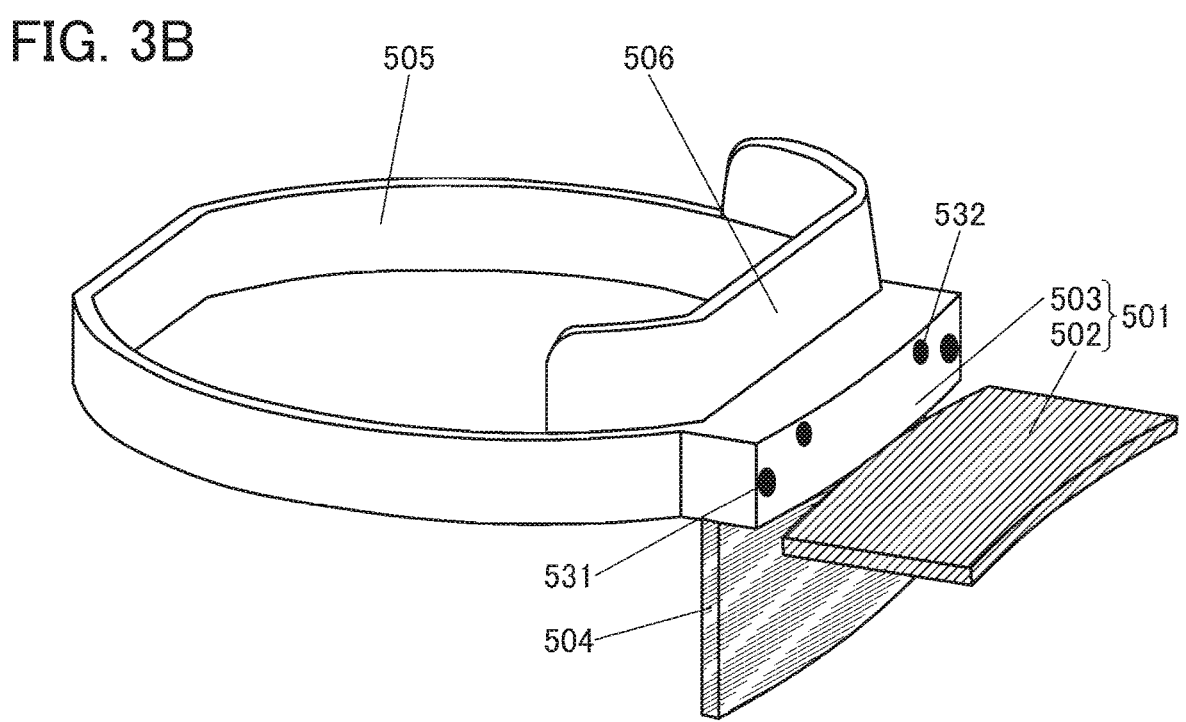

FIG. 3A and FIG. 3B illustrate a structure example of the electronic device 500 different from the above.

In the electronic device illustrated in FIG. 3A and FIG. 3B, the wearing tool 505 has a band-like shape. Accordingly, the electronic device is less likely to slip as compared with the structure illustrated in FIG. 1A and the like and thus is preferable in enjoying contents with relatively large momentum, such as an attraction. Although not illustrated here, a battery or the like may be incorporated in a position facing a portion 506 (on the rear head side) of the wearing tool 505. Striking a balance between the weight of the portion 506 and the weight of the battery can adjust the barycenter of the electronic device 500, whereby the electronic device 500 can be worn more comfortably.

The wearing tool 505 includes the portion 506 covering the user's forehead. Owing to the portion 506, the electronic device 500 is less likely to slip. An electrode can be provided in a portion of the portion 506 in contact with the user's forehead to measure brain waves using the electrode.

Figure 7A:
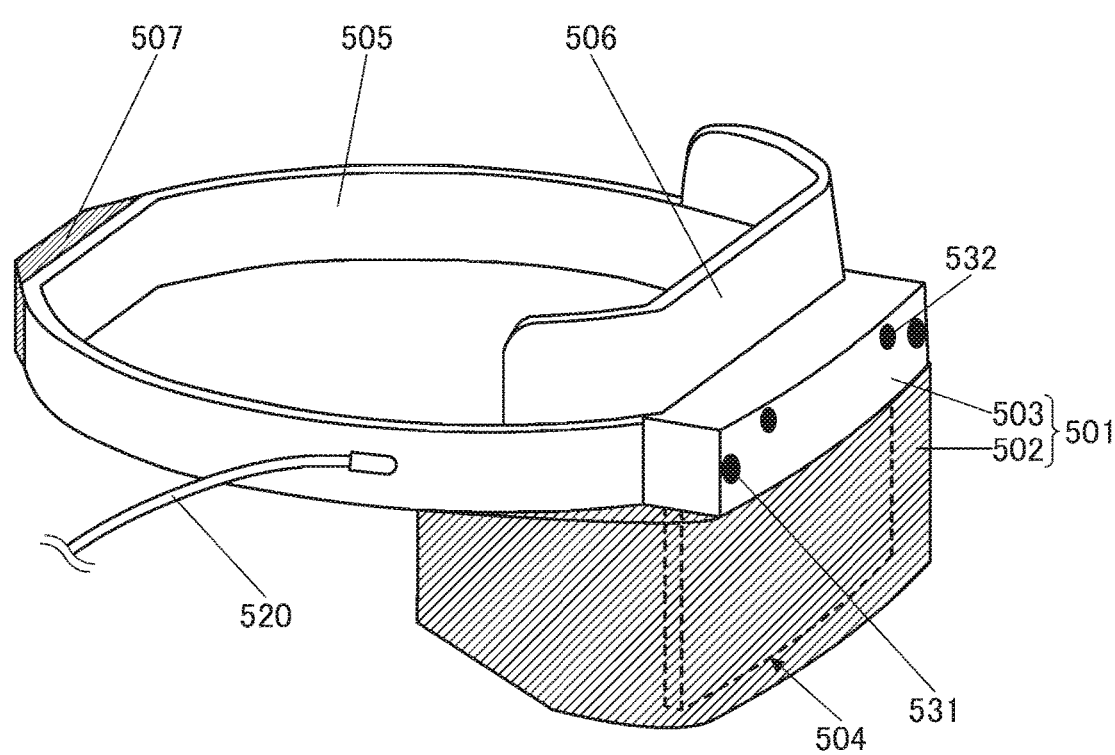
FIG. 7A and FIG. 7B are diagrams illustrating a structure example of an electronic device.
Figure 7B:
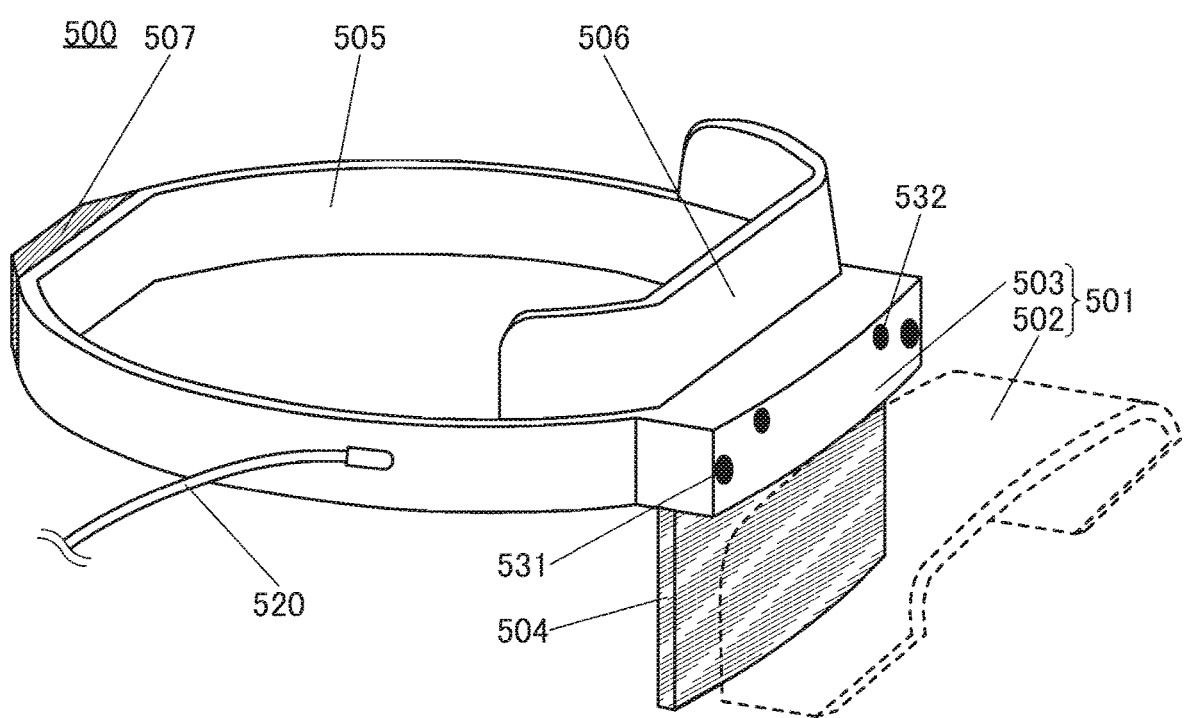

FIG. 7A and FIG. 7B illustrate a structure example of the electronic device 500 different from the above. As illustrated in FIG. 7A, the first portion 502 has a shape that covers not only the front but also the side of the face when closing. Accordingly, the user's view can be blocked from external light, so that realistic sensation and the sense of immersion can be increased. For example, it is also possible to increase user's sense of fear depending on contents to be displayed.

In the example illustrated in FIG. 7A and FIG. 7B, a battery 507 is incorporated on the rear head side of the wearing tool 505. Furthermore, in the example illustrated in FIG. 7A and FIG. 7B, the cable 520 is connected to the wearing tool 505.

Figure 8A:
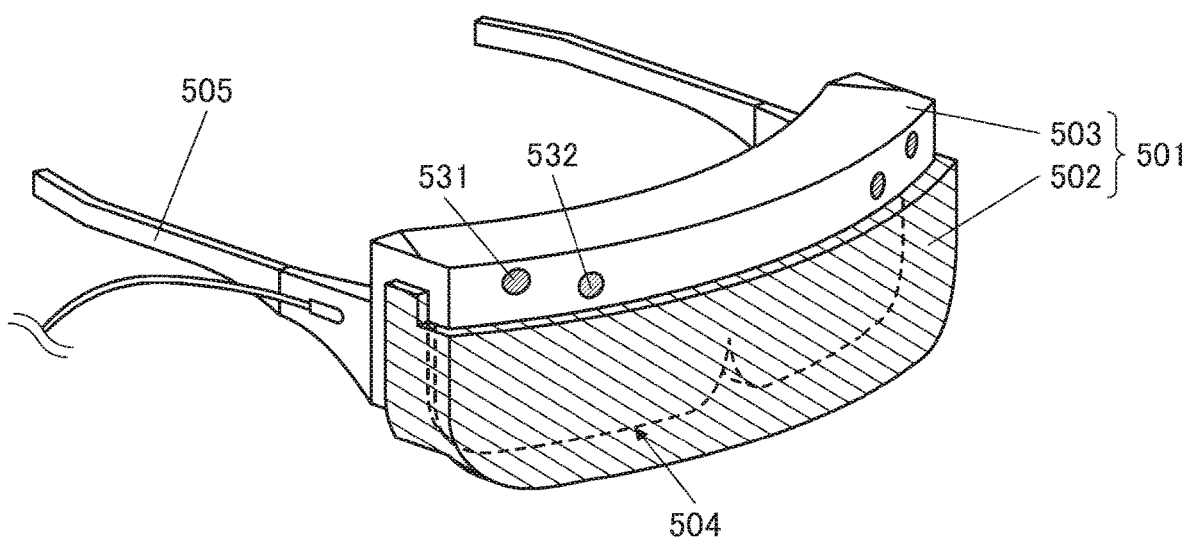
FIG. 8A and FIG. 8B are diagrams illustrating a structure example of an electronic device.
Figure 8B:
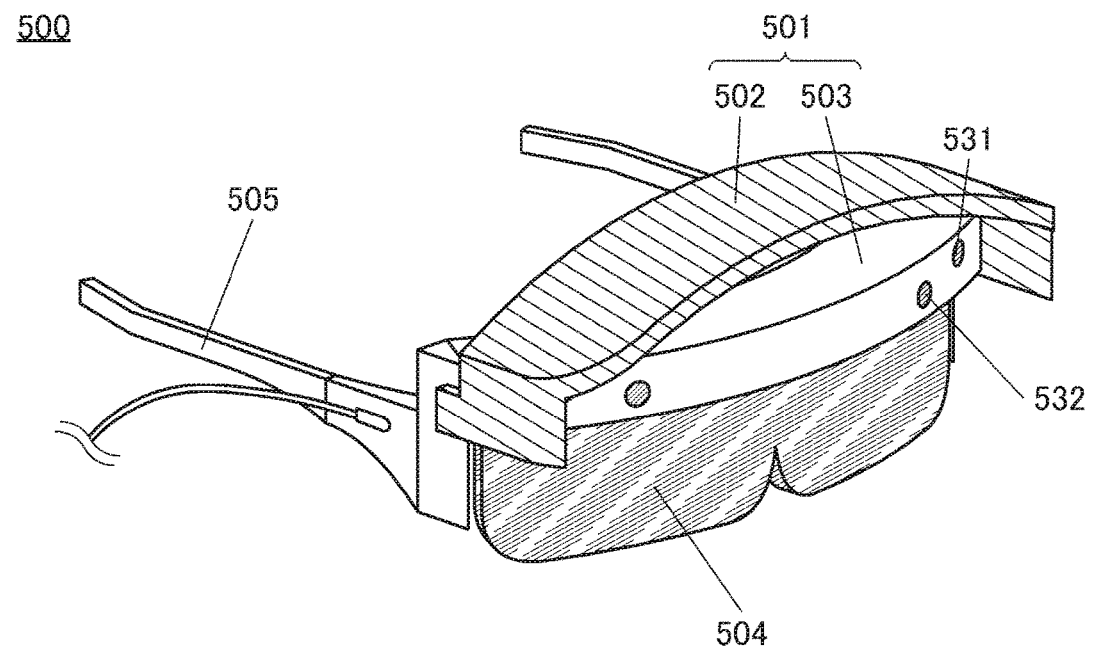

FIG. 8A and FIG. 8B illustrate a structure example of the electronic device 500 different from the above. FIG. 8A illustrates the first portion 502 closing, and FIG. 8B illustrates the first portion 502 opening.

The electronic device 500 illustrated in FIG. 8A and FIG. 8B has a shape that is fixed with the wearing tools 505 hung on ears. The wearing tools 505 may have a function of a speaker utilizing bone conduction, a function of a microphone, or both the functions. That is, the wearing tools 505 can have a speaker utilizing bone conduction, a microphone, or both of them therein and can be configured to be in contact with at least part of the head.

Figure 9A:
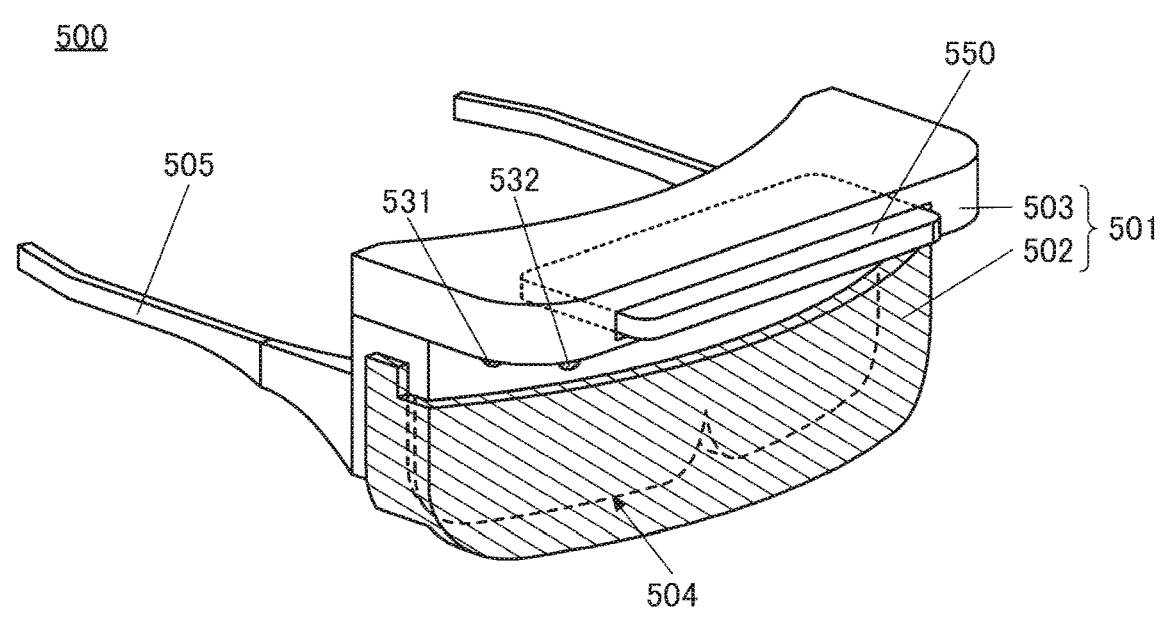
FIG. 9A and FIG. 9B are diagrams illustrating a structure example of an electronic device.
Figure 9B:
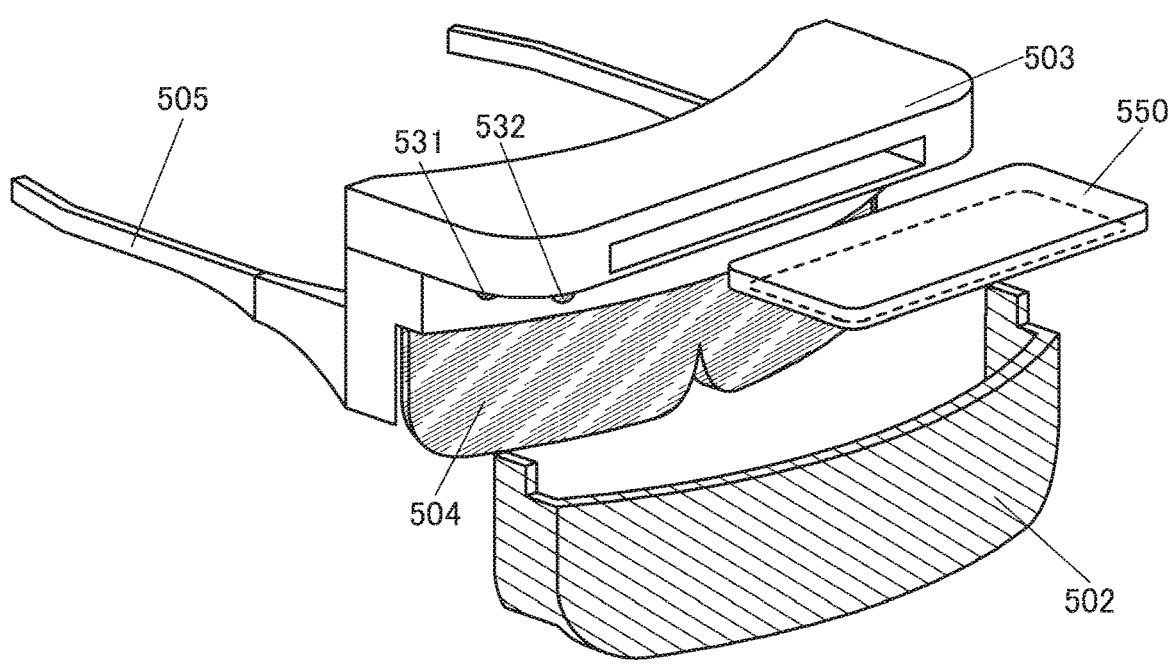

FIG. 9A and FIG. 9B illustrate a structure example of the electronic device 500 different from the above.

The second portion 503 of the housing 501 is provided with a slot into which the terminal 550 is inserted. Inserting the terminal 550 into the slot enables the electronic device 500 and the terminal 550 to communicate with each other. The electronic device 500 preferably includes a mechanism capable of retaining the terminal 550 in this manner because in that case it is unnecessary for the user to select clothes with a pocket or the like in which the terminal 550 is put or to have a bag or the like.

Here, the case where the terminal 550 is a smartphone including a display portion is shown. In such a case, the screen of the terminal 550 may be used as the display apparatus 521 provided in the second portion 503. That is, the terminal 550 may be inserted into the slot so that the screen of the terminal 550 faces downward, and an image displayed on the screen may be projected to the reflective surface 523 included in the optical member 504. Such a structure can simplify the structure of the electronic device 500, thereby facilitating reductions in cost, weight, and size of the electronic device 500.

Furthermore, as illustrated in FIG. 9B, the first portion 502 may be detachable. FIG. 9B illustrates the first portion 502 and the terminal 550 being detached.

[Example of Hardware Structure of Electronic Device]

Figure 4:
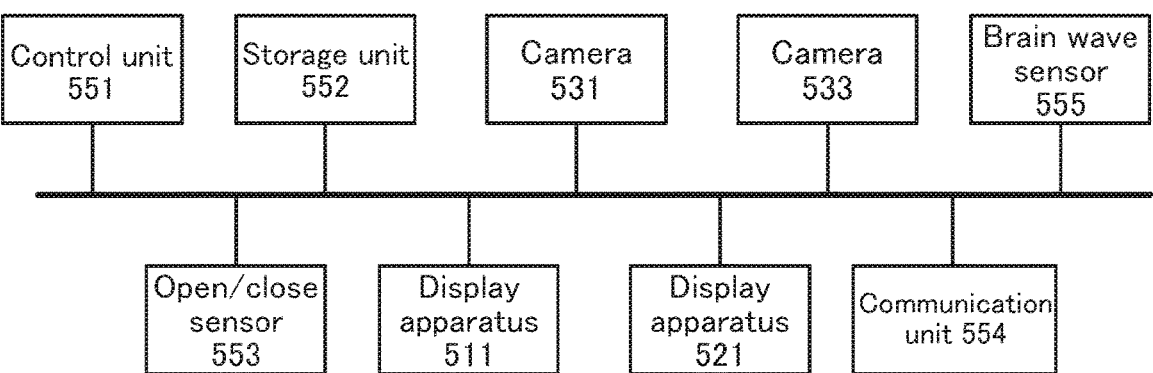
FIG. 4 is a block diagram illustrating a structure example of an electronic device.

FIG. 4 is a block diagram illustrating an example of a hardware structure of part of the electronic device 500. The electronic device 500 includes a control unit 551, a storage unit 552, the camera 531, the camera 533, an open/close sensor 553, the display apparatus 511, the display apparatus 521, a communication unit 554, and the like. The components are electrically connected to one another via a bus line.

Hereinafter, for simple description, in the case where constituent elements other than the control unit 551 included in the electronic device 500 are not distinguished from one another, they are simply referred to as components in some cases, for example.

The control unit 551 can function as, for example, a central processing unit (CPU). The control unit 551 has a function of controlling the components.

The storage unit 552 can store various kinds of data such as program data, system data, and user data. The control unit 551 can read data from the storage unit 552 and can store data in the storage unit 552.

The open/close sensor 553 has a function of obtaining the open/close state of the first portion 502 of the housing 501 and outputting the information to the control unit 551. The open/close sensor 553 includes a mechanical, optical, or electrical switch and can obtain the open/close state of the housing 501.

A brain wave sensor 555 has a function of obtaining the user's brain waves and outputting the information to the control unit 551. The brain wave sensor includes one or more electrodes that are in contact with the user's forehead, for example. The brain wave sensor 555 can obtain information on frequency and amplitude of brain waves such as $\alpha$-waves, $\beta$-waves, $\theta$-waves, and $\delta$-waves. The control unit 551 can estimate the user's wakefulness state or the like from the brain wave information and execute processing in accordance with the wakefulness state.

Signals are transmitted between the control unit 551 and the components via the bus line. The control unit 551 has a function of processing signals input from the components connected via the bus line, a function of generating signals to be output to the components, and the like, so that the components connected to the bus line can be controlled comprehensively.

Note that a transistor that includes an oxide semiconductor in a channel formation region and that achieves an extremely low off-state current can be used in an IC or the like included in the control unit 551 or another component. Since the transistor has an extremely low off-state current, the transistor is used as a switch for holding electric charge (data) which flows into a capacitor functioning as a memory element, whereby a long data retention period can be ensured. By utilizing this characteristic for a register, a cache memory, or the like of the control unit 551, normally-off computing is achieved where the control unit 551 operates only when needed, and otherwise power supply to the control unit 551 is stopped after information on the previous processing is stored in the storage element when the control unit 551 is not used; thus, power consumption of the electronic device 500 can be reduced.

The control unit 551 interprets and executes instructions from various programs with a processor to process various kinds of data and control programs. Programs that might be executed by the processor may be stored in a memory region of the processor or may be stored in the storage unit 552.

A CPU and other microprocessors such as a DSP (Digital Signal Processor) and a GPU (Graphics Processing Unit) can be used alone or in combination as the control unit 551. A structure may be employed in which such a microprocessor is obtained with a PLD (Programmable Logic Device) such as an FPGA (Field Programmable Gate Array) or an FPAA (Field Programmable Analog Array).

The control unit 551 may include a main memory. The main memory can include a volatile memory such as a RAM (Random Access Memory) or a nonvolatile memory such as a ROM (Read Only Memory).

For example, a DRAM (Dynamic Random Access Memory) is used for the RAM provided in the main memory, in which case a memory space as a workspace for the control unit 551 is virtually allocated and used. An operating system, an application program, a program module, program data, and the like which are stored in the storage unit 552 are loaded into the RAM to be executed. The data, program, program module, and the like which are loaded into the RAM are directly accessed and operated by the control unit 551.

Meanwhile, a BIOS (Basic Input/Output System), firmware, and the like for which rewriting is not needed can be stored in the ROM. As the ROM, a mask ROM, an OTPROM (One Time Programmable Read Only Memory), an EPROM (Erasable Programmable Read Only Memory), or the like can be used. Examples of the EPROM include a UV-EPROM (Ultra-Violet Erasable Programmable Read Only Memory) which can erase stored data by ultraviolet irradiation, an EEPROM (Electrically Erasable Programmable Read Only Memory), and a flash memory.

The control unit 551 preferably includes a processor specialized for parallel arithmetic operation as compared with a CPU. For example, a processor including a large number of (several tens to several hundreds of) processor cores capable of parallel processing, such as a GPU, a TPU (Tensor Processing Unit), or an NPU (Neural Processing Unit), is preferably included. Accordingly, the control unit 551 can especially perform arithmetic operation by a neural network at high speed.

As the storage unit 552, a storage device using a nonvolatile storage element, such as a flash memory, an MRAM (Magnetoresistive Random Access Memory), a PRAM (Phase change RAM), an ReRAM (Resistive RAM), or an FeRAM (Ferroelectric RAM); a storage device using a volatile storage element, such as a DRAM (Dynamic RAM) or an SRAM (Static RAM); or the like may be used, for example. Furthermore, a recording media drive such as a hard disk drive (HDD) or a solid state drive (SSD) may be used, for example.

The communication unit 554 can transmit and receive data to and from an external communication device wirelessly. The communication unit 554 can perform communication via an antenna, for example. As for the communication means (communication method) of the communication unit 554, for example, the communication can be performed in such a manner that each device is connected to a computer network such as the Internet, which is the infrastructure of the World Wide Web (WWW), an intranet, an extranet, a PAN (Personal Area Network), a LAN (Local Area Network), a CAN (Campus Area Network), a MAN (Metropolitan Area Network), a WAN (Wide Area Network), or a GAN (Global Area Network). In the case of performing wireless communication, it is possible to use, as a communication protocol or a communication technology, a communications standard such as LTE (Long Term Evolution), GSM (Global System for Mobile Communication: registered trademark), EDGE (Enhanced Data Rates for GSM Evolution), CDMA 2000 (Code Division Multiple Access 2000), or W-CDMA (registered trademark), or a communications standard developed by IEEE such as Wi-Fi (registered trademark), Bluetooth (registered trademark), or ZigBee (registered trademark).

FIG. 10 is a block diagram illustrating an example of part of the hardware structures of the electronic device 500 and the terminal 550. The electronic device 500 includes the control unit 551, the display apparatus 511, the display apparatus 521, the camera 531, the camera 533, a communication unit 558, the open/close sensor 553, the brain wave sensor 555, an audio output unit 556, a microphone 557, and the like. The components are electrically connected to one another via a bus line (not illustrated).

The control unit 551 functions as a central processing unit and has a function of controlling the components. For example, the control unit 551 controls the components in accordance with instructions transmitted from the terminal 550 via the communication unit 558. Furthermore, the control unit 551 has a function of outputting data output from the components to the terminal 550 via the communication unit 558.

As the audio output unit 556, a speaker or a built-in speaker such as a bone-conduction speaker may be used. Audio data may be output to earphones, headphones, an external speaker, or the like with or without a wire.

The terminal 550 includes a control unit 571, a storage unit 572, a communication unit 573, a communication unit 574, a display apparatus 575, a camera 576, a sensor 577, and the like. Note that the structure of the terminal 550 is not limited thereto; a variety of components may be included in accordance with the type of the terminal.

The description of the communication unit 554 can be referred to for the communication unit 574.

The communication unit 573 has a function of performing communication with the communication unit 558 of the electronic device 500. In the case of performing communication by wire connection, the communication unit 573 can include a connection terminal. For example, a general-purpose external connection terminal such as a USB (Universal Serial Bus) can be used.

When communicating with the communication unit 558 by wireless connection, the communication unit 573 can perform sharing with the communication unit 574 as hardware.

The description of the control unit 551 can be referred to for the control unit 571. A processor having higher operation performance than the control unit 551 of the electronic device 500 is preferably used as the control unit 571 included in the terminal 550.

The description of the storage unit 552 can be referred to for the storage unit 572.

As the sensor 577, various sensors can be used in accordance with the type of the terminal 550. For example, a variety of sensors such as a touch sensor, an illuminance sensor, an acceleration sensor, a fingerprint sensor, a temperature sensor, a humidity sensor, a geomagnetic sensor, and a GPS can be used.

[Specific Examples of Terminal and Electronic Device]

Figure 11A:
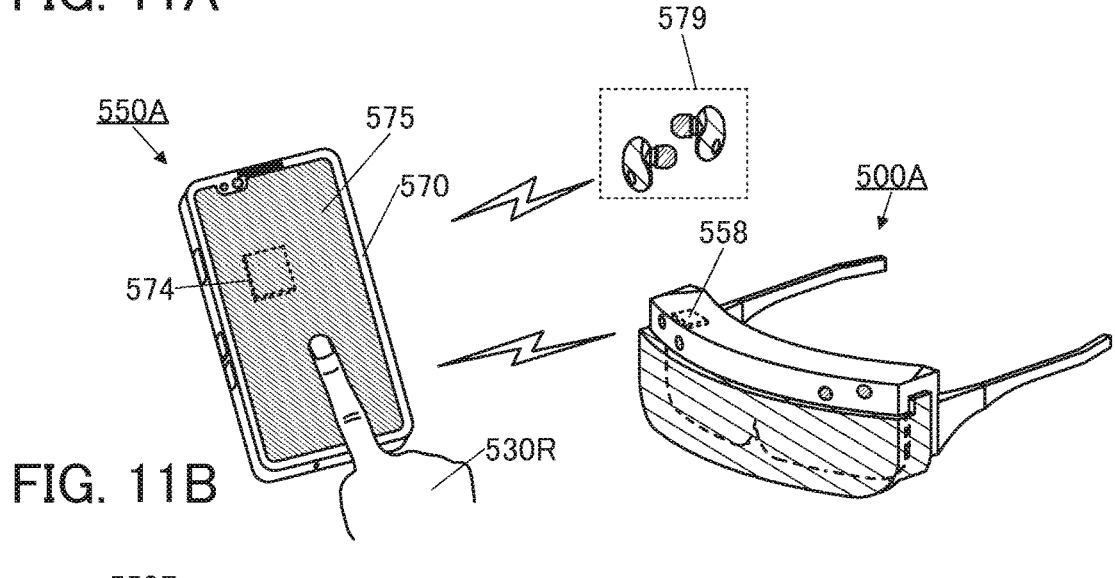
FIG. 11A to FIG. 11C are diagrams illustrating structure examples of an electronic device and a terminal.
Figure 11B:
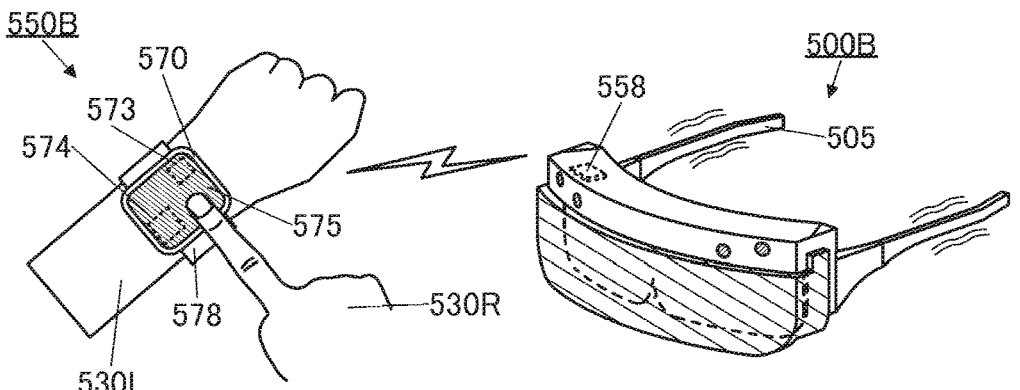
Figure 11C:
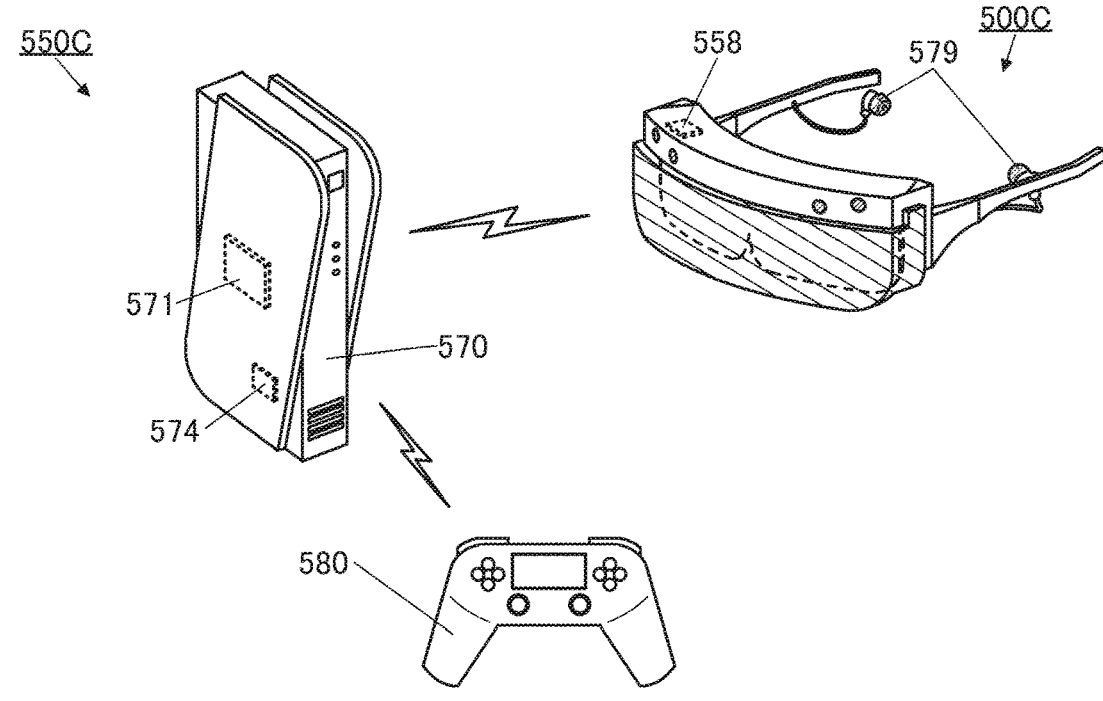

FIG. 11A to FIG. 11C are specific examples of the terminal and the electronic device.

FIG. 11A illustrates a terminal 550A and an electronic device 500A. The terminal 550A and the electronic device 500A each have a wireless communication function.

The terminal 550A is a portable information terminal functioning as a smartphone. The terminal 550A includes a housing 570, the communication unit 574, and the display apparatus 575. In the example illustrated here, the communication unit 574 also serves as the communication unit 573. That is, the communication unit 574 has both a function of performing communication with a server or the like via a network and a function of performing communication with the electronic device 500A. Note that a user's right hand 530R operating the terminal 550A is illustrated in FIG. 11A.

The structure of FIG. 8A can be referred to for the electronic device 500A. The wireless communication between the electronic device 500A and the terminal 550A can be performed between the communication unit 574 and the communication unit 558.

In FIG. 11A, a function of outputting sound to earphones 579 is provided. In the example illustrated here, audio information is output from the terminal 550A to the earphones 579 by wireless communication. Note that without limitation thereto; audio information may be output from the electronic device 500A to the earphones 579.

A terminal 550B illustrated in FIG. 11B has a function of a watch-type portable information terminal. The terminal 550B includes the housing 570, the display apparatus 575, the communication unit 573, the communication unit 574, and a band 578. In addition, the right hand 530R and a left hand 530L of the user are illustrated in FIG. 11B. Wireless communication can be performed between the terminal 550B and an electronic device 500B via the communication unit 573 and the communication unit 558.

The electronic device 500B has an audio output function utilizing bone conduction. In the example illustrated here, sound is provided to the user by vibration of the wearing tools 505 utilizing bone conduction.

A terminal 550C illustrated in FIG. 11C functions as a game console. The terminal 550C includes the communication unit 574 and the control unit 571 at least in the housing 570. The communication unit 574 also serves as the communication unit 573. In addition, a controller 580 is illustrated in FIG. 11C. The controller 580 has a wireless communication function and is connected to the terminal 550C.

The terminal 550C includes a processor, a storage, and the like. With the terminal 550C, the user can start an application and enjoy a variety of game contents. The terminal 550C can execute not only game contents but also applications such as video replay, image reproduction, music replay, and an Internet browser. The terminal 550C can also be used as a personal computer.

Note that although the controller 580 is used in the example described here, the controller 580 is not necessarily used in the case of enjoying a game by a gesture control with a camera of an electronic device 500C.

The electronic device 500C includes the wired earphones 579. The earphones 579 are connected to the wearing tools 505 with cables.

Note that the combination of the electronic device and the terminal is not limited to those illustrated in FIG. 11A to FIG. 11C. That is, for example, the electronic device 500A can be connected to any of the terminal 550A, the terminal 550B, and the terminal 550C.

In this manner, wired or wireless communication can be performed between the electronic device 500 and the terminal 550. Thus, the electronic device 500 can transfer a function of generating image contents (image data) that are to be displayed on the display apparatus 511 and the display apparatus 521, to the terminal 550. In addition, a function of processing data captured by the plurality of cameras included in the electronic device 500 and data obtained by the variety of sensors can be transferred to the terminal 550. Assigning processing requiring high operation performance to the terminal 550 in this manner makes it possible to simplify the structure of the electronic device 500, thereby facilitating reductions in cost, weight, and size of the electronic device 500.

For example, in the case of performing iris authentication, processing may be completed inside the electronic device 500; alternatively, only image capturing is performed by the electronic device 500 and processing for authentication may be performed by the terminal 550. Specifically, the electronic device 500 may perform authentication in such a manner that image data of the user's eye and its surroundings obtained by the camera 533 of the electronic device 500 is output to the terminal 550, and the control unit 571 of the terminal 550 compares it with true authentication data on the user stored in the storage unit 572 or the like of the terminal 550.

Alternatively, the above-described processing may be performed in a server connected via a network without performing processing requiring high operation performance in the electronic device 500 and the terminal 550. Such processing is also called thin client, in which only limited processing is executed by the terminal (here, the terminal 550 and the electronic device 500) on the user side (client side), and execution of an application and a high degree of processing such as management are performed on the server side, whereby the scale of processing of the terminal on the client side can be reduced. In this case, not only the electronic device 500 but also the terminal 550 does not need to use a processor with high operation performance, which facilitates reductions in cost, weight, and size.

For example, in the case of AR display and VR display, it is necessary to perform processing for generating an image synchronized with the movement of the head and the movement of the visual line by using a head tracking function and an eye tracking function, and the processing can be performed by the server. At the time of executing such processing, the fifth-generation mobile communication system (popularly called 5G) with high speed and less delay is preferably used because it can reduce delay as much as possible, thereby reducing so-called VR sickness caused by delay of the image from the movements of the head and eyes.

[Operation Method of Electronic Device]

Figure 12:
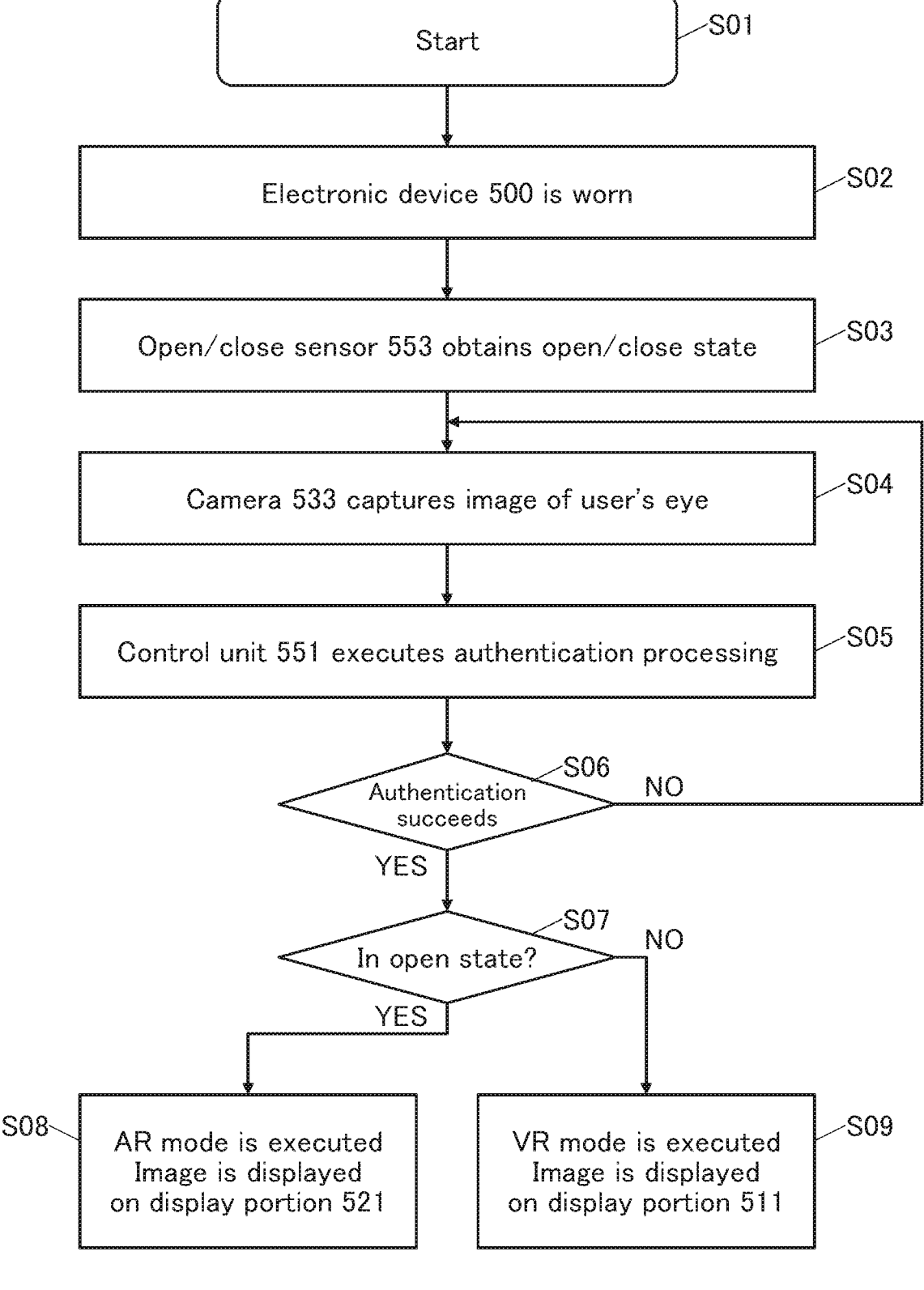
FIG. 12 is a flow chart showing an operation method of an electronic device.

Next, an operation method example of the electronic device 500 illustrated in FIG. 4 is described using a flow chart. FIG. 12 shows the flow chart. The flow chart shown in FIG. 12 is a flow chart of an operation method at the time of starting up the electronic device 500. The flow chart shown in FIG. 12 includes Step S01 to Step S09.

In Step S01, processing starts. At that time, the electronic device 500 is in a power-on state.

In Step S02, the electronic device 500 is worn. The control unit 551 obtains the state where the electronic device 500 is worn based on output data of an acceleration sensor, image data of the variety of cameras, and the like.

In Step S03, the open/close sensor 553 obtains the open/close state of the housing 501 and outputs the information to the control unit 551.

In Step S04, the camera 533 captures an image of the user's eye and outputs the imaging data to the control unit 551.

In Step S05, the control unit 551 executes authentication processing on the basis of the imaging data. For example, the control unit 551 can execute iris authentication processing using the imaging data. Specifically, the control unit 551 compares the features of a captured image of an iris with the true features of the user's iris stored in advance in the storage unit 552 to determine whether the irises belong to the same person. Then, in Step S06, the process proceeds to Step S07 when authentication is established (authentication succeeds).

When the authentication is not established in Step S06, the process returns to Step S04. Note that when the authentication fails a predetermined number of times, processing such as warning may be executed.

In Step S07, when the housing 501 is in an open state, the process proceeds to Step S08; when the housing 501 is in a close state, the process proceeds to Step S09.

In Step S08, the AR mode is executed. Specifically, an image is displayed on the display apparatus 521.

In Step S09, the VR mode is executed. Specifically, an image is displayed on the display apparatus 511.

Note that Step S03 may be performed at any time that is after Step S02 and before Step S07. Alternatively, Step S03 may be performed in parallel with another step.

Figure 13:
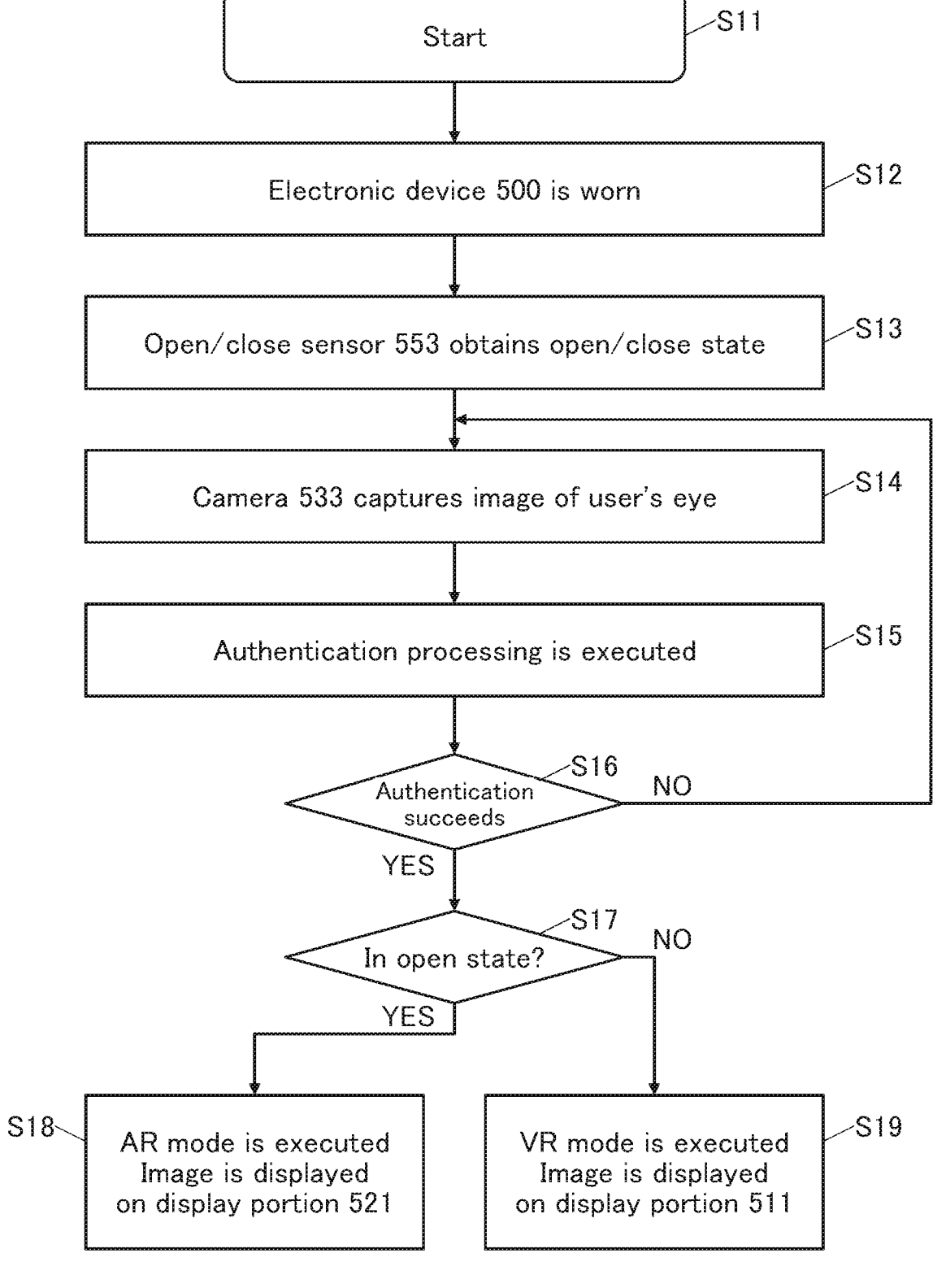
FIG. 13 is a flow chart showing an operation method of an electronic device.

Next, an operation method example is illustrated for the structure including the electronic device 500 and the terminal 550 illustrated in FIG. 10 and the like. A flow chart shown in FIG. 13 is a flow chart of an operation method at the time of starting up the electronic device 500. The flow chart shown in FIG. 13 includes Step S11 to Step S19.

In Step S11, processing starts. At that time, the electronic device 500 is in a power-on state. In addition, the electronic device 500 and the terminal 550 are connected to each other.

In Step S12, the electronic device 500 is worn. The control unit 551 or the control unit 571 obtains the state where the electronic device 500 is worn based on output data of an acceleration sensor, image data of a variety of cameras, and the like.

In Step S13, the open/close sensor 553 obtains the open/close state of the housing 501 and outputs the information to the control unit 551. The control unit 551 outputs the information to the control unit 571 of the terminal 550 via the communication unit 558.

In Step S14, the camera 533 captures an image of the user's eye and outputs the imaging data to the control unit 551.

In Step S15, the control unit 551 or the control unit 571 executes authentication processing on the basis of the imaging data. For example, the control unit 551 or the control unit 571 can execute iris authentication processing using the imaging data. Specifically, the control unit 551 or the control unit 571 compares the features of a captured image of an iris with the true features of the user's iris stored in advance in the storage unit 572 or the like to determine whether the irises belong to the same person. Then, in Step S16, the process proceeds to Step S17 when authentication is established (authentication succeeds)

When the authentication is not established in Step S16, the process returns to Step S14. Note that when the authentication fails a predetermined number of times, processing such as warning may be executed.

In Step S17, when the housing 501 is in an open state, the process proceeds to Step S18; when the housing 501 is in a close state, the process proceeds to Step S19.

In Step S18, the AR mode is executed. Specifically, an image is displayed on the display apparatus 521.

In Step S19, the VR mode is executed. Specifically, an image is displayed on the display apparatus 511.

Note that Step S13 may be performed at any time that is after Step S12 and before Step S17. Alternatively, Step S13 may be performed in parallel with another step.

The above is the description of the operation method example.

[Example of Image]

Hereinafter, examples of an operation method that a user can experience with a display system of one embodiment of the present invention and examples of an image that can be presented to the user will be described.

FIG. 14A illustrates a user 540 performing gesture operation with the electronic device 500 worn on. The user 540 has the terminal 550 in the pocket. The electronic device 500 and the terminal 550 communicate with each other. Since the housing of the electronic device 500 is in an open state at that time, the user 540 can see an image displayed in the AR mode. Note that in the case where only the electronic device 500 is used, the user 540 does not necessarily have the terminal 550 and the pocket for storing the terminal 550.

FIG. 14B illustrates an example of a field of view 560 of the user 540 in FIG. 14A. The field of view 560 includes image information 561 superimposed on a real-world indoor scenery including a floor, a wall, a door, and the like. Here, an image imitating a screen of a smartphone or a tablet terminal is illustrated as the image information 561.

Since the user can operate the image information 561 that appears to float in the air as in the case of operating a smartphone, the user can use the electronic device 500 without feeling uncomfortable. When an edge of the image information 561 is operated as illustrated in FIG. 14C, the image information 561 can be rotated from portrait orientation to landscape orientation.

Figure 15A:
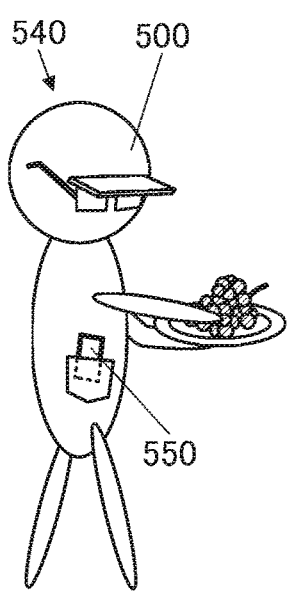
FIG. 15A to FIG. 15D are diagrams illustrating examples of images of an electronic device.

FIG. 15A illustrates the user 540 about to eat grapes with the electronic device 500 worn on. Since the electronic device 500 is in an open state at that time, the user 540 can see an image displayed in the AR mode.

Figure 15B:
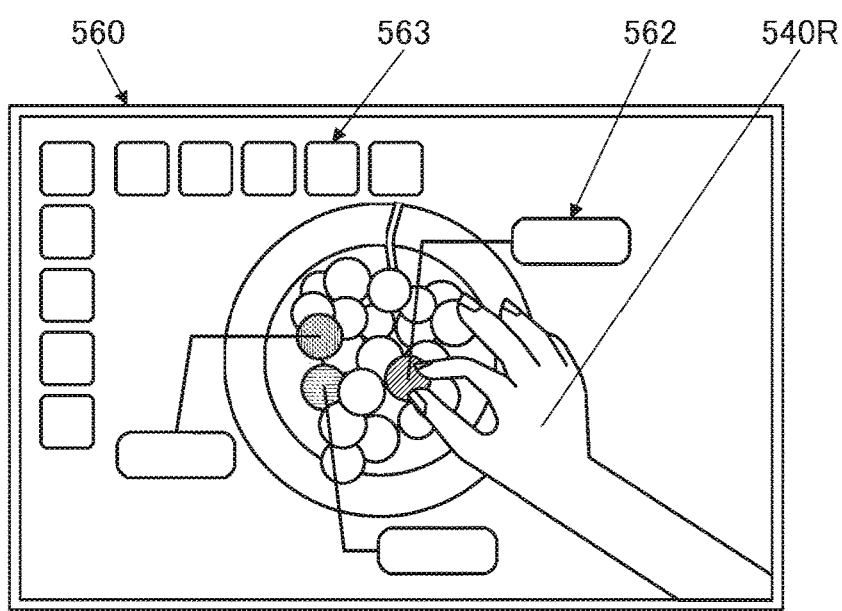

FIG. 15B illustrates an example of the field of view 560 of the user 540. The electronic device 500 can determine which grape is sweet based on the captured image information on the grapes and indicate the grape with display of a colored marker superposed on the real one. In addition, image information 562 indicating information on the selected grape is displayed in the user's field of view, and an image 563 functioning as a menu icon and the like are displayed on the outer periphery of the field of view.

Figure 15C:
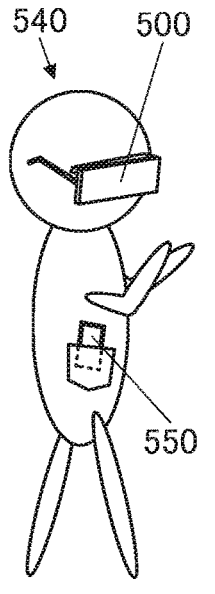

FIG. 15C illustrates the user 540 performing gesture operation with the electronic device 500 worn on. Since the housing of the electronic device 500 is in a close state at that time, the user 540 can see an image displayed in the VR mode.

Figure 15D:
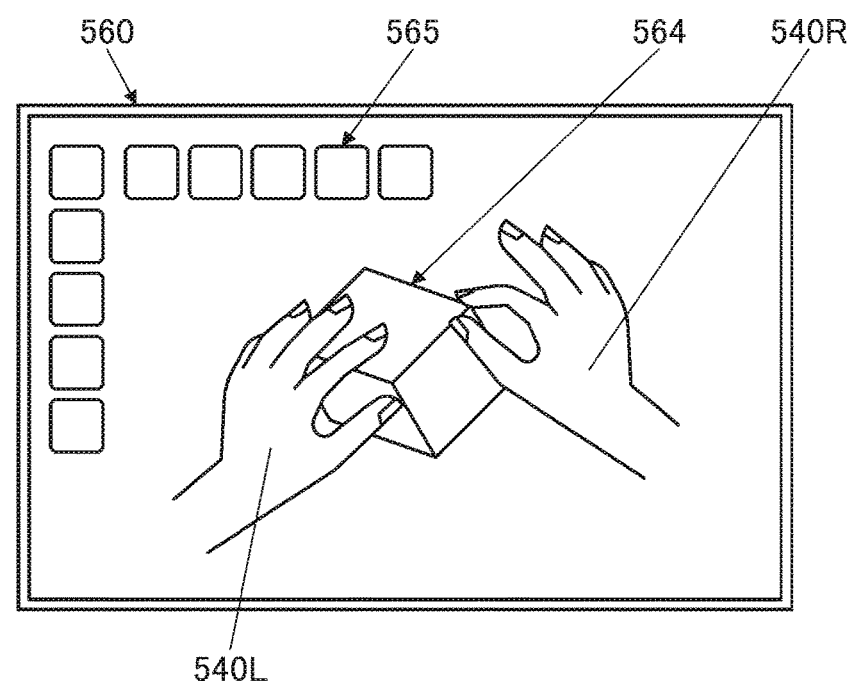

FIG. 15D illustrates an example of the field of view 560 of the user 540. The user performs 3D modeling (molding) with an object 564 displayed on a virtual space. A right hand 540R and a left hand 540L displayed on the field of view 560 are images that move in synchronization with the right hand and left hand of the user 540. Molding can be performed by changing the shape of the object 564 by a variety of operations such as grasping, picking, pulling, and twisting the object 564. In addition, pushing a menu icon 565 allows use of molding tools such as a knife and a spatula.

As described above, in the electronic device 500 of one embodiment of the present invention, it is possible to experience both the AR mode and the VR mode with one device. Furthermore, the AR mode and the VR mode can be switched in the electronic device 500 in an extremely simple way, e.g., by opening/closing the housing.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 2

Hereinafter, a structure example of a display apparatus applicable to the display apparatus of the electronic device described as an example in Embodiment 1 will be described with reference to drawings.

Figure 16A:
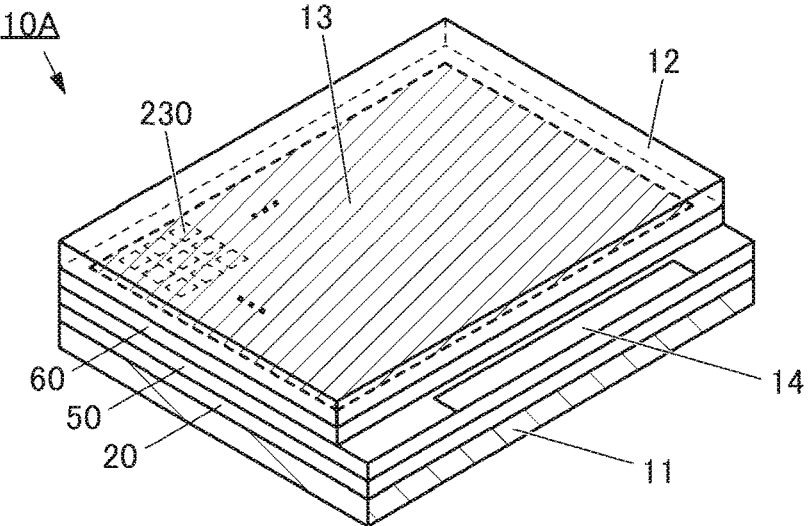
FIG. 16A and FIG. 16B are diagrams illustrating a structure example of a display apparatus.

FIG. 16A is a perspective view of a display apparatus 10A applicable to the display apparatus of the electronic device described as an example in Embodiment 1. The display apparatus 10A can be used as each of the display apparatus 511 and the display apparatus 521.

The display apparatus 10A includes a substrate 11 and a substrate 12. The display apparatus 10A includes a display portion 13 composed of elements provided between the substrate 11 and the substrate 12. The display portion 13 is a region where an image is displayed in the display apparatus 10A. The display portion 13 includes the plurality of pixels 230. The pixel 230 includes a pixel circuit 51 and a light-emitting element 61 (not illustrated).

By using the pixels 230 arranged in a matrix of 1920× 1080 pixels, the display portion 13 can achieve display with a definition of a so-called full hi-vision (also referred to as "2K definition", "2K1K", "2K", or the like). For example, by using the pixels 230 arranged in a matrix of 3840×2160 pixels, the display portion 13 can achieve display with a definition of a so-called ultra hi-vision (also referred to as "4K definition", "4K2K", "4K", or the like). For example, by using the pixels 230 arranged in a matrix of 7680×4320 pixels, the display portion 13 can achieve display with a definition of a so-called super hi-vision (also referred to as "8K definition", "8K4K", "8K", or the like). By increasing the number of pixels 230, the display portion 13 that can perform display with 16K or 32K definition can also be obtained.

Furthermore, the pixel density (resolution) of the display portion 13 is preferably higher than or equal to 1000 ppi and lower than or equal to 10000 ppi. For example, the resolution may be higher than or equal to 2000 ppi and lower than or equal to 6000 ppi, or higher than or equal to 3000 ppi and lower than or equal to 5000 ppi.

Note that there is no particular limitation on the screen ratio (aspect ratio) of the display portion 13. For example, the display portion 13 is compatible with a variety of screen ratios such as 1:1 (a square), 4:3, 16:9, and 16:10.

In this specification and the like, the term "element" can be replaced with the term "device" in some cases. For example, a display element, a light-emitting element, and a liquid crystal element can be rephrased as a display device, a light-emitting device, and a liquid crystal device, respectively.

Various kinds of signals and power supply potentials are input to the display apparatus 10A from the outside via a terminal portion 14, so that image display can be performed using a display element provided in the display portion 13. Any of a variety of elements can be used as the display element. Typically, a light-emitting element having a function of emitting light, such as an organic EL element or an LED element, a liquid crystal element, a MEMS (Micro Electro Mechanical Systems) element, or the like can be used.

A plurality of layers are provided between the substrate 11 and the substrate 12, and each of the layers is provided with a transistor for a circuit operation, or a display element which emits light. A pixel circuit having a function of controlling an operation of the display element, a driver circuit having a function of controlling the pixel circuit, a functional circuit having a function of controlling the driver circuit, and the like are provided in the plurality of layers.

Figure 16B:
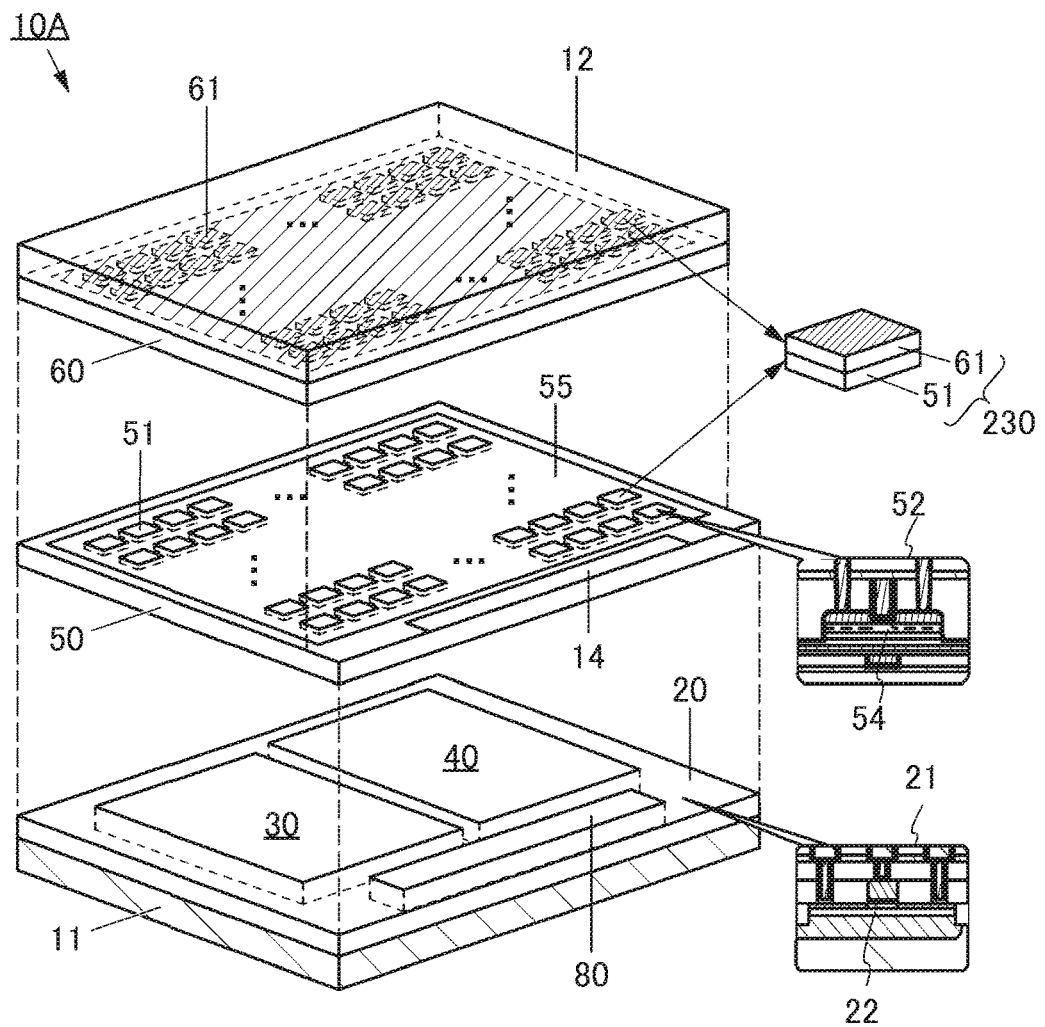

FIG. 16B is a perspective view schematically illustrating the structures of the layers provided between the substrate 11 and the substrate 12.

A layer 20 is provided over the substrate 11. The layer 20 includes a driver circuit 30, a functional circuit 40, and an input/output circuit 80. The layer 20 includes a transistor 21 containing silicon in a channel formation region 22 (such a transistor is also referred to as a Si transistor). The substrate 11 is, for example, a silicon substrate. A silicon substrate is preferable because it has higher thermal conductivity than a glass substrate. By providing the driver circuit 30, the functional circuit 40, and the input/output circuit 80 in the same layer, wirings electrically connecting the driver circuit 30, the functional circuit 40, and the input/output circuit 80 can be short. As a result, charge and discharge time of a control signal used when the functional circuit 40 controls the driver circuit 30 becomes short, leading to a reduction in power consumption. In addition, charge and discharge time during which a signal is supplied from the input/output circuit 80 to the functional circuit 40 and the driver circuit 30 becomes short, leading to a reduction in power consumption.

The transistor 21 can be a transistor containing single crystal silicon in its channel formation region (also referred to as a "c-Si transistor"), for example. In particular, the use of a transistor containing single crystal silicon in a channel formation region as the transistor provided in the layer 20 can increase the on-state current of the transistor. This enables high-speed driving of circuits included in the layer 20 and is thus preferable. The Si transistor can be formed by microfabrication to have a channel length greater than or equal to 3 nm and less than or equal to 10 nm, for example; thus, a CPU, an application processor, an accelerator such as a GPU, or the like can be integral with the display portion in the display apparatus 10A.

A transistor containing polycrystalline silicon in its channel formation region (also referred to as a "Poly-Si transistor") may be provided in the layer 20. As the polycrystalline silicon, low-temperature polysilicon (LTPS) may be used. Note that a transistor containing LTPS in its channel formation region is also referred to as an "LTPS transistor". An OS transistor may be provided in the layer 20.

Any of a variety of circuits such as a shift register, a level shifter, an inverter, a latch, an analog switch, and a logic circuit can be used as the driver circuit 30. The driver circuit 30 includes a gate driver circuit, a source driver circuit, or the like, for example. In addition, an arithmetic circuit, a memory circuit, a power supply circuit, and the like may be included. Since the gate driver circuit, the source driver circuit, and other circuits can be placed to overlap with the display portion 13, the width of a non-display region (also referred to as a bezel) provided along the outer periphery of the display portion 13 of the display apparatus 10A can be extremely narrow compared with the case where these circuits and the display portion 13 are arranged side by side, whereby the display apparatus 10A can be reduced in size.

The functional circuit 40 has a function of an application processor for controlling the circuits in the display apparatus 10A and generating signals used for controlling the circuits, for example. The functional circuit 40 may include a CPU and a circuit used for correcting image data such as a GPU. The functional circuit 40 may include an LVDS (Low Voltage Differential Signaling) circuit, an MIPI (Mobile Industry Processor Interface) circuit, and a D/A (Digital to Analog) converter circuit, for example, having a function of an interface for receiving image data or the like from the outside of the display apparatus 10A. The functional circuit 40 may include a circuit for compressing and decompressing image data and a power supply circuit, for example.

A layer 50 is provided over the layer 20. The layer 50 includes a pixel circuit group 55 including the plurality of pixel circuits 51. An OS transistor may be provided in the layer 50. Each of the pixel circuits 51 may include an OS transistor. Note that the layer 50 can be stacked over the layer 20.

A Si transistor may be provided in the layer 50. For example, the pixel circuits 51 may each include a transistor containing single crystal silicon or polycrystalline silicon in its channel formation region. As the polycrystalline silicon, LTPS may be used. For example, the layer 50 can be formed over another substrate and bonded to the layer 20.

As another example, the pixel circuits 51 may each include a plurality of kinds of transistors using different semiconductor materials. In the case where the pixel circuits 51 each include a plurality of kinds of transistors using different semiconductor materials, the transistors may be provided in different layers for each kind of transistor. For example, in the case where the pixel circuits 51 each include a Si transistor and an OS transistor, the Si transistor and the OS transistor may be provided to overlap with each other. Providing the transistors to overlap with each other reduces the area occupied by the pixel circuits 51. Thus, the resolution of the display apparatus 10A can be improved. Note that a structure in which an LTPS transistor and an OS transistor are combined is referred to as LTPO in some cases.

It is preferable to use, as the transistor 52 that is an OS transistor, a transistor including an oxide containing at least one of indium, an element M (the element M is aluminum, gallium, yttrium, or tin), and zinc in a channel formation region 54. Such an OS transistor has a characteristic of an extremely low off-state current. Thus, it is particularly preferable to use the OS transistor as a transistor provided in the pixel circuit, in which case analog data written to the pixel circuit can be retained for a long period.

A layer 60 is provided over the layer 50. Over the layer 60, the substrate 12 is provided. The substrate 12 is preferably a light-transmitting substrate or a layer formed of a light-transmitting material. The layer 60 includes the plurality of light-emitting elements 61. The layer 60 can be stacked over the layer 50. As the light-emitting element 61, an organic electroluminescent element (also referred to as an organic EL element) or the like can be used, for example. However, the light-emitting element 61 is not limited thereto, and an inorganic EL element formed of an inorganic material may be used, for example. Note that an "organic EL element" and an "inorganic EL element" are collectively referred to as "EL element" in some cases. The light-emitting element 61 may contain an inorganic compound such as quantum dots. For example, when used for a light-emitting layer, the quantum dots can function as a light-emitting material.

As illustrated in FIG. 16B, the display apparatus 10A of one embodiment of the present invention can have a structure in which the light-emitting elements 61, the pixel circuits 51, the driver circuit 30, and the functional circuit 40 are stacked; thus, the aperture ratio (effective display area ratio) of the pixels can be extremely high. For example, the pixel aperture ratio can be higher than or equal to 40% and lower than 100%, preferably higher than or equal to 50% and lower than or equal to 95%, further preferably higher than or equal to 60% and lower than or equal to 95%. Furthermore, the pixel circuits 51 can be arranged extremely densely, and thus the resolution of the pixels can be extremely high. For example, the pixels can be arranged in the display portion 13 of the display apparatus 10A (a region where the pixel circuits 51 and the light-emitting elements 61 are stacked) with a resolution higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi.

The display apparatus 10A described above has an extremely high resolution, and thus can be suitably used for a device for VR such as a head-mounted display or a glasses-type device for AR. For example, even in the case of a structure in which the display portion of the display apparatus 10A is seen through an optical member such as a lens, pixels of the extremely-high-resolution display portion included in the display apparatus 10A are not seen when the display portion is magnified by the lens, so that display providing a high sense of immersion can be performed.

Note that in the case where the display apparatus 10A is used as a wearable display apparatus for VR or AR, the display portion 13 can have a diagonal size greater than or equal to 0.1 inches and less than or equal to 5.0 inches, preferably greater than or equal to 0.5 inches and less than or equal to 2.0 inches, further preferably greater than or equal to 1 inch and less than or equal to 1.7 inches. For example, the display portion 13 may have a diagonal size of 1.5 inches or approximately 1.5 inches. When the display portion 13 has a diagonal size less than or equal to 2.0 inches, the number of times of light exposure treatment using a light exposure apparatus (typically, a scanner apparatus) can be one; thus, the productivity of a manufacturing process can be improved.

The display apparatus 10A according to one embodiment of the present invention can be used for an electronic device other than a wearable electronic device. In that case, the display portion 13 can have a diagonal size greater than 2.0 inches. The structure of transistors used in the pixel circuits 51 may be selected as appropriate depending on the diagonal size of the display portion 13. In the case where single crystal Si transistors are used in the pixel circuits 51, for example, the diagonal size of the display portion 13 is preferably greater than or equal to 0.1 inches and less than or equal to 3 inches. In the case where LTPS transistors are used in the pixel circuits 51, the diagonal size of the display portion 13 is preferably greater than or equal to 0.1 inches and less than or equal to 30 inches, further preferably greater than or equal to 1 inch and less than or equal to 30 inches. In the case where LTPO transistors are used in the pixel circuits 51, the diagonal size of the display portion 13 is preferably greater than or equal to 0.1 inches and less than or equal to 50 inches, further preferably greater than or equal to 1 inch and less than or equal to 50 inches. In the case where OS transistors are used in the pixel circuits 51, the diagonal size of the display portion 13 is preferably greater than or equal to 0.1 inches and less than or equal to 200 inches, further preferably greater than or equal to 50 inches and less than or equal to 100 inches.

A size increase of a display apparatus using single crystal Si transistors is extremely difficult because a size increase of a single crystal Si substrate is difficult. Furthermore, in the case where LTPS transistors are used in a display apparatus, LTPS transistors are unlikely to respond to a size increase (typically to a screen diagonal size greater than 30 inches) since a laser crystallization apparatus is used in the manufacturing process. By contrast, since the manufacturing process does not necessarily require a laser crystallization apparatus or the like or can be performed at a relatively low process temperature (typically, lower than or equal to 450° C.), OS transistors can be used for a display apparatus with a relatively large area (typically, a diagonal size greater than or equal to 50 inches and less than or equal to 100 inches). In addition, LTPO can be applied to a diagonal size midway between the case of using LTPS transistors and the case of using OS transistors (typically, greater than or equal to 1 inch and less than or equal to 50 inches).

Figure 17:
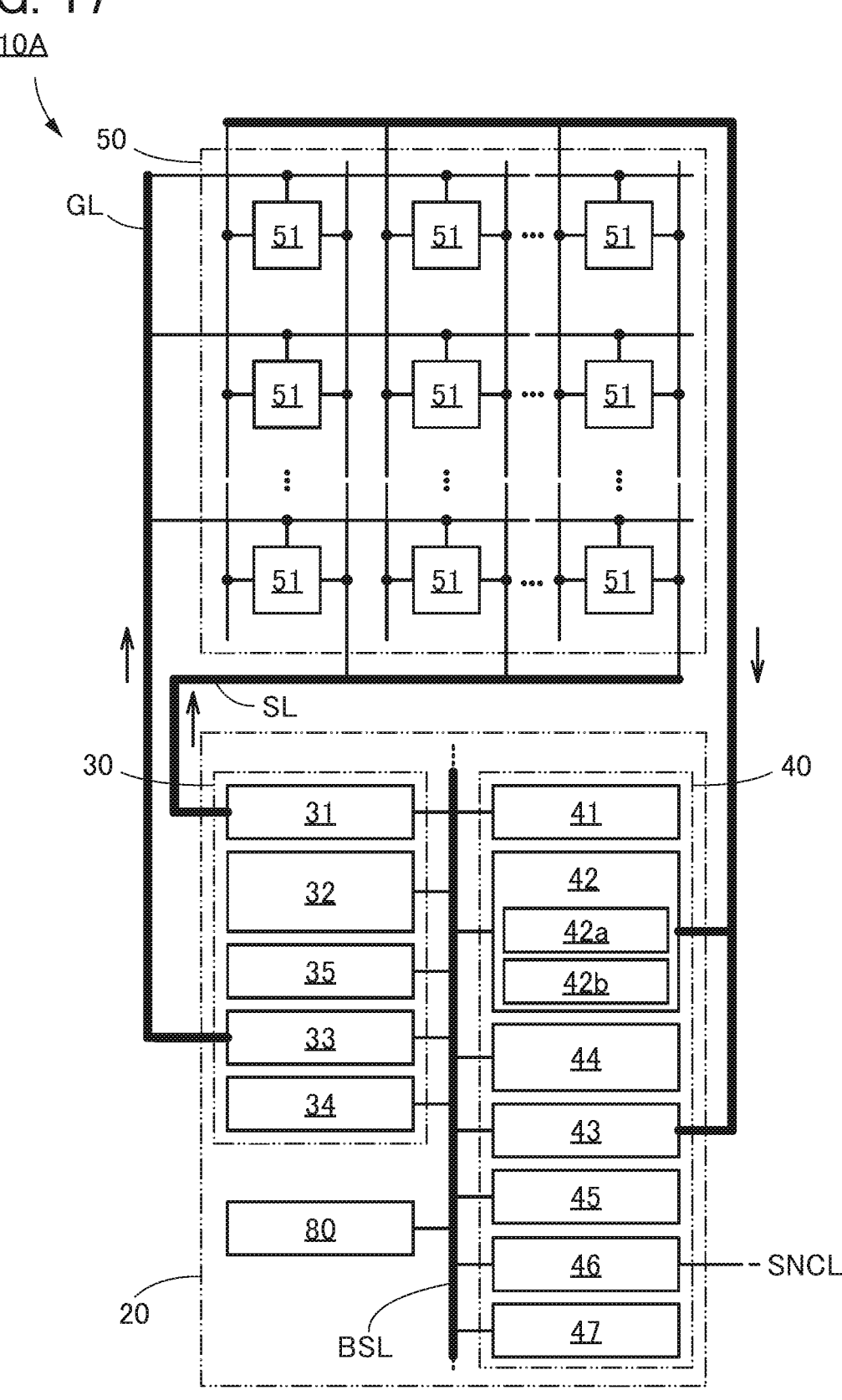
FIG. 17 is a diagram illustrating a structure example of a display apparatus.

Specific structure examples of the driver circuit 30 and the functional circuit 40 will be described with reference to FIG. 17. FIG. 17 is a block diagram showing a plurality of wirings connecting the pixel circuits 51, the driver circuit 30, and the functional circuit 40 in the display apparatus 10A, a bus wiring in the display apparatus 10A, and the like.

In the display apparatus 10A shown in FIG. 17, the plurality of pixel circuits 51 are arranged in a matrix in the layer 50.

Furthermore, the driver circuit 30, the functional circuit 40, and the input/output circuit 80 are provided in the layer 20 in the display apparatus 10A shown in FIG. 17. The driver circuit 30 includes, for example, a source driver circuit 31, a digital-to-analog converter (DAC) circuit 32, an amplifier circuit 35, a gate driver circuit 33, and a level shifter 34. The functional circuit 40 includes, for example, a storage device 41, a GPU (AI accelerator) 42, an EL correction circuit 43, a timing controller 44, a CPU 45, a sensor controller 46, and a power supply circuit 47. The functional circuit 40 has a function of an application processor.

The input/output circuit 80 is compatible with a transmission method such as LVDS (Low Voltage Differential Signaling), and the input/output circuit 80 has a function of dividing control signals, image data, and the like input via the terminal portion 14 between the driver circuit 30 and the functional circuit 40. Furthermore, the input/output circuit 80 has a function of outputting information of the display apparatus 10A to the outside via the terminal portion 14.

In the display apparatus 10A in FIG. 17, an example of a structure in which the circuits included in the driver circuit 30 and the circuits included in the functional circuit 40 are each electrically connected to a bus wiring BSL is illustrated.

The source driver circuit 31 has a function of transmitting image data to the pixel circuits 51 included in the pixels 230, for example. Thus, the source driver circuit 31 is electrically connected to the pixel circuits 51 through a wiring SL. Note that a plurality of source driver circuits 31 may be provided.

The digital-to-analog converter circuit 32 has a function of converting image data that has been digitally processed by a GPU, a correction circuit, or the like described later, into analog data, for example. The image data converted into analog data is amplified by the amplifier circuit 35 such as an operational amplifier and is transmitted to the pixel circuits 51 via the source driver circuit 31. Note that the image data may be transmitted to the source driver circuit 31, the digital-to-analog converter circuit 32, and the pixel circuits 51 in this order. The digital-to-analog converter circuit 32 and the amplifier circuit 35 may be included in the source driver circuit 31.

The gate driver circuit 33 has a function of selecting the pixel circuit to which image data is to be transmitted among the pixel circuits 51, for example. Thus, the gate driver circuit 33 is electrically connected to the pixel circuits 51 through a wiring GL. Note that a plurality of gate driver circuits 33 may be provided such that the number of the gate driver circuits 33 corresponds to the number of the source driver circuits 31.

The level shifter 34 has a function of converting signals to be input to the source driver circuit 31, the digital-to-analog converter circuit 32, the gate driver circuit 33, and the like into appropriate levels, for example.

The storage device 41 has a function of storing image data to be displayed by the pixel circuits 51, for example. Note that the storage device 41 can be configured to store the image data as digital data or analog data.

In the case where the storage device 41 stores image data, the storage device 41 is preferably a nonvolatile memory. In that case, a NAND memory or the like can be used as the storage device 41, for example.

In the case where the storage device 41 stores temporary data generated in the GPU 42, the EL correction circuit 43, the CPU 45, or the like, the storage device 41 is preferably a volatile memory. In that case, an SRAM (Static Random Access Memory), a DRAM (Dynamic Random Access Memory), or the like can be used as the storage device 41, for example.

The GPU 42 has a function of performing processing for outputting, to the pixel circuits 51, image data read from the storage device 41, for example. Specifically, the GPU 42 is configured to perform pipeline processing in parallel and thus can perform high-speed processing of image data to be output to the pixel circuits 51. The GPU 42 can also have a function of a decoder for decoding an encoded image.

The functional circuit 40 may include a plurality of circuits that can improve the display quality of the display apparatus 10A. As such circuits, for example, correction (toning and dimming) circuits that detect color irregularity of a displayed image and correct the color irregularity to obtain an optimal image may be provided. In the case where a light-emitting device utilizing organic EL is used as the display element, for example, an EL correction circuit that corrects image data in accordance with the properties of the light-emitting device may be provided in the functional circuit 40. The functional circuit 40 includes, for example, the EL correction circuit 43.

The above-described image correction may be performed using artificial intelligence. For example, a current flowing in a pixel circuit (or a voltage applied to the pixel circuit) may be monitored and obtained, a displayed image may be obtained with an image sensor or the like, the current (or voltage) and the image may be used as input data in an arithmetic operation of the artificial intelligence (e.g., an artificial neural network), and the output result may be used to judge whether the image should be corrected.

Such an arithmetic operation of artificial intelligence can be applied to not only image correction but also upconversion for increasing the definition of image data. As an example, FIG. 17 illustrates the GPU 42 that includes blocks for performing arithmetic operations for various kinds of correction (e.g., a color irregularity correction circuit 42a and an upconversion circuit 42b).

The upconversion processing of image data can be performed with an algorithm selected from a Nearest neighbor method, a Bilinear method, a Bicubic method, a RAISR (Rapid and Accurate Image Super-Resolution) method, an ANR (Anchored Neighborhood Regression) method, an A+ method, an SRCNN (Super-Resolution Convolutional Neural Network) method, and the like.

The algorithm used for the upconversion processing may be different for each region determined in accordance with a gaze point. For example, upconversion processing for a region including the gaze point and the vicinity of the gaze point is performed using an algorithm with a low processing speed but high accuracy, and upconversion processing for a region other than the above region is performed using an algorithm with low accuracy but a high processing speed. In that case, the time required for upconversion processing can be shortened. In addition, power consumption required for upconversion processing can be reduced.

Without limitation to upconversion processing, downconversion processing for decreasing the definition of image data may be performed. In the case where the definition of image data is higher than the definition of the display portion 13, part of the image data is not displayed on the display portion 13, in some cases. In that case, downconversion processing enables the entire image data to be displayed on the display portion 13.

The timing controller 44 has a function of controlling driving frequency (e.g., frame frequency, frame rate, or refresh rate) for displaying an image, for example. In the case where a still image is displayed on the display apparatus 10A, for example, the driving frequency is lowered by the timing controller 44, so that power consumption of the display apparatus 10A can be reduced.

The CPU 45 has a function of performing general-purpose processing such as execution of an operating system, control of data, and execution of various kinds of arithmetic operations and programs, for example. The CPU 45 has a role in, for example, giving an instruction for a writing operation or a reading operation of image data in the storage device 41, an operation for correcting image data, an operation for a later-described sensor, or the like. Furthermore, the CPU 45 may have a function of transmitting a control signal to at least one of the circuits included in the functional circuit 40, for example.

The sensor controller 46 has a function of controlling a sensor, for example. FIG. 17 illustrates a wiring SNCL as a wiring for electrical connection to the sensor.

The sensor can be, for example, a touch sensor that can be provided in the display portion 13. Alternatively, the sensor can be an illuminance sensor, for example.

The power supply circuit 47 has a function of generating voltages to be supplied to the pixel circuits 51, the driver circuit 30, and the functional circuit 40, for example. Note that the power supply circuit 47 may have a function of selecting a circuit to which a voltage is to be supplied. The power supply circuit 47 can stop supply of a voltage to the CPU 45, the GPU 42, and the like during a period in which a still image is displayed so that the power consumption of the whole display apparatus 10A is reduced, for example.

As described above, the display apparatus of one embodiment of the present invention can have a structure in which display elements, pixel circuits, a driver circuit, and the functional circuit 40 are stacked. The driver circuit and the functional circuit, which are peripheral circuits, can be provided so as to overlap with the pixel circuits and thus the width of the bezel can be made extremely small, so that a reduction in size of the display apparatus can be achieved. A structure of the display apparatus of one embodiment of the present invention in which circuits are stacked enables its wirings connecting the circuits to be shortened, resulting in a reduction in weight of the display apparatus. The display apparatus of one embodiment of the present invention can include a display portion with an increased pixel resolution; thus, the display apparatus can have high display quality.

<Structure Example of Display Module>

Next, a structure example of a display module including the display apparatus 10A will be described.

Figure 18A:
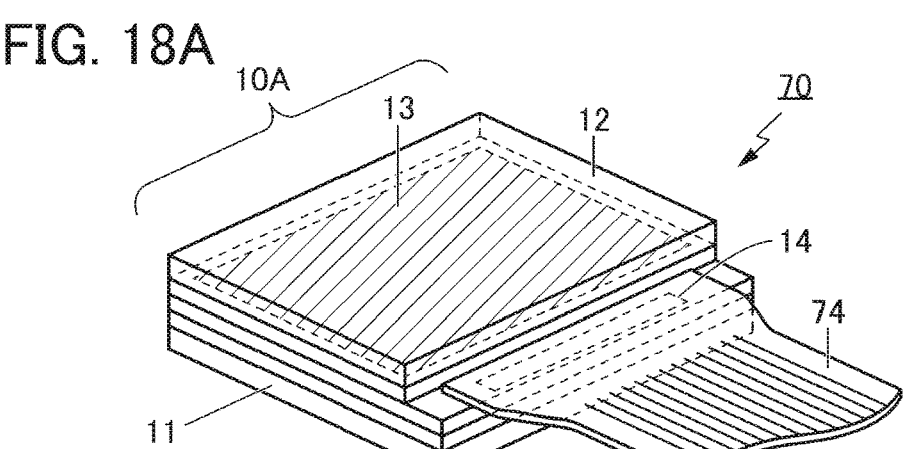
FIG. 18A to FIG. 18C are each a perspective view of a display module.
Figure 18B:
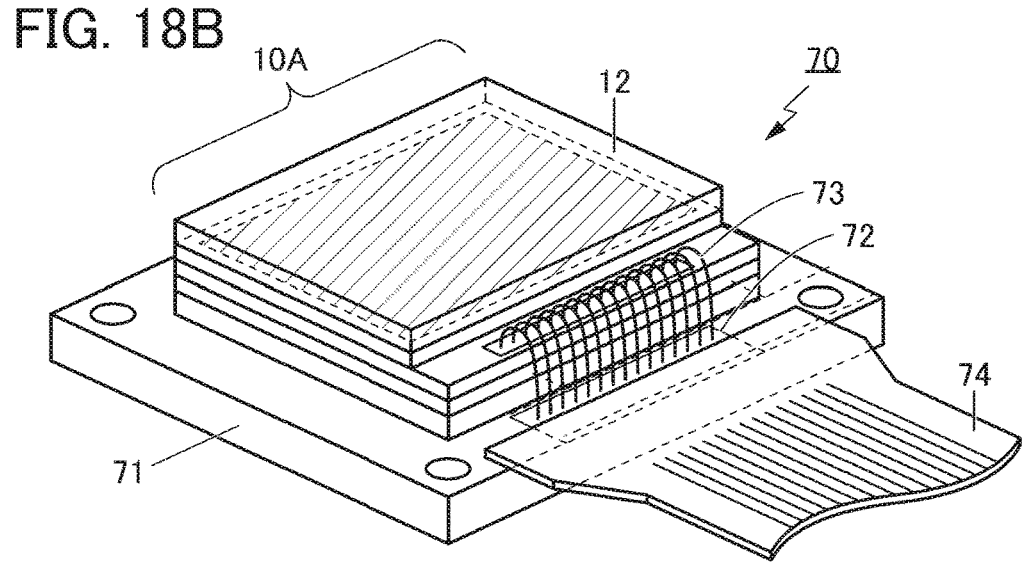
Figure 18C:
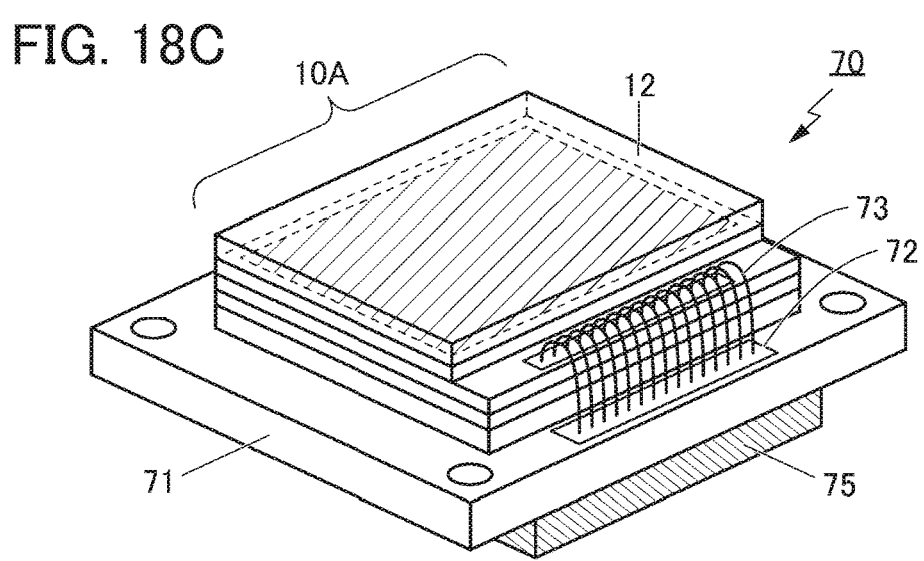

FIG. 18A to FIG. 18C are each a perspective view of a display module 70. The display module 70 has a structure in which an FPC (Flexible printed circuit) 74 is provided on the terminal portion 14 of the display apparatus 10A. The FPC 74 has a structure in which a film formed of an insulator is provided with a wiring. The FPC 74 is flexible. The FPC 74 functions as a wiring for supplying a video signal, a control signal, a power supply potential, and the like to the display apparatus 10A from the outside. An IC may be mounted on the FPC 74.

The display module 70 illustrated in FIG. 18B includes the display apparatus 10A over a printed wiring board 71. The printed wiring board 71 includes wirings inside a substrate formed of an insulator and/or on the surface of the substrate.

In the display module 70 illustrated in FIG. 18B, the terminal portion 14 of the display apparatus 10A is electrically connected to a terminal portion 72 of the printed wiring board 71 through a wire 73. The wire 73 can be formed in wire bonding. Ball bonding or wedge bonding can be used as the wire bonding.

After the wire 73 is formed, the wire 73 may be covered with a resin material or the like. Note that the display apparatus 10A and the printed wiring board 71 may be electrically connected to each other by a method other than the wire bonding. For example, the display apparatus 10A and the printed wiring board 71 may be electrically connected to each other using an anisotropic conductive adhesive or a bump.

In the display module 70 illustrated in FIG. 18B, the terminal portion 72 of the printed wiring board 71 is electrically connected to the FPC 74. In the case where the electrode pitch in the terminal portion 14 of the display apparatus 10A is different from the electrode pitch in the FPC 74, for example, the terminal portion 14 may be electrically connected to the FPC 74 via the printed wiring board 71. Specifically, the interval (pitch) between a plurality of electrodes in the terminal portion 14 can be converted into the interval between a plurality of electrodes in the terminal portion 72 using wirings formed on the printed wiring board 71. Accordingly, even when the electrode pitch in the terminal portion 14 is different from the electrode pitch in the FPC 74, electrical connection between the electrodes can be achieved.

The printed wiring board 71 can be provided with a variety of elements such as a resistor, a capacitor element, and a semiconductor element.

As in the display module 70 illustrated in FIG. 18C, the terminal portion 72 may be electrically connected to a connection portion 75 provided on a bottom surface (a surface where the display apparatus 10A is not provided) of the printed wiring board 71. With the use of a socket-type connection portion as the connection portion 75, for example, the display module 70 can be easily attached to and detached from another device.

<Structure Example of Pixel Circuit>

Figure 19A:
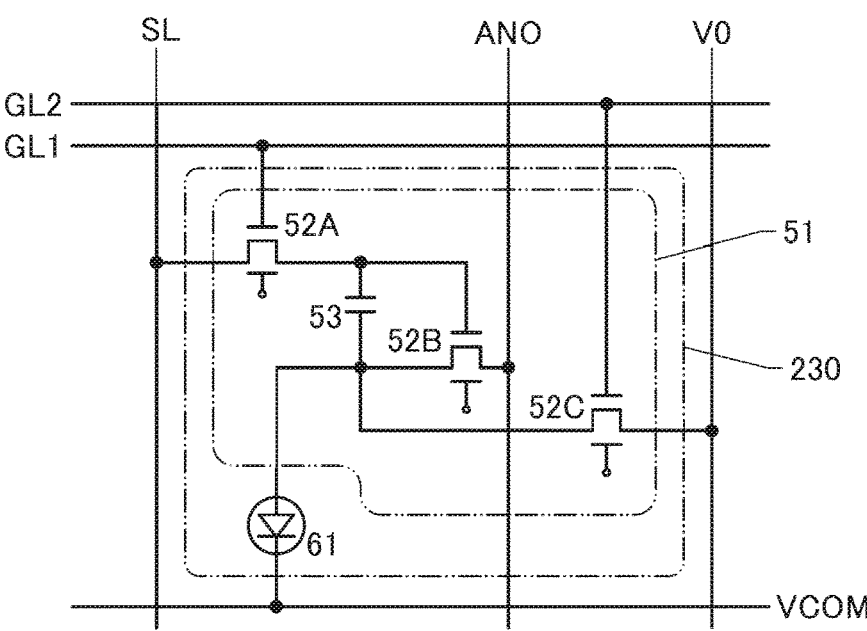
FIG. 19A and FIG. 19B are diagrams illustrating a structure example of a display apparatus.
Figure 19B:
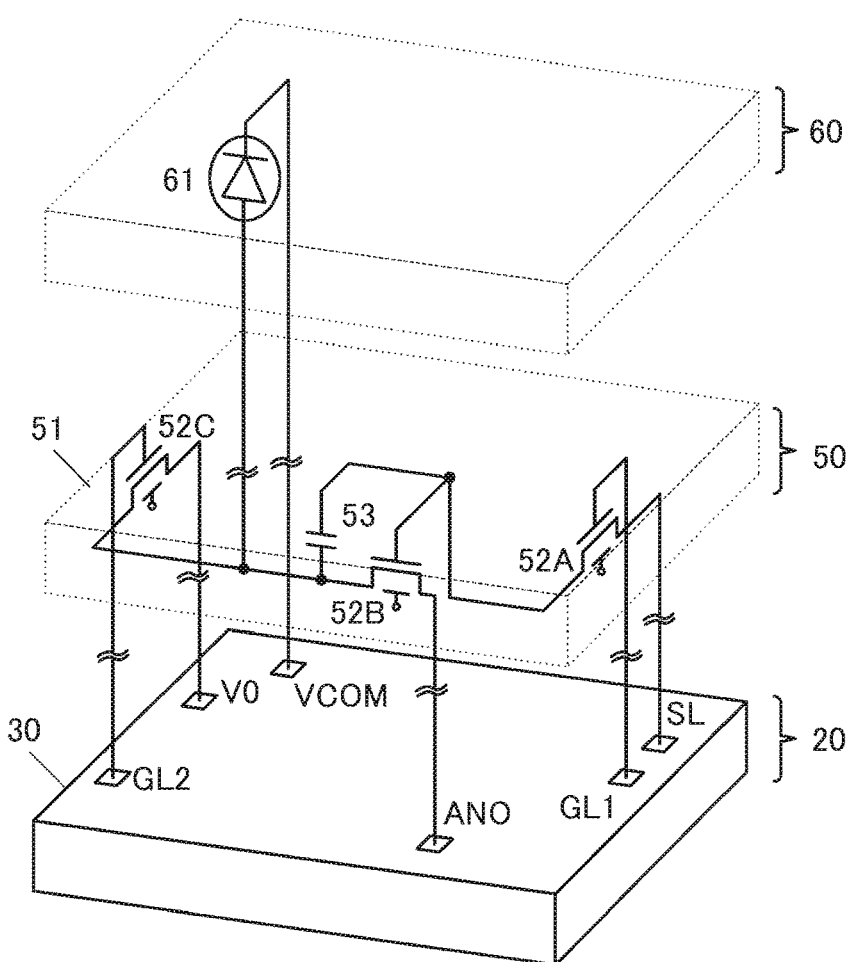

FIG. 19A and FIG. 19B illustrate a structure example of the pixel circuit 51 and the light-emitting element 61 connected to the pixel circuit 51. FIG. 19A schematically illustrates connection of the elements, and FIG. 19B schematically illustrates the vertical position relation of the layer 20 including the driver circuit, the layer 50 including a plurality of transistors of the pixel circuit, and the layer 60 including a light-emitting element.

The pixel circuit 51 illustrated as an example in FIG. 19A and FIG. 19B includes a transistor 52A, a transistor 52B, a transistor 52C, and a capacitor 53. The transistor 52A, the transistor 52B, and the transistor 52C can be OS transistors. Each of the OS transistors of the transistor 52A, the transistor 52B, and the transistor 52C preferably includes a back gate electrode, in which case the structure in which the back gate electrode is supplied with the same signals as those supplied to the gate electrode or the structure in which the back gate electrode is supplied with signals different from those supplied to the gate electrode can be used.

The transistor 52B includes the gate electrode electrically connected to the transistor 52A, a first electrode electrically connected to the light-emitting element 61, and a second electrode electrically connected to a wiring ANO. The wiring ANO is a wiring for supplying a potential for supplying a current to the light-emitting element 61.

The transistor 52A includes a first terminal electrically connected to the gate electrode of the transistor 52B, a second terminal electrically connected to the wiring SL which functions as a source line, and the gate electrode having a function of controlling the conduction state or non-conduction state on the basis of the potential of a wiring GL1 which functions as a gate line.

The transistor 52C includes a first terminal electrically connected to a wiring V0, a second terminal electrically connected to the light-emitting element 61, and the gate electrode having a function of controlling the conduction state or non-conduction state on the basis of the potential of a wiring GL2 which functions as a gate line. The wiring V0 is a wiring for supplying a reference potential and a wiring for outputting a current flowing through the pixel circuit 51 to the driver circuit 30 or the functional circuit 40.

The capacitor 53 includes a conductive film electrically connected to the gate electrode of the transistor 52B and a conductive film electrically connected to the second electrode of the transistor 52C.

The light-emitting element 61 includes a first electrode electrically connected to the first electrode of the transistor 52B and a second electrode electrically connected to a wiring VCOM. The wiring VCOM is a wiring for supplying a potential for supplying a current to the light-emitting element 61.

Accordingly, the intensity of light emitted from the light-emitting element 61 can be controlled in accordance with an image signal supplied to the gate electrode of the transistor 52B. Furthermore, variations in voltage between the gate and the source of the transistor 52B can be inhibited by the reference potential of the wiring V0 supplied through the transistor 52C.

A current value that can be used for setting of pixel parameters can be output from the wiring V0. Specifically, the wiring V0 can function as a monitor line for outputting a current flowing through the transistor 52B or a current flowing through the light-emitting element 61 to the outside. A current output to the wiring V0 is converted into a voltage by a source follower circuit or the like and output to the outside. Alternatively, the current output to the wiring V0 can be converted into a digital signal by an A-D converter or the like and output to the functional circuit 40 or the like.

Note that the light-emitting element described in one embodiment of the present invention refers to a self-luminous display element such as an organic EL element (also referred to as an OLED (Organic Light Emitting Diode)). Note that the light-emitting element electrically connected to the pixel circuit can be a self-luminous light-emitting element such as an LED (Light Emitting Diode), a micro LED, a QLED (Quantum-dot Light Emitting Diode), or a semiconductor laser.

Note that in the structure illustrated as an example in FIG. 19B, the wirings electrically connecting the pixel circuit 51 and the driver circuit 30 can be shortened, so that wiring resistance of the wirings can be reduced. Thus, data can be written at high speed, which enables high-speed driving of the display apparatus 10A. Therefore, even when the number of the pixel circuits 51 included in the display apparatus 10A is increased, a sufficiently long frame period can be ensured, and thus, the pixel density of the display apparatus 10A can be increased. In addition, the increased pixel density of the display apparatus 10A can increase the resolution of an image displayed by the display apparatus 10A. For example, the pixel density of the display apparatus 10A can be higher than or equal to 1000 ppi, higher than or equal to 5000 ppi, or higher than or equal to 7000 ppi. Thus, the display apparatus 10A can be, for example, a display apparatus for AR or VR and can be suitably used in an electronic device with a short distance between a display portion and the user, such as an HMD.

Although FIG. 19A and FIG. 19B illustrate, as an example, the pixel circuit 51 including three transistors in total, one embodiment of the present invention is not limited thereto. Structure examples and a driving method example of a pixel circuit which can be used for the pixel circuit 51 will be described below.

Figure 20A:
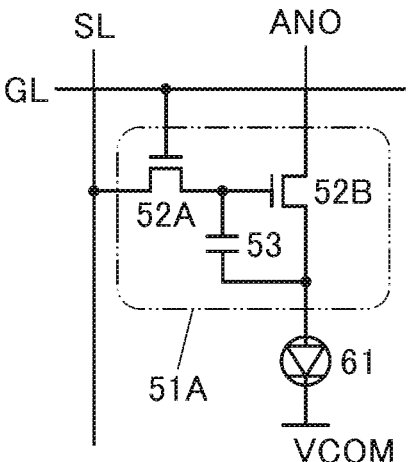
FIG. 20A to FIG. 20D are diagrams illustrating structure examples of a display apparatus.

A pixel circuit 51A illustrated in FIG. 20A includes the transistor 52A, the transistor 52B, and the capacitor 53. FIG. 20A illustrates the light-emitting element 61 connected to the pixel circuit 51A. The wiring SL, the wiring GL, the wiring ANO, and the wiring VCOM are electrically connected to the pixel circuit 51A. The pixel circuit 51A has a structure in which the transistor 52C is removed from the pixel circuit 51 illustrated in FIG. 19A and the wiring GL1 and the wiring GL2 are replaced with the wiring GL.

A gate of the transistor 52A is electrically connected to the wiring GL, one of a source and a drain of the transistor 52A is electrically connected to the wiring SL, and the other of the source and the drain of the transistor 52A is electrically connected to a gate of the transistor 52B and one electrode of a capacitor C1. One of a source and a drain of the transistor 52B is electrically connected to the wiring ANO and the other of the source and the drain of the transistor 52B is electrically connected to an anode of the light-emitting element 61. The other electrode of the capacitor C1 is electrically connected to the anode of the light-emitting element 61. A cathode of the light-emitting element 61 is electrically connected to the wiring VCOM.

Figure 20B:
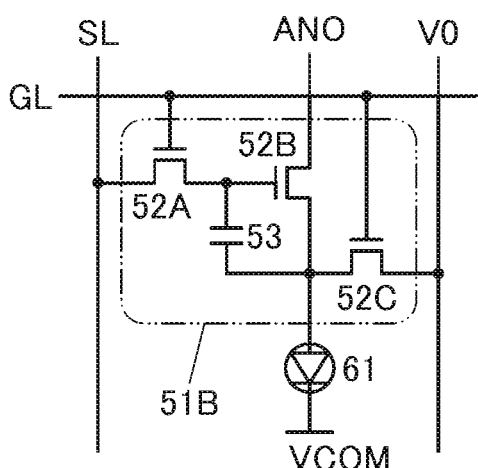

A pixel circuit 51B illustrated in FIG. 20B has a structure in which a transistor 52C is added to the pixel circuit 51A. In addition, the wiring V0 is electrically connected to the pixel circuit 51B.

Figure 20C:
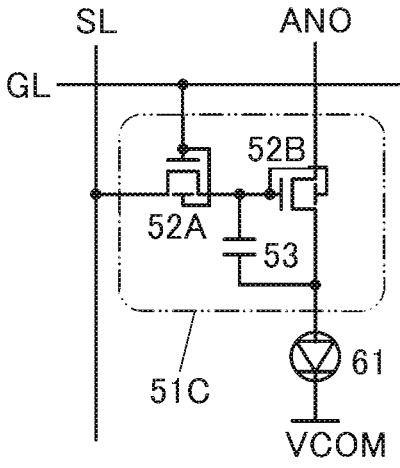
Figure 20D:
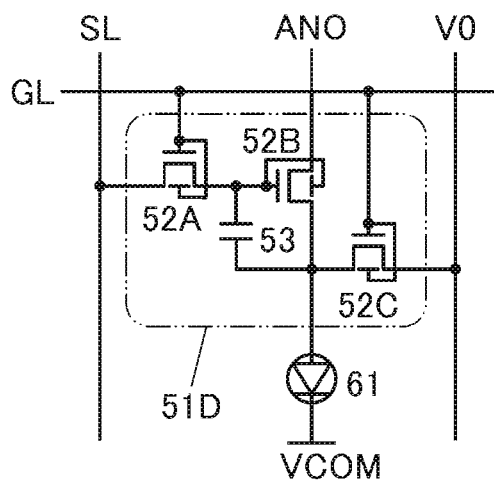

A pixel circuit 51C illustrated in FIG. 20C is an example of the case where a transistor in which a pair of gates are electrically connected to each other is used as each of the transistor 52A and the transistor 52B of the pixel circuit 51A. A pixel circuit 51D illustrated in FIG. 20D is an example of the case where such transistors are used in the pixel circuit 51B. Thus, the current that can flow through the transistor can be increased. Note that although a transistor in which a pair of gates are electrically connected to each other is used for each of the transistors here, one embodiment of the present invention is not limited thereto. A transistor that includes a pair of gates electrically connected to different wirings may be used. When, for example, a transistor in which one of the gates is electrically connected to the source is used, the reliability can be increased.

Figure 21A:
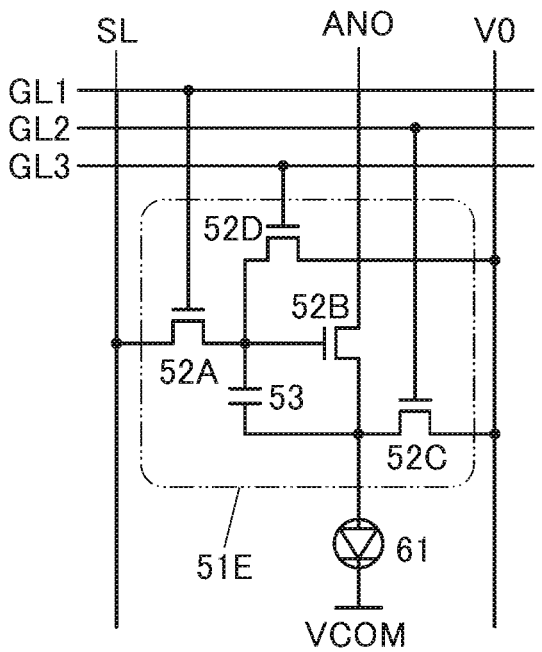
FIG. 21A to FIG. 21D are diagrams illustrating a structure example of a display apparatus.

A pixel circuit 51E illustrated in FIG. 21A has a structure in which a transistor 52D is added to the pixel circuit 51B. The wiring GL1, the wiring GL2, and a wiring GL3 functioning as gate lines are electrically connected to the pixel circuit 51E. Note that in this embodiment and the like, the wiring GL1, the wiring GL2, and the wiring GL3 are collectively referred to as the wiring GL in some cases. Thus, the wiring GL is not limited to one wiring and consists of a plurality of wirings in some cases.

A gate of the transistor 52D is electrically connected to the wiring GL3, one of a source and a drain of the transistor 52D is electrically connected to the gate of the transistor 52B, and the other of the source and the drain of the transistor 52D is electrically connected to the wiring V0. The gate of the transistor 52A is electrically connected to the wiring GL1, and the gate of the transistor 52C is electrically connected to the wiring GL2.

When the transistor 52C and the transistor 52D are turned on at the same time, the source and the gate of the transistor 52B have the same potential, so that the transistor 52B can be turned off. Thus, a current flowing to the light-emitting element 61 can be blocked forcibly. Such a pixel circuit is suitable for the case of using a display method in which a display period and a non-lighting period are alternately provided.

Figure 21B:
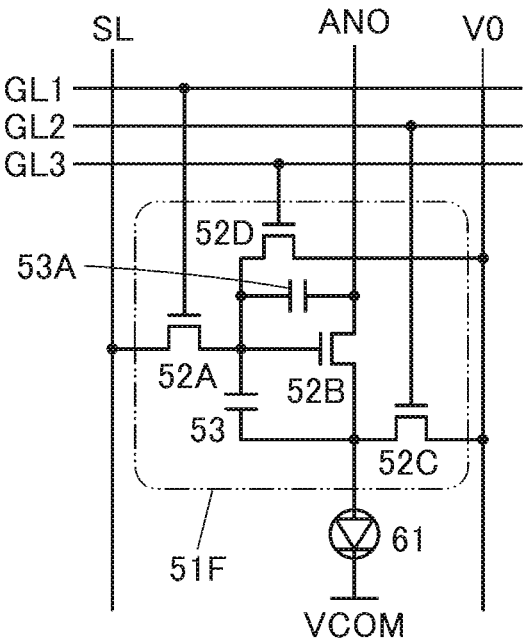

A pixel circuit 51F illustrated in FIG. 21B is an example of the case where a capacitor 53A is added to the pixel circuit 51E. The capacitor 53A functions as a storage capacitor.

Figure 21C:
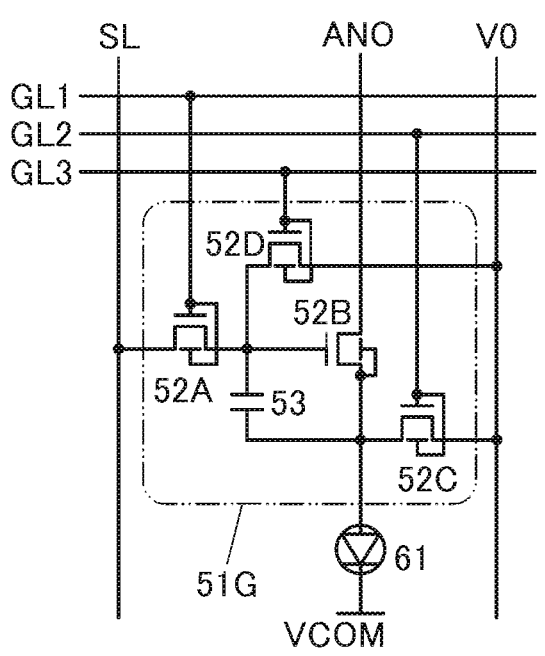
Figure 21D:
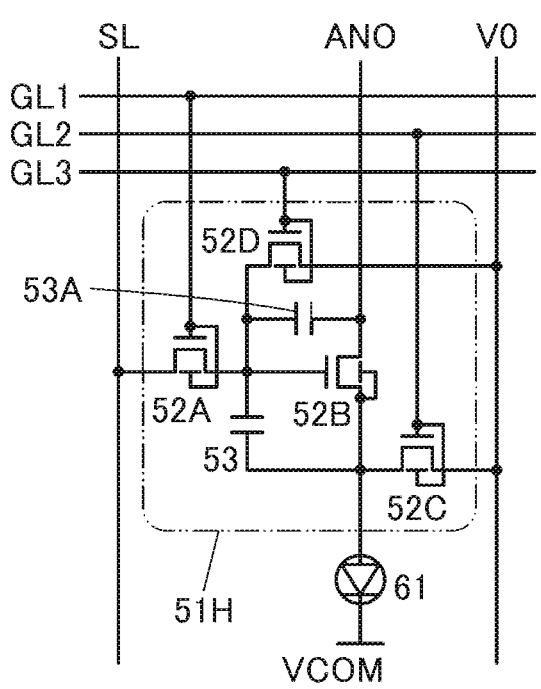

A pixel circuit 51G illustrated in FIG. 21C and a pixel circuit 51H illustrated in FIG. 21D are respectively examples of the cases where transistors each including a pair of gates are used in the pixel circuit 51E and the pixel circuit 51F. A transistor in which a pair of gates are electrically connected to each other is used as each of the transistor 52A, the transistor 52C, and the transistor 52D, and a transistor in which one of gates is electrically connected to a source is used as the transistor 52B.

Next, an example of a method for driving a display apparatus in which the pixel circuit 51E is used will be described. Note that a similar driving method can be applied to display apparatuses in which the pixel circuits 51F, 51G, and 51H are used.

Figure 22:
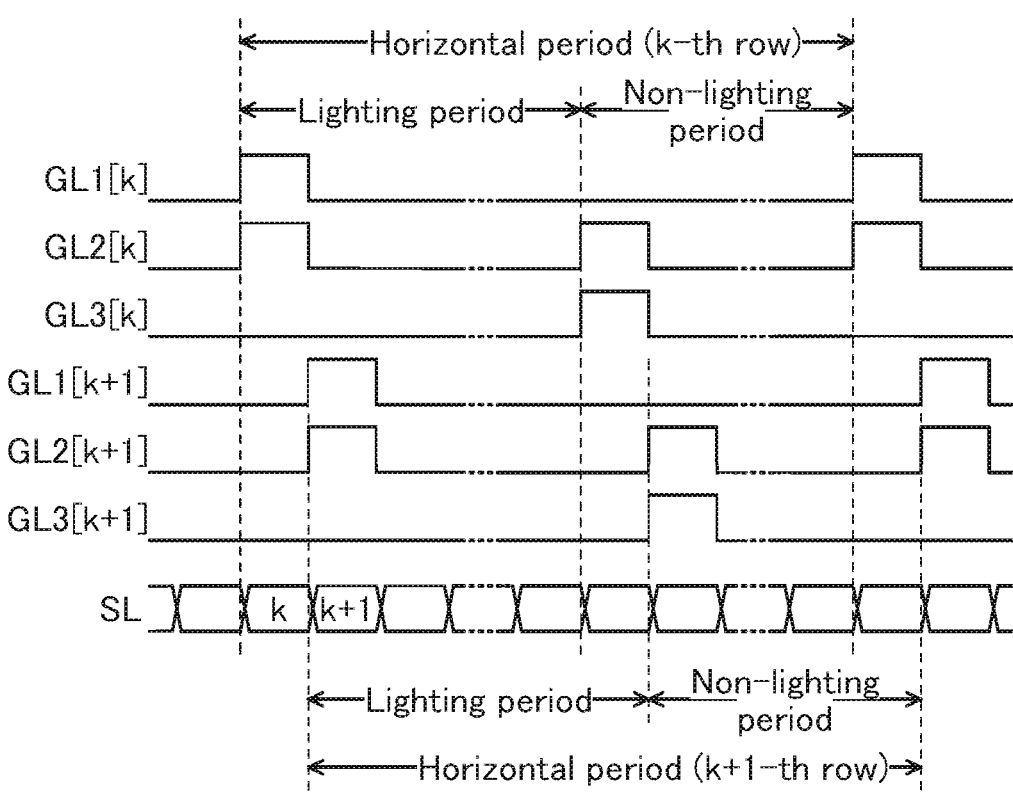
FIG. 22 is a timing chart showing an operation method of a display apparatus.

FIG. 22 shows a timing chart of a method for driving the display apparatus in which the pixel circuit 51E is used. Changes in the potentials of a wiring GL1[k], a wiring GL2[k], and a wiring GL3[k] that are gate lines of the k-th row and changes in the potentials of a wiring GL1[k+1], a wiring GL2[k+1], and a wiring GL3[k+1] that are gate lines of the k+1-th row are shown here. FIG. 22 also shows the timing of supplying a signal to the wiring SL functioning as a source line.

Here, an example of the driving method in which one horizontal period is divided into a lighting period and a non-lighting period is shown. A horizontal period of the k-th row is shifted from a horizontal period of the k+1-th row by a selection period of the gate line.

In the lighting period of the k-th row, first, the wiring GL1[k] and the wiring GL2[k] are supplied with a high-level potential and the wiring SL is supplied with a source signal. Thus, the transistor 52A and the transistor 52C are turned on, so that a potential corresponding to the source signal is written from the wiring SL to the gate of the transistor 52B. After that, the wiring GL1[k] and the wiring GL2[k] are supplied with a low-level potential, so that the transistor 52A and the transistor 52C are turned off and the gate potential of the transistor 52B is retained.

Subsequently, in a lighting period of the k+1-th row, data is written by an operation similar to that described above.

Next, the non-lighting period is described. In the non-lighting period of the k-th row, the wiring GL2[k] and the wiring GL3[k] are supplied with a high-level potential. Accordingly, the transistor 52C and the transistor 52D are turned on, and the source and the gate of the transistor 52B are supplied with the same potential, so that almost no current flows through the transistor 52B. Thus, the light-emitting element 61 is turned off. All the subpixels that are positioned in the k-th row are turned off. The subpixels of the k-th row remain in the non-lighting state until the next lighting period.

Subsequently, in a non-lighting period of the k+1-th row, all the subpixels of the k+1-th row are in the non-lighting state in a manner similar to that described above.

Such a driving method described above, in which the subpixels are not constantly on through one horizontal period and a non-lighting period is provided in one horizontal period, can be called duty driving. With duty driving, an afterimage phenomenon can be inhibited at the time of displaying moving images; therefore, a display apparatus with high performance in displaying moving images can be obtained. Particularly in a VR device and the like, a reduction in an afterimage can reduce what is called VR sickness.

In the duty driving, the proportion of the lighting period in one horizontal period can be called a duty cycle. For example, a duty cycle of 50% means that the lighting period and the non-lighting period have the same length. Note that the duty cycle can be set freely and can be adjusted appropriately within a range higher than 0% and lower than or equal to 100%, for example.

A structure different from the structures of the above-described pixel circuits will be described with reference to FIG. 23A and FIG. 23B.

Figures 23A, 23B:
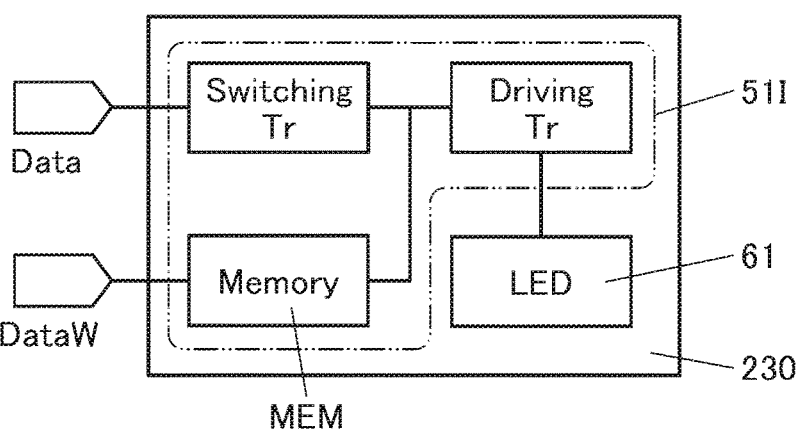
FIG. 23A and FIG. 23B are diagrams illustrating a structure example of a display apparatus.

FIG. 23A is a block diagram of the pixel 230. The pixel illustrated in FIG. 23A includes a memory circuit MEM (Memory) in addition to a switching transistor (Switching Tr), a driving transistor (Driving Tr), and a light-emitting element (LED).

Data DataW is supplied to the memory circuit MEM through a wiring SL2 and the transistor 52A. When the data DataW is supplied to the pixel in addition to image data Data, a current flowing through the light-emitting element becomes large, so that the display apparatus can have high luminance.

FIG. 23B is a specific circuit diagram of a pixel circuit 51I.

The pixel circuit 51I illustrated in FIG. 23B includes a transistor 52w, the transistor 52A, the transistor 52B, the transistor 52C, a capacitor 53s, and a capacitor 53w. FIG. 23B illustrates the light-emitting element 61 connected to the pixel circuit 51I.

The transistor 52w functions as a switching transistor. The transistor 52B functions as a driving transistor. One of a source and a drain of the transistor 52w is electrically connected to one electrode of the capacitor 53w. The other electrode of the capacitor 53w is electrically connected to one of the source and the drain of the transistor 52A. The one of the source and the drain of the transistor 52A is electrically connected to the gate of the transistor 52B. The gate of the transistor 52B is electrically connected to one electrode of the capacitor 53s. The other electrode of the capacitor 53s is electrically connected to one of the source and the drain of the transistor 52B. The one of the source and the drain of the transistor 52B is electrically connected to one of a source and a drain of the transistor 52C. The one of the source and the drain of the transistor 52C is electrically connected to one electrode of the light-emitting element 61. The transistors illustrated in FIG. 23B each include a back gate electrically connected to its gate; however, the connection of the back gate is not limited thereto. The transistors do not necessarily include the back gates.

Here, a node to which the other electrode of the capacitor 53w, the one of the source and the drain of the transistor 52A, the gate of the transistor 52B, and the one electrode of the capacitor 53s are connected is referred to as a node NM. A node to which the other electrode of the capacitor 53s, the one of the source and the drain of the transistor 52B, the one of the source and the drain of the transistor 52C, and the one electrode of the light-emitting element 61 are connected is referred to as a node NA.

A gate of the transistor 52w is electrically connected to the wiring GL1. The gate of the transistor 52C is electrically connected to the wiring GL1. The gate of the transistor 52A is electrically connected to the wiring GL2. The other of the source and the drain of the transistor 52w is electrically connected to a wiring SL1. The other of the source and the drain of the transistor 52C is electrically connected to the wiring V0. The other of the source and the drain of the transistor 52A is electrically connected to a wiring SL2. Note that in this embodiment and the like, the wiring SL1 and the wiring SL2 are collectively referred to as the wiring SL in some cases. Thus, the wiring SL is not limited to one wiring and consists of a plurality of wirings in some cases.

The other of the source and the drain of the transistor 52B is electrically connected to the wiring ANO. The other electrode of the light-emitting element 61 is electrically connected to the wiring VCOM.

The wiring GL1 and the wiring GL2 can have a function of signal lines for controlling the operation of the transistors. The wiring SL1 can have a function of a signal line for supplying the image data Data to the pixel. The wiring SL2 can have a function of a signal line for writing the data DataW to the memory circuit MEM. For example, the wiring SL2 can have a function of a signal line for supplying a correction signal to the pixel. The wiring V0 has a function of a monitor line for obtaining the electrical characteristics of the transistor 52B. A specific potential is supplied from the wiring V0 to the other electrode of the capacitor 53s through the transistor 52C, whereby writing of an image signal can be stable.

The transistor 52A and the capacitor 53w constitute the memory circuit MEM. The node NM is a memory node; when the transistor 52A is turned on, the data DataW supplied from the wiring SL2 can be written to the node NM. The use of an OS transistor with an extremely low off-state current as the transistor 52A allows the potential of the node NM to be retained for a long time.

In the pixel circuit 51I, the image data Data supplied from the wiring SL1 is supplied to the capacitor 53w through the transistor 52w. One of the source and the drain of the transistor 52w and the node NM are capacitively coupled. Thus, the potential of the node NM to which the data DataW is written changes depending on the image data Data. Furthermore, the node NA and the node NM are capacitively coupled through the capacitor 53s. Thus, the potential of the node NA changes depending on the data DataW and the image data Data.

Note that the transistor 52w functions as a selection transistor for determining whether or not the image data Data is to be supplied. The transistor 52C functions as a reset transistor for determining whether or not to set the potential of the node NA to be equal to that of the wiring V0.

The display apparatus of one embodiment of the present invention can detect a defective pixel using the functional circuit 40 provided to overlap with the pixel circuit group 55. Information on the defective pixel can be used to correct a display defect due to the defective pixel, leading to normal display.

Some or all of steps of a correction method described below as an example may be performed by a circuit provided outside the display apparatus. Alternatively, some of the steps of the correction method may be performed by the functional circuit 40 and the other steps may be performed by a circuit provided outside the display apparatus.

Figure 24A:
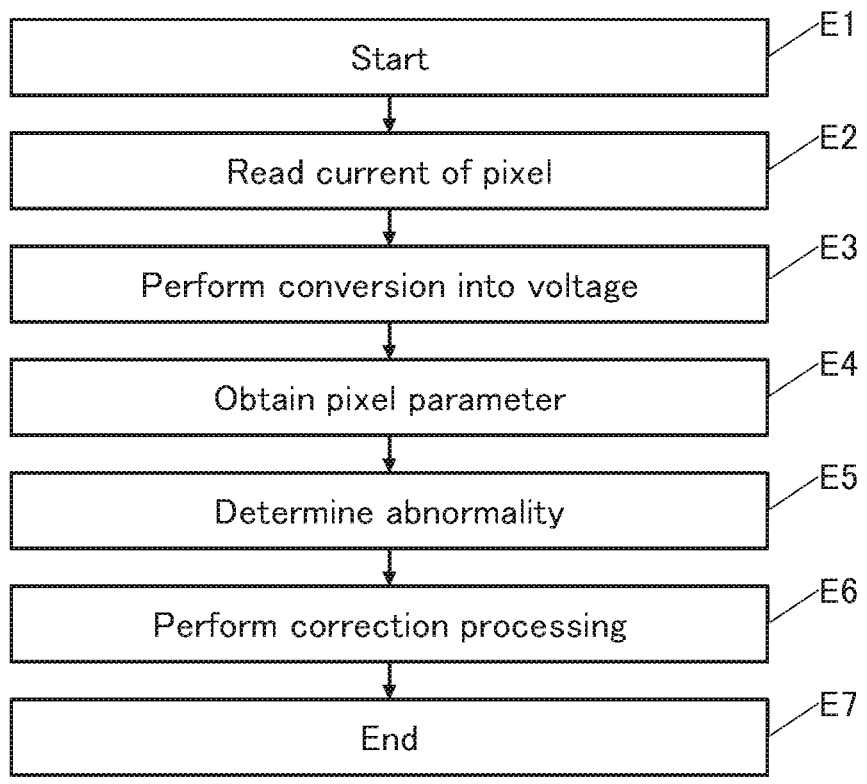
FIG. 24A and FIG. 24B are diagrams illustrating an operation method example of a display apparatus.

A more specific example of the correction method will be described below. FIG. 24A is a flow chart of the correction method described below.

First, a correction operation starts in Step E1.

Next, currents of the pixels are read in Step E2. For example, each of the pixels can be driven so as to output a current to a monitor line electrically connected to the pixel.

In the case where the pixel circuit group 55 is divided into a plurality of sections 59 as in a later-described display apparatus 10B or the like, current reading operations can be performed simultaneously for each of the sections 59. With the pixel circuit group 55 divided into the plurality of sections 59, the time required to read currents of all pixels can be extremely short.

Then, the read currents are converted into voltages in Step E3. In the case of using a digital signal in later processing, conversion to digital data can be performed in Step E3. For example, analog data can be converted into digital data using an analog-digital converter circuit (ADC).

Next, pixel parameters of the pixels are obtained on the basis of the obtained data in Step E4. Examples of the pixel parameter include the threshold voltage and field-effect mobility of the driving transistor, the threshold voltage of the light-emitting element, and a current value at a certain voltage.

Subsequently, each of the pixels is determined to be abnormal or not on the basis of the pixel parameter in Step E5. For example, a pixel is determined to be abnormal when its pixel parameter has a value exceeding (or lower than) a predetermined threshold value.

Examples of abnormality include a dark spot defect with luminance significantly lower than that corresponding to an input data potential, and a bright spot defect with luminance significantly higher than that corresponding to an input data potential.

The address of the abnormal pixel and the kind of the defect can be specified and obtained in Step E5.

Then, correction processing is performed in Step E6.

Figure 24B:
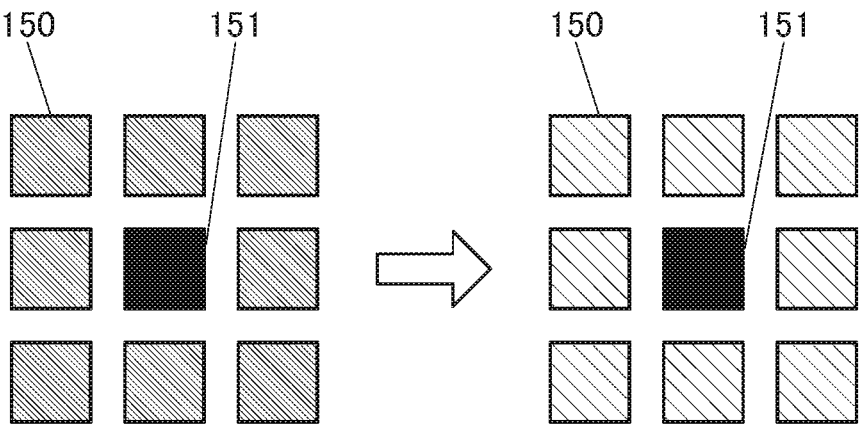

An example of the correction processing is described with reference to FIG. 24B. FIG. 24B schematically illustrates 3×3 pixels each of which includes a pair of the pixel circuit 51 and the light-emitting element 61. Here, the pixel at the center is regarded as a pixel 151 having a dark spot defect. FIG. 24B schematically illustrates a state where the pixel 151 is off and pixels 150 around the pixel 151 are on with predetermined luminance.

A dark spot defect is due to a pixel unlikely to have normal luminance even when correction for increasing a data potential input to the pixel is performed. Hence, correction for increasing luminance is performed on the pixels 150 around the pixel 151 having a dark spot defect, as illustrated in FIG. 24B. As a result, a normal image can be displayed even when a dark spot defect is caused.

In the case of a bright spot defect, the luminance of pixels around the defect is decreased, so that the bright spot defect can be less noticeable.

Such a correction method for compensating for an abnormal pixel by pixels around the abnormal pixel is effective particularly in the case of a display apparatus with a high resolution (e.g., 1000 ppi or higher), in which it is difficult to see a plurality of adjacent pixels separately from each other.

It is preferable that correction be performed such that a data potential is not input to a pixel in which abnormality such as a dark spot defect or a bright spot defect has been caused.

As described above, a correction parameter can be set for each pixel. When the correction parameter is applied to image data to be input, correction image data which enables the display apparatus 10A to display an optimal image can be generated.

As well as in an abnormal pixel and pixels around the abnormal pixel, pixel parameters vary in pixels not determined to be abnormal; thus, display unevenness due to the variation might be recognized when an image is displayed, in some cases. Hence, correction parameters for the pixels not determined to be abnormal can be set so as to cancel (level off) the variation of the pixel parameters. For example, a reference value based on the mean value, average value, or the like of pixel parameters of some or all of the pixels can be set, and a correction value used for canceling a difference of a pixel parameter of a certain pixel from the reference value can be set as a correction parameter of the pixel.

For each of pixels around an abnormal pixel, it is preferable to set correction data that takes into consideration both a correction amount for compensating for the abnormal pixel and a correction amount for canceling pixel parameter variation.

Next, the correction operation ends in Step E7.

After that, an image can be displayed on the basis of the correction parameters obtained in the correction operation and image data to be input.

Note that a neural network may be used in a step of the correction operation. In the neural network, correction parameters can be determined on the basis of inference results obtained by machine learning, for example. In the case where correction parameters are determined by a neural network, for example, high-accuracy correction can be performed to make an abnormal pixel less noticeable without using a detailed algorithm for correction.

The above is the description of the correction method.

Modification Example 1

Figures 25A, 25B:
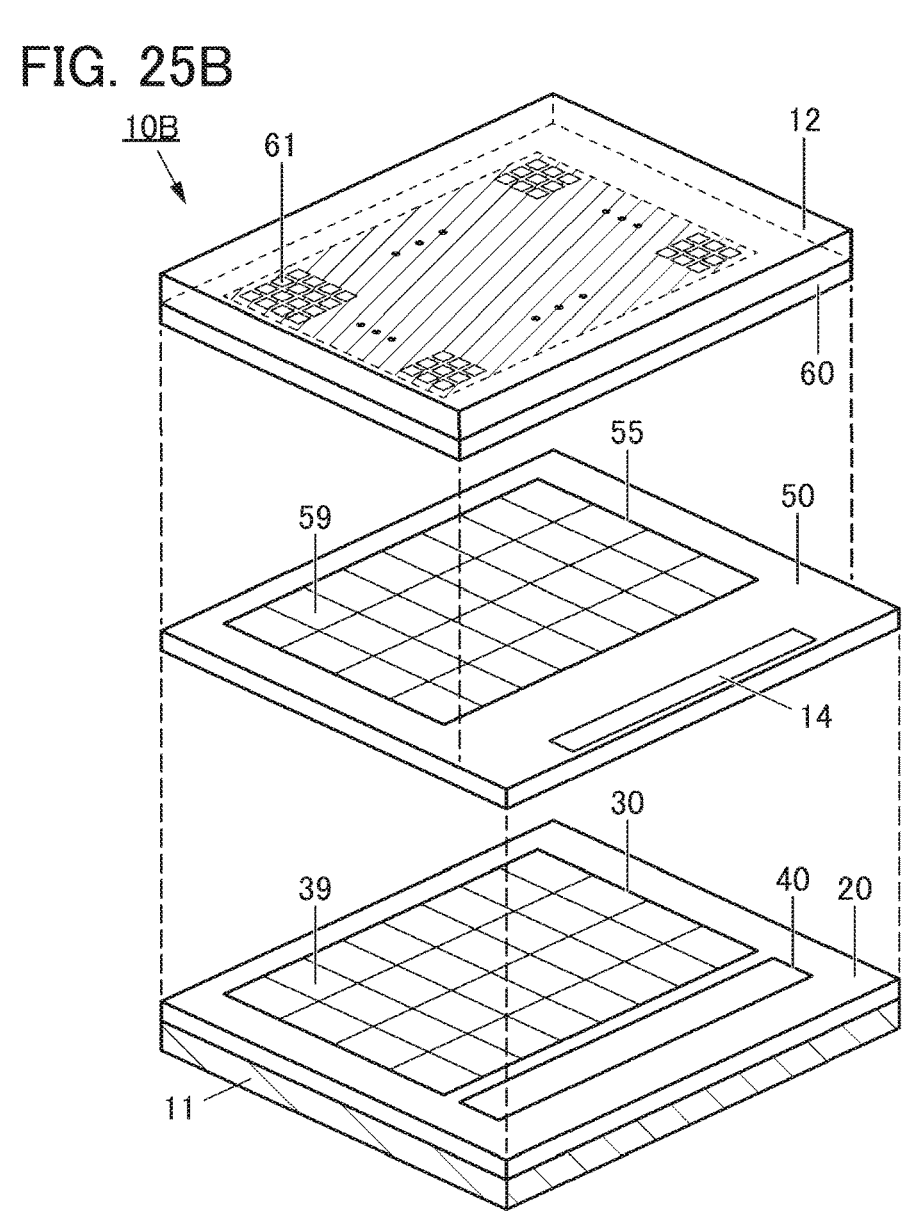
FIG. 25A and FIG. 25B are diagrams illustrating a structure example of a display apparatus.

FIG. 25A and FIG. 25B are perspective views of the display apparatus 10B, which is a modification example of the display apparatus 10A. FIG. 25B is a perspective view for illustrating structures of layers included in the display apparatus 10B. Note that description is made mainly on portions different from those of the display apparatus 10A to reduce repeated description.

In the display apparatus 10B, the driver circuit 30 and the pixel circuit group 55 including the plurality of pixel circuits 51 overlap with each other. In the display apparatus 10B, the pixel circuit group 55 is divided into the plurality of sections 59 and the driver circuit 30 is divided into a plurality of sections 39. The plurality of sections 39 each include the source driver circuit 31 and the gate driver circuit 33.

Figures 26A, 26B, 26C, 26D:
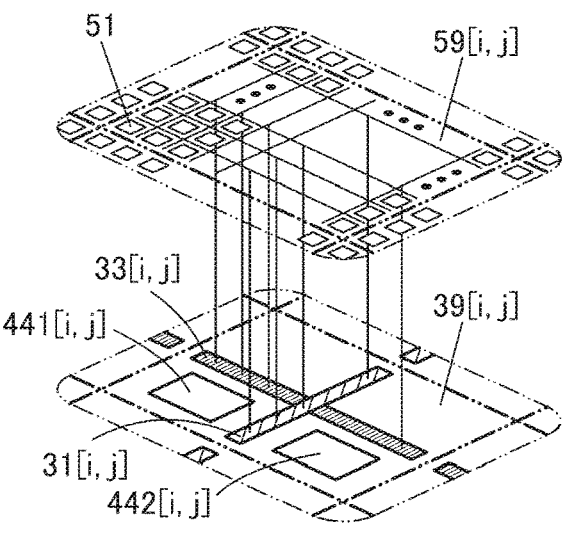
FIG. 26A to FIG. 26D are diagrams illustrating structure examples of a display apparatus.

FIG. 26A illustrates a structure example of the pixel circuit group 55 included in the display apparatus 10B. FIG. 26B illustrates a structure example of the driver circuit 30 included in the display apparatus 10B. The sections 59 and the sections 39 are each arranged in a matrix of m rows and n columns (m and n are each an integer greater than or equal to 1). In this specification and the like, the section 59 in the first row and the first column is denoted by a section 59[1,1], and the section 59 in the m-th row and the n-th column is denoted by a section 59[m,n]. Similarly, the section 39 in the first row and the first column is denoted by a section 39[1,1], and the section 39 in the m-th row and the n-th column is denoted by a section 39[m,n]. FIG. 26A and FIG. 26B illustrate a case where m is 4 and n is 8. That is, the pixel circuit group 55 and the driver circuit 30 are each divided into 32 sections.

The plurality of sections 59 each include the plurality of pixel circuits 51, a plurality of wirings SL, and a plurality of wirings GL. In each of the plurality of sections 59, one of the plurality of pixel circuits 51 is electrically connected to at least one of the plurality of wirings SL and at least one of the plurality of wirings GL.

One of the sections 59 and one of the sections 39 are provided to overlap with each other (see FIG. 26C). For example, a section 59[i,j] (i is an integer greater than or equal to 1 and less than or equal to m, and j is an integer greater than or equal to 1 and less than or equal to n) and a section 39[i,j] are provided to overlap with each other. A source driver circuit 31[i,j] included in the section 39[i,j] is electrically connected to the wiring SL included in the section 59[i,j]. A gate driver circuit 33[i,j] included in the section 39[i,j] is electrically connected to the wiring GL included in the section 59[i,j]. The source driver circuit 31[i,j] and the gate driver circuit 33[i,j] have a function of controlling the plurality of pixel circuits 51 included in the section 59[i,j].

When the section 59[i,j] and the section 39[i,j] are provided to overlap with each other, a connection distance (wiring length) between the pixel circuit 51 included in the section 59[i,j] and each of the source driver circuit 31 and the gate driver circuit 33 included in the section 39[i,j] can be made extremely short. As a result, the wiring resistance and the parasitic capacitance are reduced, and thus time taken for charging and discharging can be reduced and high-speed driving can be achieved. Moreover, power consumption can be reduced. Furthermore, the size and weight of the display apparatus can be reduced.

In addition, the display apparatus 10B includes the source driver circuit 31 and the gate driver circuit 33 in each of the sections 39. Thus, the display portion 13 can be divided into the sections 59 corresponding to the sections 39, and image data rewriting can be performed in each section. For example, in the display portion 13, image rewriting can be performed only in a section where an image has been changed and image data can be retained in a section with no change, so that power consumption can be reduced.

In this embodiment and the like, one section of the display portion 13 divided into the sections 59 is referred to as a sub-display portion 19. Thus, it can also be said that the sub-display portions 19 are divided to correspond to the sections 39. In the display apparatus 10B described with reference to FIG. 25 and FIG. 26, the display portion 13 is divided into 32 of the sub-display portions 19 (see FIG. 25A). Each of the sub-display portions 19 includes the plurality of pixels 230 illustrated in FIG. 19 and the like. Specifically, one of the sub-display portions 19 includes one of the sections 59 including the plurality of pixel circuits 51, and the plurality of light-emitting elements 61. Each of the sections 39 has a function of controlling the plurality of pixels 230 included in one of the sub-display portions 19.

In the display apparatus 10B, driving frequency at the time of displaying an image can be set freely for each of the sub-display portions 19 by the timing controller 44 included in the functional circuit 40. The functional circuit 40 has a function of controlling operations in the plurality of sections 39 and the plurality of sections 59. In other words, the functional circuit 40 has a function of controlling driving frequency and operation timing of each of the plurality of sub-display portions 19 arranged in a matrix. In addition, the functional circuit 40 has a function of adjusting synchronization between the sub-display portions.

A timing controller 441 and an input/output circuit 442 may be provided for each of the sections 39 (see FIG. 26D). For the input/output circuit 442, an I2C (Inter-Integrated Circuit) interface can be used, for example. The timing controller 441 included in the section 39[i,j] is denoted as a timing controller 441[i,j] in FIG. 26. Furthermore, the input/output circuit 442 included the section 39[i,j] is denoted as an input/output circuit 442[i,j].

The functional circuit 40 supplies setting signals for the scan direction and driving frequency of the gate driver circuit 33[i,j] and operation parameters, such as the number of pixels in image data reduced for decreasing definition (the number of pixels where image data rewriting is not performed at the time of image data rewriting), to the input/output circuit 442[*i,j*], for example. The source driver circuit 31[*i,j*] and the gate driver circuit 33[*i,j*] operate in accordance with the operation parameters.

In the case where the sub-display portions 19 each include a light-receiving element described later, the input/output circuit 442 outputs information obtained by photoelectric conversion by the light-receiving element to the functional circuit 40.

In the display apparatus 10B in the electronic device of one embodiment of the present invention, the pixel circuit 51 and the driver circuit 30 are stacked and the driving frequency is different in each of the sub-display portions 19 in accordance with the motion of the user's gaze, whereby low power consumption can be achieved.

Figure 27A:
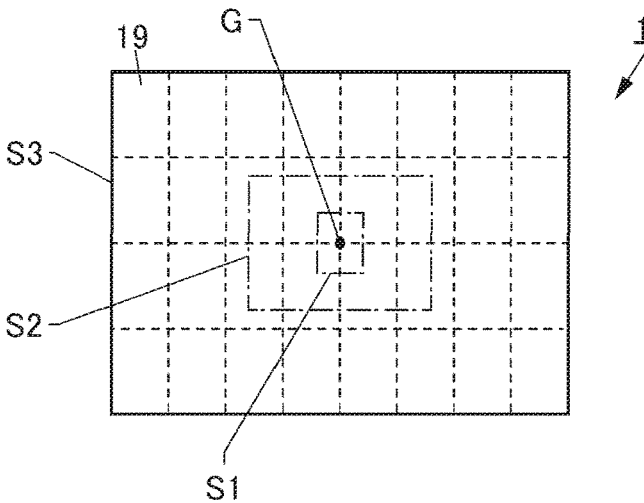
FIG. 27A to FIG. 27C are diagrams illustrating structure examples of a display apparatus.
Figure 27B:
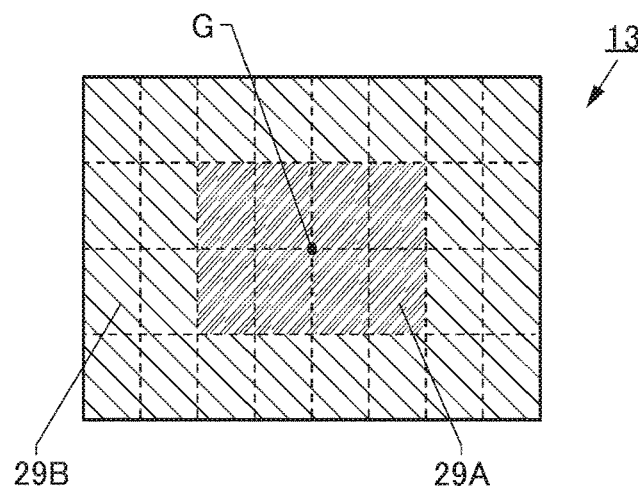

FIG. 27A illustrates the display portion 13 including the sub-display portions 19 in four rows and eight columns. FIG. 27A also illustrates the first region S1 to the third region S3 with the gaze point G as a center. The CPU 45 divides the plurality of sub-display portions 19 between a first section 29A overlapping with the first region S1 or the second region S2 and a second section 29B overlapping with the third region S3. In other words, the CPU 45 divides the plurality of sections 39 between the first section 29A and the second section 29B. In this case, the first section 29A overlapping with the first region S1 or the second region S2 includes a region overlapping with the gaze point G. Furthermore, the second section 29B includes the sub-display portions 19 positioned outside the first section 29A (see FIG. 27B).

The operations of the driver circuits (the source driver circuit 31 and the gate driver circuit 33) included in each of the plurality of sections 39 are controlled by the functional circuit 40. For example, the second section 29B is a section overlapping with the third region S3 including the above-described stable visual field, inducting visual field, and supplementary visual field, and is hard for the user to discriminate. Thus, the user perceives a small reduction in practical display quality (hereinafter also referred to as "practical display quality") even when the number of times of image data rewriting per unit time (hereinafter also referred to as "image rewriting frequency") at the time of displaying an image is smaller in the second section 29B than in the first section 29A. In other words, a reduction in practical display quality is small even when driving frequency of the sub-display portion 19 included in the second section 29B (also referred to as "second driving frequency") is lower than driving frequency of the sub-display portions 19 included in the first section 29A (also referred to as "first driving frequency").

A decrease in the driving frequency can result in a reduction in power consumption of the display apparatus. On the other hand, a decrease in the driving frequency reduces the display quality. In particular, the display quality in displaying a moving image is reduced. According to one embodiment of the present invention, the second driving frequency is made lower than the first driving frequency; thus, power consumption can be reduced in a section where the visibility by the user is low and the reduction of the practical display quality can be inhibited. According to one embodiment of the present invention, both display quality maintenance and a reduction in power consumption can be achieved.

The first driving frequency can be higher than or equal to 30 Hz and lower than or equal to 500 Hz, preferably higher than or equal to 60 Hz and lower than or equal to 500 Hz. The second driving frequency is preferably lower than or equal to the first driving frequency, further preferably lower than or equal to a half of the first driving frequency, still further preferably lower than or equal to one fifth of the first driving frequency.

Figure 27C:
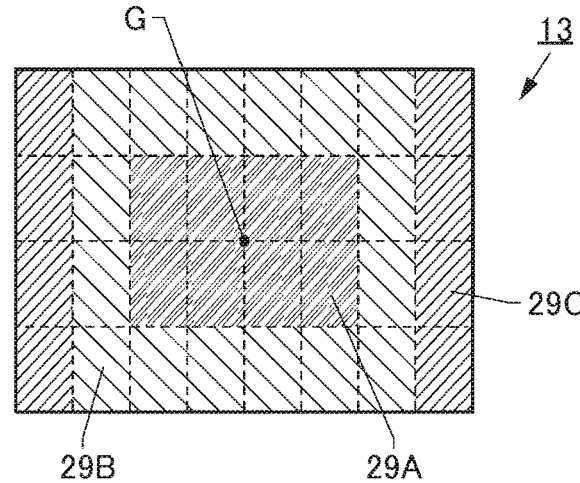

A section of the sub-display portions 19 overlapping with the third region S3 that is farther from the first section 29A may be set as a third section 29C (see FIG. 27C), and driving frequency of the sub-display portions 19 included in the third section 29C (also referred to as "third driving frequency") may be made lower than the driving frequency in the second section 29B. The third driving frequency is preferably lower than or equal to the second driving frequency, further preferably lower than or equal to a half of the second driving frequency, still further preferably lower than or equal to one fifth of the second driving frequency. By significantly lowering image rewriting frequency, power consumption can be further reduced. Note that rewriting of image data may be stopped if necessary. By stopping rewriting of image data, power consumption can be further reduced.

In the case where such a driving method is employed, a transistor with an extremely low off-state current is suitably used as a transistor included in the pixel circuit 51. For example, an OS transistor is suitably used as the transistor included in the pixel circuit 51. An OS transistor has an extremely low off-state current and thus can achieve long-term retention of image data supplied to the pixel circuit 51. It is particularly suitable to use an OS transistor as the transistor 52A.

In some cases, an image whose brightness, contrast, color tone, or the like is greatly different from that of the previous image is displayed as in the case where a video scene displayed on the display portion 13 is changed, for example. Such a case causes a mismatch of the timing at which an image is changed between the first section 29A and a section whose driving frequency is lower than that of the first section 29A. This might cause a great difference in the brightness, contrast, color tone, or the like between the sections, leading to the loss of the practical display quality. In such a case where a video scene is changed, image data rewriting can be temporarily performed in the section other than the first section 29A at a driving frequency which is the same as that of the first section 29A, and then the driving frequency of the section other than the first section 29A can be decreased.

Furthermore, in the case where the fluctuation amount of the gaze point G is judged to be exceeding a certain value, image data rewriting may be performed in the section other than the first section 29A at a driving frequency which is the same as that of the first section 29A, and the driving frequency of the section other than the first section 29A may be decreased when the fluctuation amount is judged to be within the certain value. In the case where the fluctuation amount of the gaze point G is judged to be small, the driving frequency of the section other than the first section 29A may be further decreased.

In the case where the display apparatus 10B does not include a frame memory, which is a memory device for temporarily retaining image data, or includes one frame memory for the entire display portion 13, each of the second driving frequency and the third driving frequency needs to be an integral submultiple of the first driving frequency.

When the plurality of sub-display portions 19 are provided with respective frame memories, each of the second driving frequency and the third driving frequency can be set to a given value without limitation to an integral submultiple of the first driving frequency. When the second driving frequency and the third driving frequency are set to given values, the degree of freedom in setting the driving frequencies can be increased. As a result, a reduction in the practical display quality can be small.

Figure 28:
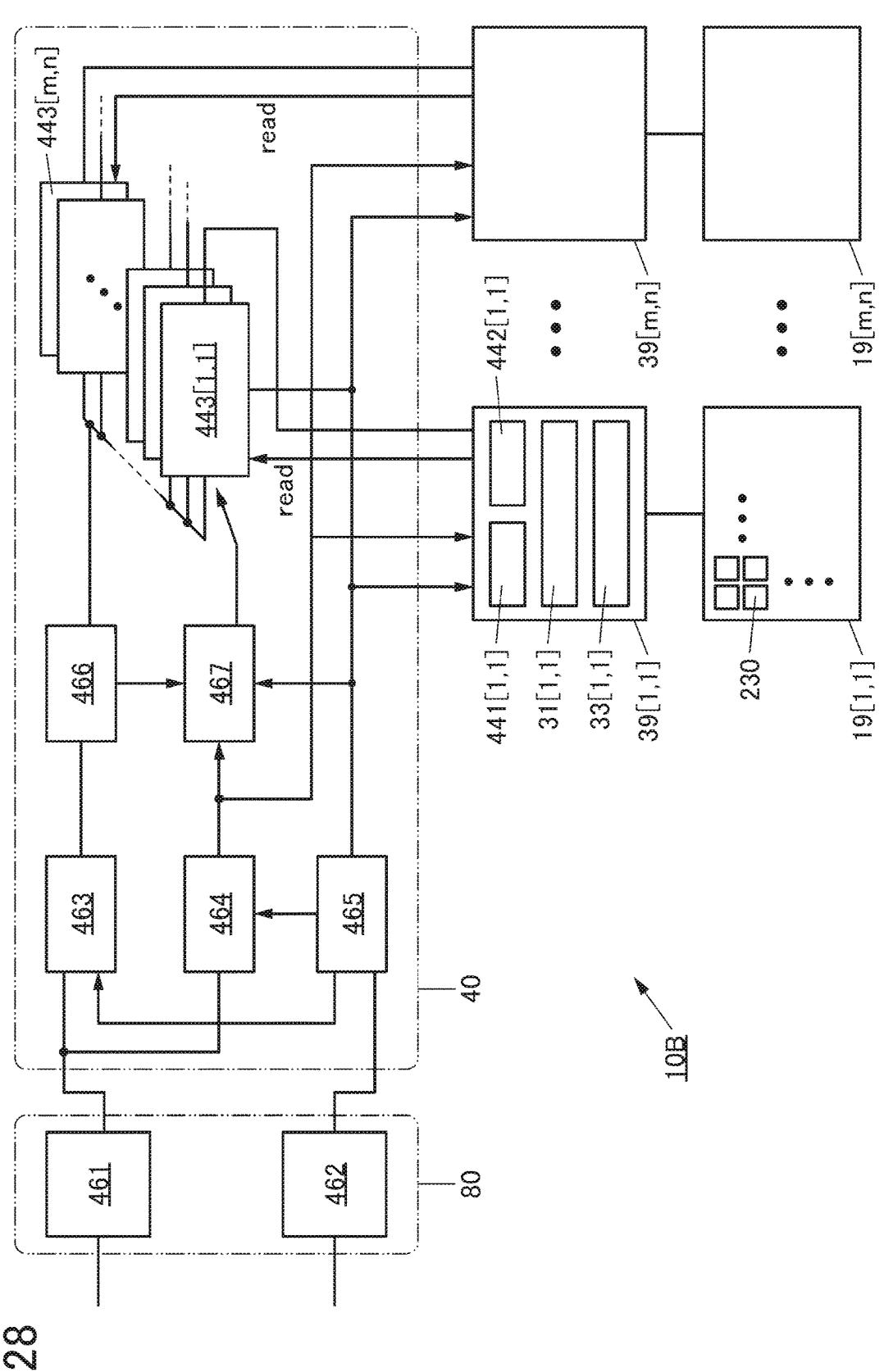
FIG. 28 is a block diagram illustrating a structure example of a display apparatus.

FIG. 28 is a block diagram illustrating a structure example of the display apparatus 10B including a frame memory 443 for each of the sub-display portions 19. In FIG. 28, the input/output circuit 80 includes an image information input portion 461 and a clock signal input portion 462. The functional circuit 40 includes an image data temporary retention portion 463, an operation parameter setting portion 464, an internal clock signal generating portion 465, an image processing portion 466, a memory controller 467, and a plurality of frame memories 443.

Each of the plurality of frame memories 443 has a function of retaining image data to be displayed on one of the plurality of sub-display portions 19. For example, a frame memory 443[1,1] has a function of retaining image data to be displayed on a sub-display portion 19[1,1]. Similarly, a frame memory 443[$m,n$] has a function of retaining image data to be displayed on a sub-display portion 19[$m,n$].

Each of the plurality of sub-display portions 19 is electrically connected to one of the plurality of sections 39. In FIG. 28, each of the plurality of sections 39 includes the source driver circuit 31, the gate driver circuit 33, the timing controller 441, and the input/output circuit 442.

Image data to be displayed on the display portion 13 and operation parameters of the display apparatus 10B are supplied to the image information input portion 461 from the outside. A clock signal is supplied to the clock signal input portion 462 from the outside. The clock signal is supplied to the internal clock signal generating portion 465 via the clock signal input portion 462.

The internal clock signal generating portion 465 has a function of generating a clock signal used in the display apparatus 10B (also referred to as "internal clock signal") with the use of the clock signal supplied from the outside. The internal clock signal is supplied to the image data temporary retention portion 463, the operation parameter setting portion 464, the memory controller 467, the section 39, and the like and used for matching operation timing between the circuits included in the display apparatus 10B, for example.

The image data input via the image information input portion 461 is supplied to the image data temporary retention portion 463. The operation parameters input via the image information input portion 461 are supplied to the operation parameter setting portion 464.

The image data temporary retention portion 463 retains the supplied image data, and supplies the image data to the image processing portion 466 in synchronization with the internal clock signal. Providing the image data temporary retention portion 463 can eliminate a mismatch between the timing at which image data is supplied from the outside and the timing at which the image data is processed in the display apparatus 10B.

The operation parameter setting portion 464 has a function of retaining the supplied operation parameters. The operation parameters include information for determining the driving frequency, scan direction, definition, or the like for each of the plurality of sub-display portions 19.

The image processing portion 466 has a function of performing arithmetic processing of the image data retained in the image data temporary retention portion 463. For example, the image processing portion 466 has a function of performing contrast adjustment, brightness adjustment, and gamma correction of the image data. Furthermore, the image processing portion 466 has a function of dividing the image data retained in the image data temporary retention portion 463 for the sub-display portions 19.

The memory controller 467 has a function of controlling the operations of the plurality of frame memories 443. The image data is retained in the plurality of frame memories 443 after being divided by the image processing portion 466 for the sub-display portions 19. Each of the plurality of frame memories 443 has a function of supplying image data to the corresponding section 39 in response to a read request signal (read) from the section 39.

Figure 29:
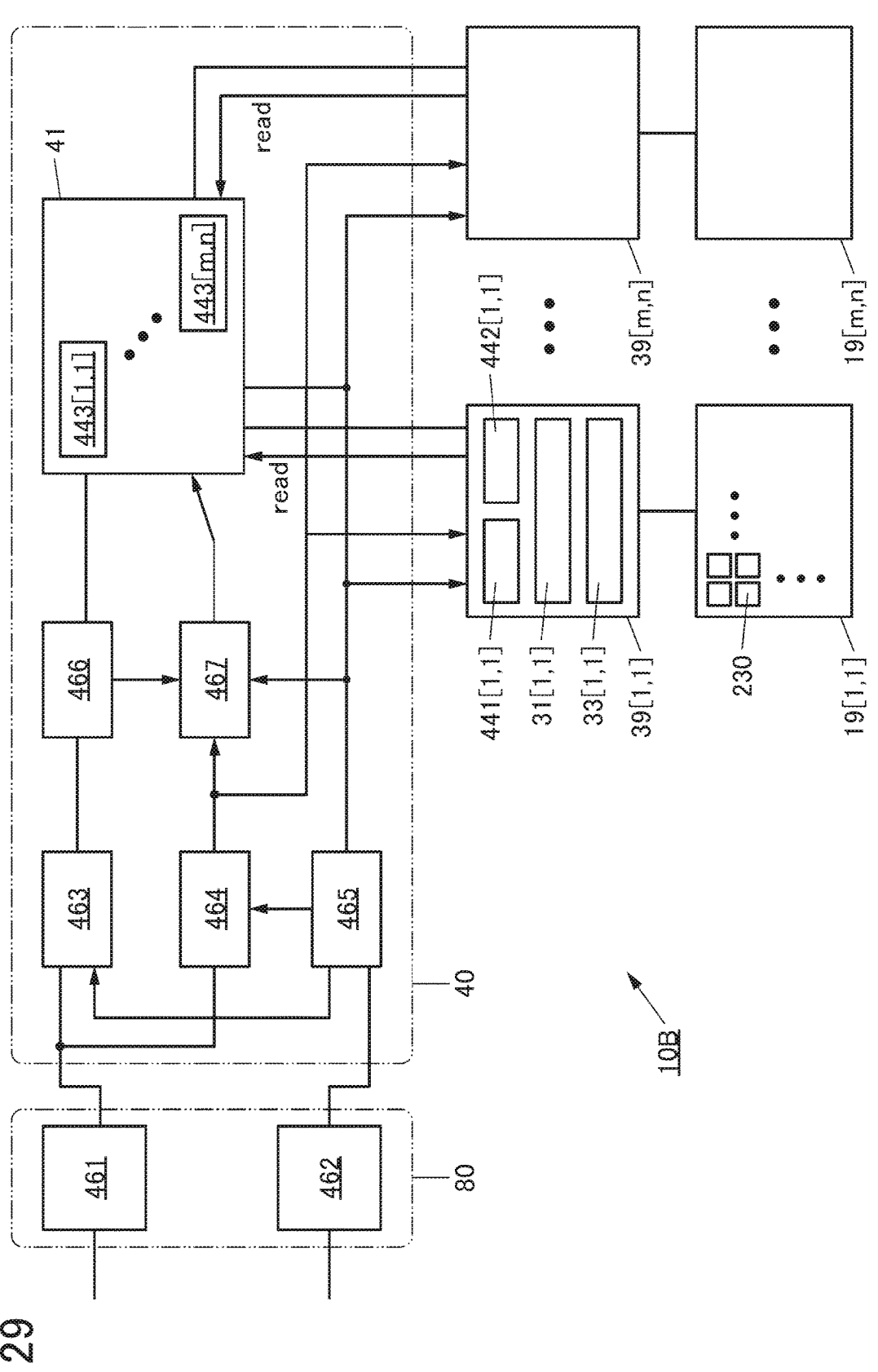
FIG. 29 is a block diagram illustrating a structure example of a display apparatus.

Note that the storage device 41 may be used as the frame memories 443 as illustrated in FIG. 29. In other words, image data divided for the sub-display portions 19 may be retained in the storage device 41.

The frame memories 443 may be provided in a component other than the functional circuit 40. Alternatively, the frame memory 443 may be provided in a semiconductor device other than the display apparatus 10B.

Note that sections set for the display portion 13 are not limited to the three sections of the first section 29A, the second section 29B, and the third section 29C. The display portion 13 may include four or more sections. When a plurality of sections are set for the display portion 13 and the driving frequencies of the sections gradually decreases, a reduction in the practical display quality can be smaller.

The above-described upconversion processing may be performed on an image to be displayed on the first section 29A. When an image obtained by the upconversion processing is displayed on the first section 29A, the display quality can be increased. The above-described upconversion processing may be performed on an image to be displayed on the section other than the first section 29A. When an image obtained by the upconversion processing is displayed on the section other than the first section 29A, a reduction in the practical display quality that occurs in the case where the driving frequency of the section other than the first section 29A is decreased can be smaller.

Note that the upconversion processing of an image to be displayed on the first section 29A may be performed using an algorithm with high accuracy, and the upconversion processing of an image to be displayed on the section other than the first section 29A may be performed using an algorithm with low accuracy. A reduction in the practical display quality that occurs in the case where the driving frequency of the section other than the first section 29A is decreased can be smaller also in such a case.

When image data rewriting performed in each of the sub-display portions 19 is performed concurrently in all of the sub-display portions 19, high-speed rewriting can be achieved. In other words, when image data rewriting performed in each of the sections 39 is performed concurrently in all of the sections 39, high-speed rewriting can be achieved.

In general, while pixels in one row are selected by a gate driver circuit, a source driver circuit writes image data to all of the pixels in one row concurrently in the case of line sequential driving. In the case where the display portion 13 is not divided into the sub-display portions 19 and the definition is 4000×2000 pixels, for example, image data needs to be written to 4000 pixels by the source driver circuit while the pixels in one row are selected by the gate driver circuit. In the case where the frame frequency is 120 Hz, one frame period is approximately 8.3 msec. Accordingly, the gate driver circuit needs to select pixels in 2000 rows in approximately 8.3 msec, and the time for selecting pixels in one row, that is, the time for writing image data to each pixel is approximately 4.17 μsec. In other words, it becomes more difficult to ensure sufficient time for rewriting image data as the definition of the display portion increases or as the frame frequency increases.

The display portion 13 of the display apparatus 10B described as an example in this embodiment is divided into four parts in the row direction. Thus, the time for writing image data to each pixel in one sub-display portion 19 can be four times as long as that of the case where the display portion 13 is not divided. According to one embodiment of the present invention, the time for rewriting image data can be easily ensured even in the case where frame frequency is 240 Hz or 360 Hz; thus, a display apparatus with high display quality can be achieved.

Since the display portion 13 of the display apparatus 10B described as an example in this embodiment is divided into four parts in the row direction, the length of the wiring SL electrically connecting the source driver circuit and the pixel circuit becomes one fourth. Accordingly, each of the resistance value and parasitic capacitance of the wiring SL becomes one fourth, whereby the time required for writing (rewriting) image data can be shortened.

In addition, the display portion 13 of the display apparatus 10B described as an example in this embodiment is divided into eight parts in the column direction; thus, the length of the wiring GL electrically connecting the gate driver circuit and the pixel circuit becomes one eighth. Accordingly, each of the resistance value and parasitic capacitance of the wiring GL becomes one eighth, whereby degradation and delay of a signal can be inhibited and the time for rewriting image data can be easily ensured.

According to the display apparatus 10B of one embodiment of the present invention, sufficient time for writing image data can be easily ensured, and thus high-speed rewriting of a display image can be achieved. Thus, a display apparatus with high display quality can be achieved. In particular, a display apparatus that excels in displaying a moving image can be achieved.

Modification Example 2

Figure 30A:
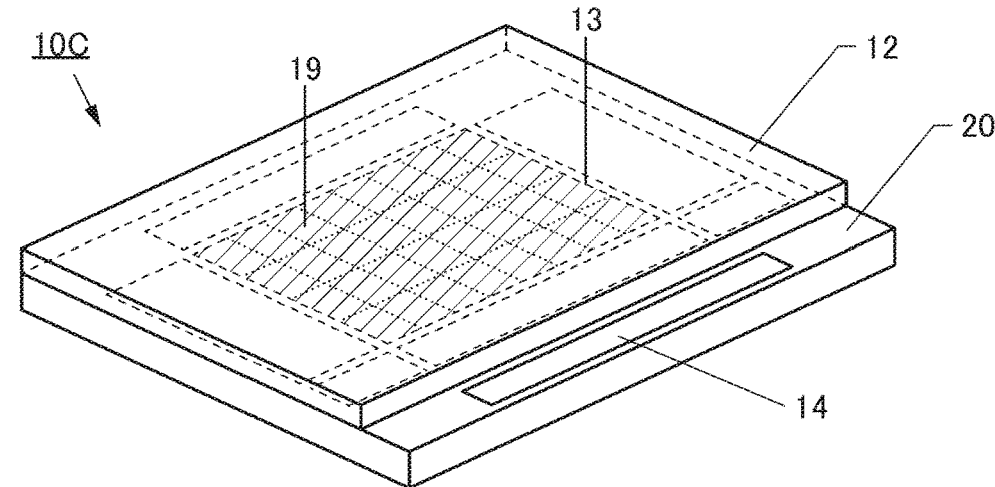
FIG. 30A and FIG. 30B are diagrams illustrating a structure example of a display apparatus.
Figure 30B:
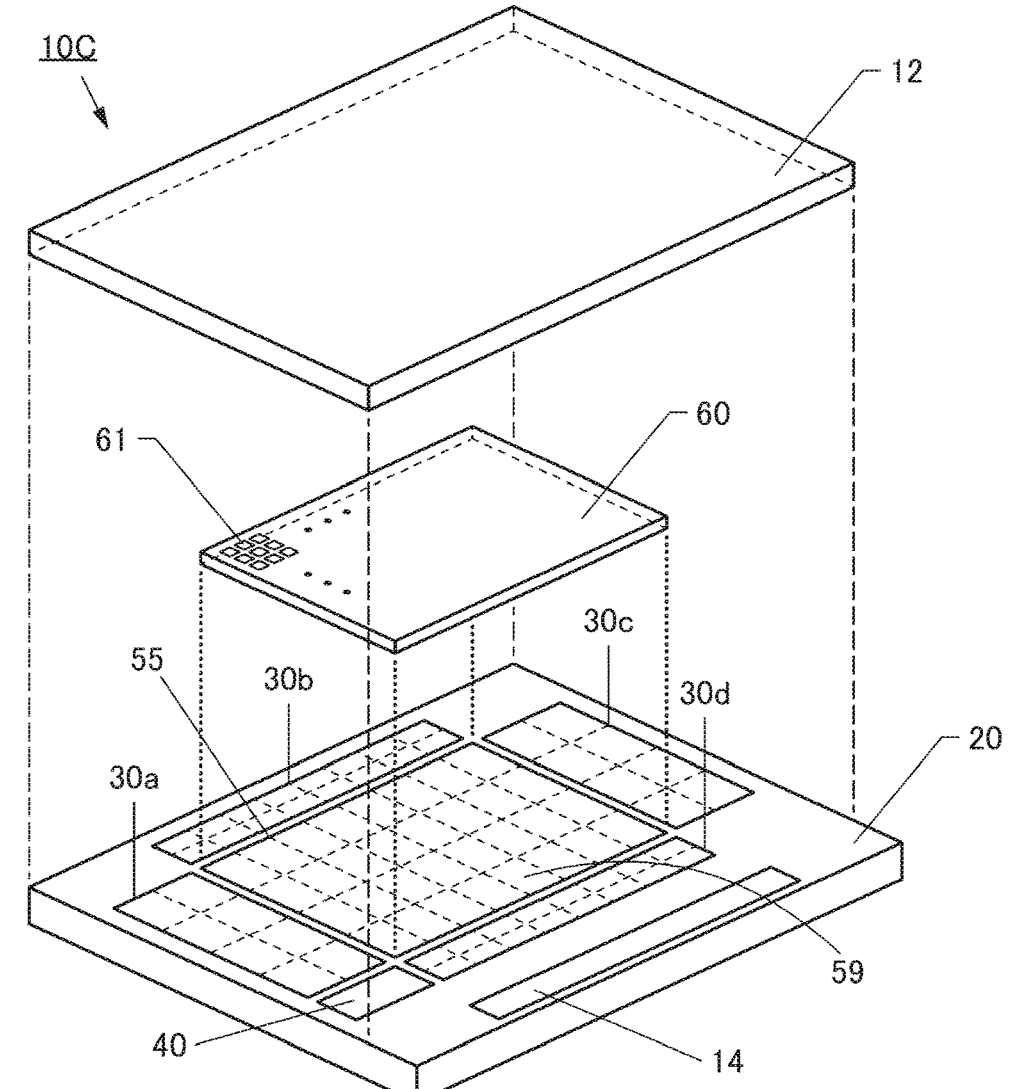

FIG. 30A and FIG. 30B are perspective views of a display apparatus 10C, which is a modification example of the display apparatus 10A. Note that the display apparatus 10C is also a modification example of the display apparatus 10B. FIG. 30B is a perspective view illustrating structures of layers included in the display apparatus 10C. Note that description is made mainly on portions different from those of the display apparatus 10A and the display apparatus 10B to reduce repeated description.

The pixel circuit group 55 including the plurality of pixel circuits 51, the driver circuit 30 (30a to 30d), the functional circuit 40, and the terminal portion 14 may be provided in the same layer. In the display apparatus 10C, the pixel circuit group 55, the driver circuit 30, the functional circuit 40, and the terminal portion 14 are provided in the layer 20. Since the pixel circuit group 55, the driver circuit 30, and the functional circuit 40 are provided in the same layer, wirings electrically connecting the circuits can be short. Thus, wiring resistance and parasitic capacitance are reduced, leading to lower power consumption.

In the case where a c-Si transistor is used as a transistor included in the display apparatus 10C, for example, a single crystal silicon substrate can be used as the layer 20 and the pixel circuit group 55, the driver circuit 30, the functional circuit 40, and the terminal portion 14 can be provided.

When a single crystal silicon substrate is used as the layer 20, the substrate 11 can be omitted. As a result, a reduction in the weight of the display apparatus 10C can be achieved. In addition, the cost of manufacturing the display apparatus 10C can be reduced. Thus, the productivity of the display apparatus 10C can be improved.

Note that a transistor used in the display apparatus 10C is not limited to a c-Si transistor. Any of a variety of transistors such as a Poly-Si transistor or an OS transistor can be employed as the transistor used in the display apparatus 10C.

In the display apparatus 10C illustrated in FIG. 30A and FIG. 30B, the display portion 13 is composed of the sub-display portions 19 arranged in a matrix of m rows and n columns. Accordingly, the pixel circuit group 55 is divided into the sections 59 arranged in a matrix of m rows and n columns. FIG. 31 illustrates a planar layout of the layer 20. FIG. 31 illustrates the sections 59 of the case where m is 4 and n is 8.

The driver circuit 30 is provided in the display apparatus 10C as four divided regions: a driver circuit 30a, a driver circuit 30b, a driver circuit 30c, and a driver circuit 30d. The driver circuit 30a, the driver circuit 30b, the driver circuit 30c, and the driver circuit 30d are provided outside the pixel circuit group 55. Specifically, the driver circuit 30a is provided on a first side of the four sides of the pixel circuit group 55, the driver circuit 30c is provided on a third side that faces the first side with the pixel circuit group 55 positioned therebetween, the driver circuit 30b is provided on a second side, and the driver circuit 30d is provided on a fourth side that faces the second side with the pixel circuit group 55 positioned therebetween.

The driver circuit 30a and the driver circuit 30c each include 16 of the gate driver circuits 33. The driver circuit 30b and the driver circuit 30d each include 16 of the source driver circuits 31. One of the gate driver circuits 33 is electrically connected to the plurality of pixel circuits 51 included in the section 59. One of the source driver circuits 31 is electrically connected to the plurality of pixel circuits 51 included in the section 59.

The gate driver circuit 33 electrically connected to the section 59[1,1] is denoted as a gate driver circuit 33[1,1], and the source driver circuit 31 electrically connected to the section 59[1, 1] is denoted as a source driver circuit 31[1,1] in FIG. 31. Similarly, the gate driver circuit 33 electrically connected to a section 59[4,8] is denoted as a gate driver circuit 33[4,8], and the source driver circuit 31 electrically connected to the section 59[4,8] is denoted as a source driver circuit 31[4,8].

The driver circuit 30a includes the gate driver circuit 33[1,1] to a gate driver circuit 33[1,4], a gate driver circuit 33[2, 1] to a gate driver circuit 33[2,4], a gate driver circuit 33[3, 1] to a gate driver circuit 33[3,4], and a gate driver circuit 33[4,1] to a gate driver circuit 33[4,4]. The driver circuit 30b includes the source driver circuit 31[1,1] to a source driver circuit 31[1,8] and a source driver circuit 31[2,1] to a source driver circuit 31[2,8]. The driver circuit 30c includes a gate driver circuit 33[1,5] to a gate driver circuit 33[1,8], a gate driver circuit 33[2,5] to a gate driver circuit 33[2,8], a gate driver circuit 33[3,5] to a gate driver circuit 33[3,8], and a gate driver circuit 33[4,5] to the gate driver circuit 33[4,8]. The driver circuit 30d includes a source driver circuit 31[3,1] to a source driver circuit 31[3,8] and a source driver circuit 31[4,1] to the source driver circuit 31[4,8].

The positions of the pixel circuit group 55, the driver circuit 30, and the functional circuit 40 provided in the layer 20 are not limited to those illustrated in FIG. 31. For example, a structure illustrated in FIG. 32 may be employed. In FIG. 32, the driver circuit 30 is provided as two divided regions: the driver circuit 30a and the driver circuit 30b. For example, the driver circuit 30a includes 32 of the gate driver circuits 33 (the gate driver circuit 33[1,1] to the gate driver circuit 33[4,8]) and the driver circuit 30b includes 32 of the source driver circuits 31 (the source driver circuit 31[1,1] to the source driver circuit 31[4,8]).

Note that the display apparatus 10B and the display apparatus 10C according to one embodiment of the present invention are each an example in which the display portion 13 is divided into the 32 sub-display portions 19. However, the division number of the display portion 13 in each of the display apparatus 10B and the display apparatus 10C of one embodiment of the present invention may be 16, 64, 128, or the like, without limitation to 32. As the division number of the display portion 13 increases, a reduction in practical display quality perceived by the user can be smaller.

Embodiment 3

In this embodiment, structure examples of a display apparatus that can be employed for the electronic device of one embodiment of the present invention will be described. A display apparatus described below as an example can be employed for the display apparatus 511, the display apparatus 521, and the like in Embodiment 1.

One embodiment of the present invention is a display apparatus including a light-emitting element (also referred to as a light-emitting device). The display apparatus includes two or more light-emitting elements of different emission colors. The light-emitting elements each include a pair of electrodes and an EL layer therebetween. The light-emitting elements are preferably organic EL elements (organic electroluminescent elements). The two or more light-emitting elements of different emission colors include EL layers containing different light-emitting materials. For example, when three kinds of light-emitting elements that emit red (R), green (G), and blue (B) light are included, a full-color display apparatus can be achieved.

In the case of manufacturing a display apparatus including a plurality of light-emitting elements of different emission colors, layers (light-emitting layers) containing at least light-emitting materials each need to be formed in an island shape. In the case of separately forming some or all parts of EL layers, a method for forming an island-shaped organic film by an evaporation method using a shadow mask such as a metal mask is known. However, this method causes a deviation from the designed shape and position of the island-shaped organic film due to various influences such as the accuracy of the metal mask, the positional deviation between the metal mask and a substrate, a warp of the metal mask, and expansion of the outline of a deposited film due to vapor scattering, for example; accordingly, it is difficult to achieve the high definition and high aperture ratio of the display apparatus. In addition, the outline of the layer might blur during evaporation, so that the thickness of an end portion might be reduced. That is, the thickness of an island-shaped light-emitting layer might vary from place to place. In addition, in the case of manufacturing a display apparatus with a large size, high resolution, or high definition, a manufacturing yield might be reduced because of low dimensional accuracy of the metal mask and deformation due to heat or the like. Thus, a measure has been taken for a pseudo increase in definition (also referred to as pixel density) by employing a unique pixel arrangement such as a PenTile arrangement.

Note that in this specification and the like, the term "island shape" refers to a state where two or more layers formed using the same material in the same step are physically separated from each other. For example, the term "island-shaped light-emitting layer" refers to a state where the light-emitting layer and its adjacent light-emitting layer are physically separated from each other.

In one embodiment of the present invention, fine patterning of EL layers is performed by photolithography without using a shadow mask such as a fine metal mask (an FMM). Accordingly, it is possible to achieve a display apparatus with high definition and a high aperture ratio, which has been difficult to achieve. Moreover, since the EL layers can be formed separately, it is possible to achieve a display apparatus that performs extremely clear display with high contrast and high display quality. Note that, fine patterning of the EL layers may be performed using both a metal mask and photolithography, for example.

In addition, some or all parts of the EL layers can be physically divided. This can inhibit leakage current flowing between adjacent light-emitting elements through a layer (also referred to as a common layer) shared by the light-emitting elements. Thus, it is possible to prevent crosstalk due to unintended light emission, so that a display apparatus with extremely high contrast can be achieved. In particular, a display apparatus having high current efficiency at low luminance can be achieved.

Note that in one embodiment of the present invention, the display apparatus can be also obtained by combining a light-emitting element that emits white light with a color filter. In that case, light-emitting elements having the same structure can be employed as light-emitting elements provided in pixels (subpixels) that emit light of different colors, which allows all the layers to be common layers. In addition, some or all parts of the EL layers are divided by photolithography. Thus, leakage current through the common layer is suppressed; accordingly, a high-contrast display apparatus can be achieved. In particular, when an element has a tandem structure in which a plurality of light-emitting layers are stacked with a highly conductive intermediate layer therebetween, leakage current through the intermediate layer can be effectively prevented, so that a display apparatus with high luminance, high definition, and high contrast can be achieved.

Furthermore, an insulating layer covering at least a side surface of the island-shaped light-emitting layer is preferably provided. The insulating layer may cover part of a top surface of an island-shaped EL layer. For the insulating layer, a material having a barrier property against water and oxygen is preferably used. For example, an inorganic insulating film that is less likely to diffuse water or oxygen can be used. This can inhibit degradation of the EL layer and can achieve a highly reliable display apparatus.

Moreover, between two adjacent light-emitting elements, there is a region (a concave portion) where none of the EL layers of the light-emitting elements is provided. In the case where a common electrode or a common electrode and a common layer are formed to cover the concave portion, a phenomenon where the common electrode is divided by a step at an end portion of the EL layer (such a phenomenon is also referred to as disconnection) might occur, which might cause insulation of the common electrode over the EL layer. In view of this, a local gap between the two adjacent light-emitting elements is preferably filled with a resin layer (also referred to as local filling planarization, or LFP) functioning as a planarization film. The resin layer has a function of a planarization film. This structure can inhibit disconnection of the common layer or the common electrode and can achieve a highly reliable display apparatus.

More specific structure examples of the display apparatus according to one embodiment of the present invention will be described below with reference to drawings.

Structure Example 1

Figure 33A:
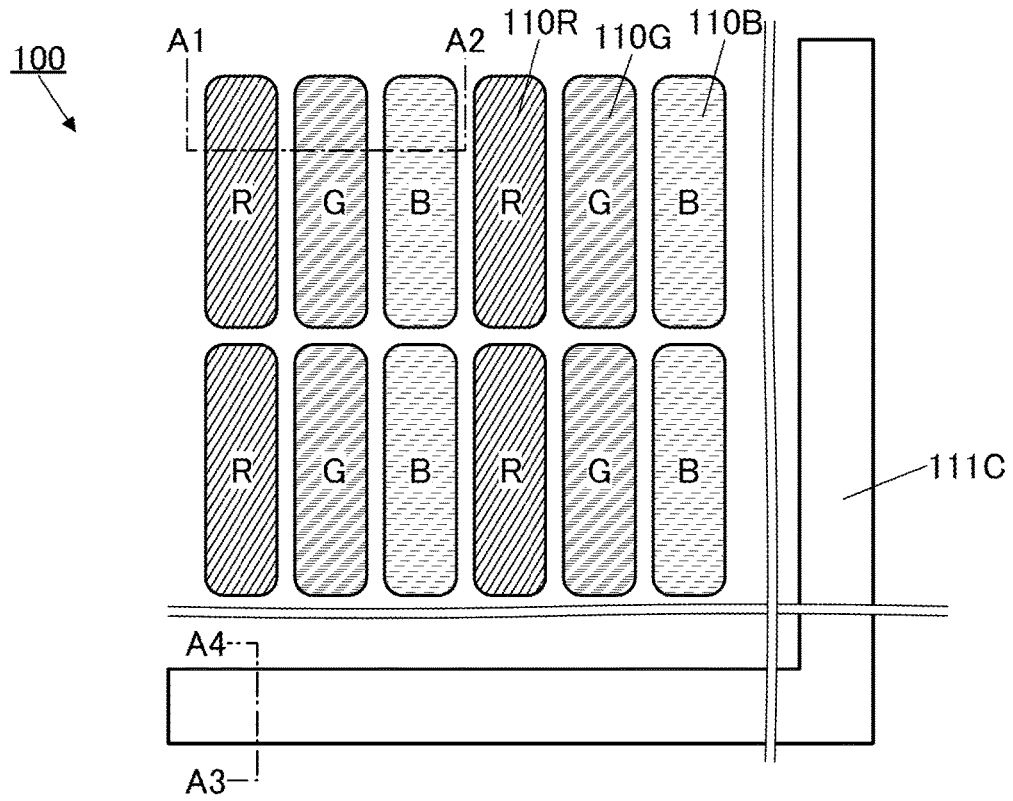
FIG. 33A to FIG. 33C are diagrams illustrating a structure example of a display apparatus.

FIG. 33A illustrates a schematic top view of a display apparatus 100 according to one embodiment of the present invention. The display apparatus 100 includes, over a substrate 101, a plurality of light-emitting elements 110R exhibiting red, a plurality of light-emitting elements 110G exhibiting green, and a plurality of light-emitting elements 110B exhibiting blue. In FIG. 33A, light-emitting regions of the light-emitting elements are denoted by R, G, and B to easily differentiate the light-emitting elements.

The light-emitting elements 110R, the light-emitting elements 110G, and the light-emitting elements 110B are each arranged in a matrix. FIG. 33A illustrates what is called a stripe arrangement, in which the light-emitting elements of the same color are arranged in one direction. Note that an arrangement method of the light-emitting elements is not limited thereto; an arrangement method such as an S-stripe arrangement, a delta arrangement, a Bayer arrangement, or a zigzag arrangement may be employed, or a PenTile arrangement, a diamond arrangement, or the like can be also used.

As each of the light-emitting elements 110R, the light-emitting elements 110G, and the light-emitting elements 110B, an OLED (Organic Light Emitting Diode) or a QLED (Quantum-dot Light Emitting Diode) is preferably used, for example. As a light-emitting substance contained in the EL element, a substance that emits fluorescent light (a fluorescent material), a substance that emits phosphorescent light (a phosphorescent material), and a substance that exhibits thermally activated delayed fluorescence (a thermally activated delayed fluorescent (TADF) material) can be given, for example. As the light-emitting substance contained in the EL element, not only an organic compound but also an inorganic compound (a quantum dot material or the like) can be used.

FIG. 33A also illustrates a connection electrode 111C that is electrically connected to a common electrode 113. The connection electrode 111C is supplied with a potential (e.g., an anode potential or a cathode potential) that is to be supplied to the common electrode 113. The connection electrode 111C is provided outside a display region where the light-emitting elements 110R and the like are arranged.

The connection electrode 111C can be provided along the outer periphery of the display region. For example, the connection electrode 111C may be provided along one side of the outer periphery of the display region, or the connection electrode 111C may be provided across two or more sides of the outer periphery of the display region. That is, in the case where the display region has a rectangular shape in a plan view, the shape of the connection electrode 111C can be a band shape (a rectangle), an L shape, a U shape (a square bracket shape), a quadrangular shape, or the like.

Figure 33B:
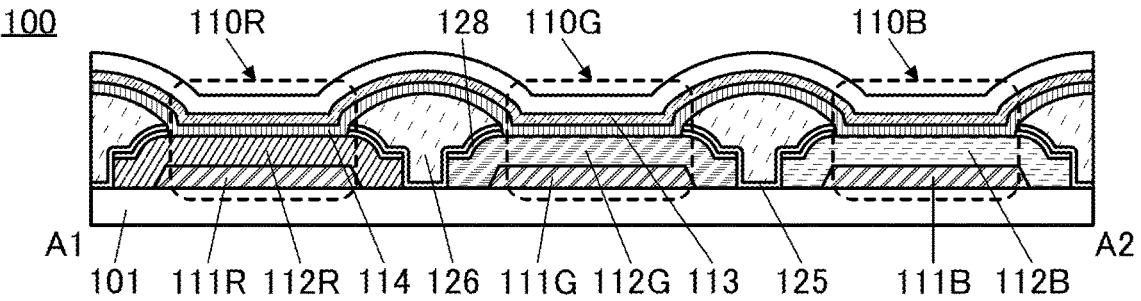
Figure 33C:
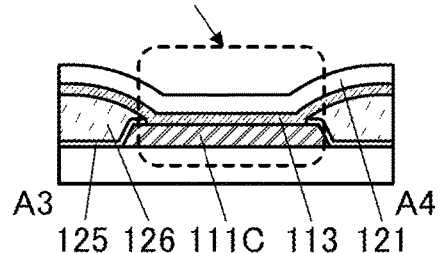

FIG. 33B and FIG. 33C are schematic cross-sectional views corresponding to the dashed-dotted line A1-A2 and the dashed-dotted line A3-A4 in FIG. 33A. FIG. 33B illustrates a schematic cross-sectional view of the light-emitting element 110R, the light-emitting element 110G, and the light-emitting element 110B, and FIG. 33C illustrates a schematic cross-sectional view of a connection portion 140 where the connection electrode 111C and the common electrode 113 are connected to each other.

The light-emitting element 110R includes a pixel electrode 111R, an organic layer 112R, a common layer 114, and the common electrode 113. The light-emitting element 110G includes a pixel electrode 111G, an organic layer 112G, the common layer 114, and the common electrode 113. The light-emitting element 110B includes a pixel electrode 111B, an organic layer 112B, the common layer 114, and the common electrode 113. The common layer 114 and the common electrode 113 are provided to be shared by the light-emitting element 110R, the light-emitting element 110G, and the light-emitting element 110B.

The organic layer 112R included in the light-emitting element 110R contains at least a light-emitting organic compound that emits red light. The organic layer 112G included in the light-emitting element 110G contains at least a light-emitting organic compound that emits green light. The organic layer 112B included in the light-emitting element 110B contains at least a light-emitting organic compound that emits blue light. Each of the organic layer 112R, the organic layer 112G, and the organic layer 112B can be also referred to as an EL layer and includes at least a layer containing a light-emitting organic compound (a light-emitting layer).

Hereinafter, the term "light-emitting element 110" is sometimes used to describe matters common to the light-emitting element 110R, the light-emitting element 110G, and the light-emitting element 110B. Similarly, in the description of matters common to components that are distinguished from each other using alphabets, such as the organic layer 112R, the organic layer 112G, and the organic layer 112B, reference numerals without alphabets are sometimes used.

The organic layer 112 and the common layer 114 can each independently include one or more of an electron-injection layer, an electron-transport layer, a hole-injection layer, and a hole-transport layer. For example, it is possible to employ a structure in which the organic layer 112 includes a stacked-layer structure of a hole-injection layer, a hole-transport layer, a light-emitting layer, and an electron-transport layer from the pixel electrode 111 side and the common layer 114 includes an electron-injection layer.

The pixel electrode 111R, the pixel electrode 111G, and the pixel electrode 111B are provided for the respective light-emitting elements. In addition, the common electrode 113 and the common layer 114 are each provided as a continuous layer shared by the light-emitting elements. A conductive film having a property of transmitting visible light is used for either the pixel electrodes or the common electrode 113, and a conductive film having a reflective property is used for the other. When the pixel electrodes have light-transmitting properties and the common electrode 113 has a reflective property, a bottom-emission display apparatus can be obtained. In contrast, when the pixel electrodes have reflective properties and the common electrode 113 has a light-transmitting property, a top-emission display apparatus can be obtained. Note that when both the pixel electrodes and the common electrode 113 have light-transmitting properties, a dual-emission display apparatus can be also obtained.

A protective layer 121 is provided over the common electrode 113 to cover the light-emitting element 110R, the light-emitting element 110G, and the light-emitting element 110B. The protective layer 121 has a function of preventing diffusion of impurities such as water into each light-emitting element from the above.

An end portion of the pixel electrode 111 preferably has a tapered shape. In the case where the end portion of the pixel electrode has a tapered shape, the organic layer 112 provided along a side surface of the pixel electrode also has a tapered shape. When the side surface of the pixel electrode has a tapered shape, coverage with the EL layer provided along the side surface of the pixel electrode can be improved. Furthermore, when the side surface of the pixel electrode has a tapered shape, a material (for example, also referred to as dust or particles) in a manufacturing step is easily removed by processing such as cleaning, which is preferable.

Note that in this specification and the like, a tapered shape indicates a shape in which at least part of a side surface of a structure is inclined to a substrate surface. For example, a tapered shape preferably includes a region where an angle formed between the inclined side surface and the substrate surface (such an angle is also referred to as a taper angle) is less than 90°.

The organic layer 112 is processed into an island shape by a photolithography method. Thus, an angle formed between a top surface and a side surface of an end portion of the organic layer 112 is approximately 90°. In contrast, an organic film formed using an FMM (Fine Metal Mask) or the like has a thickness that tends to gradually decrease with decreasing the distance from an end portion, and has a top surface forming a slope in an area extending in the range of greater than or equal to 1 μm and less than or equal to 10 μm up to the end portion, for example. Thus, such an organic film has a shape whose top surface and side surface are difficult to distinguish from each other.

An insulating layer 125, a resin layer 126, and a layer 128 are included between two adjacent light-emitting elements.

Between two adjacent light-emitting elements, side surfaces of the organic layers 112 are provided to face each other with the resin layer 126 therebetween. The resin layer 126 is positioned between the two adjacent light-emitting elements and is provided to fill end portions of the organic layers 112 and a region between the two organic layers 112. The top surface of the resin layer 126 has a smooth convex shape, and the common layer 114 and the common electrode 113 are provided to cover the top surface of the resin layer 126.

The resin layer 126 functions as a planarization film that fills a step positioned between two adjacent light-emitting elements. Providing the resin layer 126 can prevent a phenomenon in which the common electrode 113 is divided by a step at an end portion of the organic layer 112 (such a phenomenon is also referred to as disconnection) from occurring and the common electrode over the organic layer 112 from being insulated. The resin layer 126 can be also referred to as an LFP (Local Filling Planarization) layer.

An insulating layer containing an organic material can be suitably used as the resin layer 126. For the resin layer 126, an acrylic resin, a polyimide resin, an epoxy resin, an imide resin, a polyamide resin, a polyimide-amide resin, a silicone resin, a siloxane resin, a benzocyclobutene-based resin, a phenol resin, a precursor of these resins, or the like can be used, for example. For the resin layer 126, an organic material such as polyvinyl alcohol (PVA), polyvinylbutyral, polyvinylpyrrolidone, polyethylene glycol, polyglycerin, pullulan, water-soluble cellulose, or an alcohol-soluble polyamide resin may be used.

Alternatively, a photosensitive resin can be used for the resin layer 126. A photoresist may be used for the photosensitive resin. As the photosensitive resin, a positive photosensitive material or a negative photosensitive material can be used.

The resin layer 126 may contain a material absorbing visible light. For example, the resin layer 126 itself may be made of a material absorbing visible light, or the resin layer 126 may contain a pigment absorbing visible light. For example, for the resin layer 126, it is possible to use a resin that can be used as a color filter transmitting red, blue, or green light and absorbing other light, a resin that contains carbon black as a pigment and functions as a black matrix, or the like.

The insulating layer 125 is provided in contact with the side surfaces of the organic layers 112. In addition, the insulating layer 125 is provided to cover an upper end portion of the organic layer 112. Furthermore, part of the insulating layer 125 is provided in contact with a top surface of the substrate 101.

The insulating layer 125 is positioned between the resin layer 126 and the organic layer 112 and functions as a protective film for preventing contact between the resin layer 126 and the organic layer 112. When the organic layer 112 and the resin layer 126 are in contact with each other, the organic layer 112 might be dissolved by an organic solvent or the like used at the time of forming the resin layer 126. Therefore, the insulating layer 125 is provided between the organic layer 112 and the resin layer 126 as described in this embodiment to protect the side surfaces of the organic layer.

An insulating layer containing an inorganic material can be used for the insulating layer 125. For the insulating layer 125, an inorganic insulating film such as an oxide insulating film, a nitride insulating film, an oxynitride insulating film, or a nitride oxide insulating film can be used, for example. The insulating layer 125 may have either a single-layer structure or a stacked-layer structure. Examples of the oxide insulating film include a silicon oxide film, an aluminum oxide film, a magnesium oxide film, an indium gallium zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. In particular, when a metal oxide film such as an aluminum oxide film or a hafnium oxide film or an inorganic insulating film such as a silicon oxide film that is formed by an ALD method is employed for the insulating layer 125, it is possible to form the insulating layer 125 that has a small number of pinholes and has an excellent function of protecting the EL layer.

Note that in this specification and the like, oxynitride refers to a material that contains more oxygen than nitrogen in its composition, and nitride oxide refers to a material that contains more nitrogen than oxygen in its composition. For example, in the case where silicon oxynitride is described, it refers to a material that contains more oxygen than nitrogen in its composition. In the case where silicon nitride oxide is described, it refers to a material that contains more nitrogen than oxygen in its composition.

For the formation of the insulating layer 125, a sputtering method, a CVD method, a PLD method, an ALD method, or the like can be used. The insulating layer 125 is preferably formed by an ALD method achieving good coverage.

In addition, a structure may be employed in which a reflective film (e.g., a metal film containing one or more selected from silver, palladium, copper, titanium, aluminum, and the like) is provided between the insulating layer 125 and the resin layer 126 so that light emitted from the light-emitting layer is reflected by the reflective film. This can improve light extraction efficiency.

The layer 128 is a remaining part of a protective layer (also referred to as a mask layer or a sacrificial layer) for protecting the organic layer 112 during etching of the organic layer 112. For the layer 128, a material that can be used for the insulating layer 125 can be used. It is particularly preferable to use the same material for the layer 128 and the insulating layer 125 because an apparatus or the like for processing can be used in common.

In particular, since a metal oxide film such as an aluminum oxide film or a hafnium oxide film or an inorganic insulating film such as a silicon oxide film that is formed by an ALD method has a small number of pinholes, such a film has an excellent function of protecting the EL layer and can be suitably used for the insulating layer 125 and the layer 128.

The protective layer 121 is provided to cover the common electrode 113.

The protective layer 121 can have, for example, a single-layer structure or a stacked-layer structure including at least an inorganic insulating film. Examples of the inorganic insulating film include an oxide film and a nitride film, such as a silicon oxide film, a silicon oxynitride film, a silicon nitride oxide film, a silicon nitride film, an aluminum oxide film, an aluminum oxynitride film, and a hafnium oxide film. Alternatively, a semiconductor material or a conductive material such as indium gallium oxide, indium zinc oxide, indium tin oxide, or indium gallium zinc oxide may be used for the protective layer 121.

For the protective layer 121, a stacked film of an inorganic insulating film and an organic insulating film can be used. For example, a structure in which an organic insulating film is sandwiched between a pair of inorganic insulating films is preferable. Furthermore, the organic insulating film preferably functions as a planarization film. This enables a top surface of the organic insulating film to be flat, which results in improved coverage with the inorganic insulating film thereover and a higher barrier property. Moreover, the top surface of the protective layer 121 is flat; therefore, when a structural object (e.g., a color filter, an electrode of a touch sensor, a lens array, or the like) is provided above the protective layer 121, the structural object can be less affected by an uneven shape caused by a lower structure.

FIG. 33C illustrates the connection portion 140 in which the connection electrode 111C and the common electrode 113 are electrically connected to each other. In the connection portion 140, an opening portion is provided in the insulating layer 125 and the resin layer 126 over the connection electrode 111C. The connection electrode 111C and the common electrode 113 are electrically connected to each other in the opening portion.

Note that although FIG. 33C illustrates the connection portion 140 in which the connection electrode 111C and the common electrode 113 are electrically connected to each other, the common electrode 113 may be provided over the connection electrode 111C with the common layer 114 therebetween. Particularly in the case where a carrier-injection layer is used as the common layer 114, for example, a material used for the common layer 114 has sufficiently low electrical resistivity and the common layer 114 can be formed to be thin. Thus, problems do not arise in many cases even when the common layer 114 is positioned in the connection portion 140. Accordingly, the common electrode 113 and the common layer 114 can be formed using the same shielding mask, so that manufacturing cost can be reduced.

The above is the description of the structure example of the display apparatus.

[Pixel Layout]

Pixel layout different from that in FIG. 33A will be mainly described below. There is no particular limitation on the arrangement of light-emitting elements (subpixels), and a variety of methods can be employed.

In addition, examples of the shape of the subpixel in a plan view include polygons such as a triangle, a tetragon (including a rectangle and a square), and a pentagon; polygons with rounded corners; an ellipse; and a circle. Here, the shape of the subpixel corresponds to the shape of a light-emitting region of the light-emitting element.

Figures 34A, 34B, 34C, 34D, 34E, 34F:
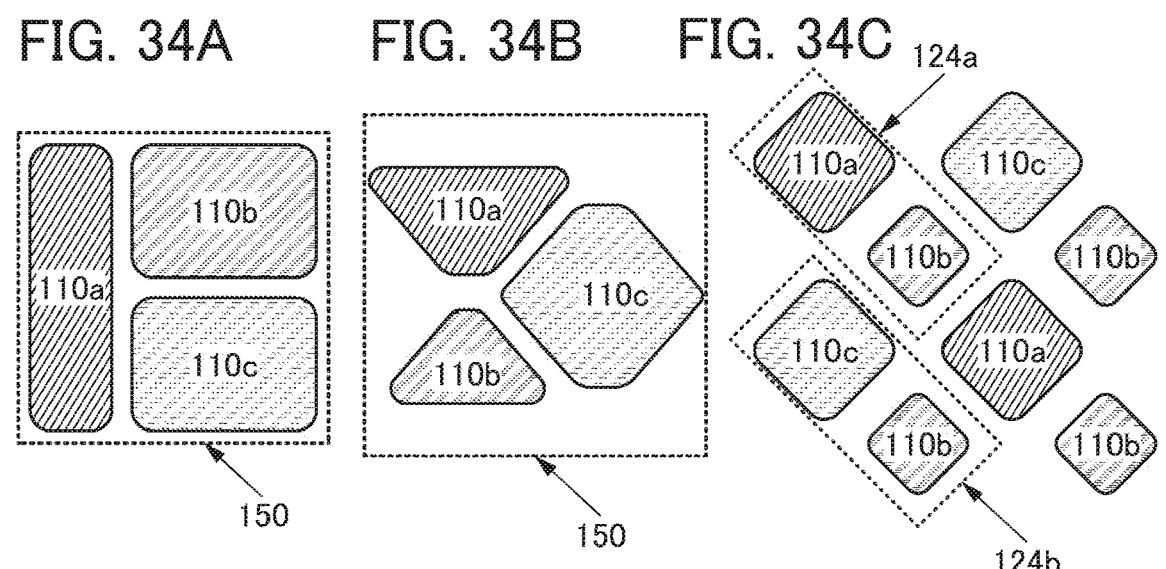
FIG. 34A to FIG. 34F are diagrams illustrating structure examples of a pixel.

A pixel 150 illustrated in FIG. 34A employs an S-stripe arrangement. The pixel 150 illustrated in FIG. 34A is composed of three subpixels: light-emitting elements 110a, 110b, and 110c. For example, the light-emitting element 110a may be a blue-light-emitting element, the light-emitting element 110b may be a red-light-emitting element, and the light-emitting element 110c may be a green-light-emitting element.

The pixel 150 illustrated in FIG. 34B includes the light-emitting element 110a having a rough trapezoidal shape with rounded corners, the light-emitting element 110b having a rough triangle shape with rounded corners, and the light-emitting element 110c having a rough tetragonal or rough hexagonal shape with rounded corners in a plan view. In addition, the light-emitting element 110a has a larger light-emitting area than the light-emitting element 110b. In this manner, the shapes and sizes of the light-emitting elements can be determined independently. For example, the size of a light-emitting element with higher reliability can be made smaller. For example, the light-emitting element 110a may be a green-light-emitting element, the light-emitting element 110b may be a red-light-emitting element, and the light-emitting element 110c may be a blue-light-emitting element.

Pixels 124a and 124b illustrated in FIG. 34C employ a PenTile arrangement. FIG. 34C illustrates an example in which the pixels 124a each including the light-emitting element 110a and the light-emitting element 110b and the pixels 124b each including the light-emitting element 110b and the light-emitting element 110c are alternately arranged. For example, the light-emitting element 110a may be a red-light-emitting element, the light-emitting element 110b may be a green-light-emitting element, and the light-emitting element 110c may be a blue-light-emitting element.

The pixels 124a and 124b illustrated in FIG. 34D and FIG. 34E employ a delta arrangement. The pixel 124a includes two light-emitting elements (the light-emitting elements 110a and 110b) in an upper row (a first row) and one light-emitting element (the light-emitting element 110c) in a lower row (a second row). The pixel 124b includes one light-emitting element (the light-emitting element 110c) in the upper row (the first row) and two light-emitting elements (the light-emitting elements 110a and 110b) in the lower row (the second row). For example, the light-emitting element 110a may be a red-light-emitting element, the light-emitting element 110b may be a green-light-emitting element, and the light-emitting element 110c may be a blue-light-emitting element.

FIG. 34D illustrates an example in which each light-emitting element has a rough tetragonal shape with rounded corners in a plan view, and FIG. 34E illustrates an example in which each light-emitting element is circular.

FIG. 34F illustrates an example in which light-emitting elements of different colors are arranged in a zigzag manner. Specifically, the positions of top sides of two light-emitting elements arranged in a column direction (e.g., the light-emitting element 110a and the light-emitting element 110b or the light-emitting element 110b and the light-emitting element 110c) are not aligned in a top view. For example, the light-emitting element 110a may be a red-light-emitting element, the light-emitting element 110b may be a green-light-emitting element, and the light-emitting element 110c may be a blue-light-emitting element.

In a photolithography method, as a pattern to be processed becomes finer, the influence of light diffraction becomes more difficult to ignore; accordingly, fidelity in transferring a photomask pattern by light exposure is degraded, and it becomes difficult to process a resist mask into a desired shape. Thus, a pattern with rounded corners is likely to be formed even with a rectangular photomask pattern. Consequently, a light-emitting element sometimes has a polygonal shape with rounded corners, an elliptical shape, a circular shape, or the like in a plan view.

Furthermore, in a method for manufacturing a display panel according to one embodiment of the present invention, the EL layer is processed into an island shape with the use of a resist mask. A resist film formed over the EL layer needs to be cured at a temperature lower than the upper temperature limit of the EL layer. Thus, the resist film is insufficiently cured in some cases depending on the upper temperature limit of the material of the EL layer and the curing temperature of a resist material. An insufficiently cured resist film might have a shape different from a desired shape at the time of processing. As a result, the EL layer sometimes has a polygonal shape with rounded corners, an elliptical shape, a circular shape, or the like in a plan view. For example, when a resist mask with a square shape in a plan view is intended to be formed, a resist mask with a circular shape might be formed, and the EL layer might be circular in the plan view.

Note that to obtain a desired shape of the EL layer in a plan view, a technique of correcting a mask pattern in advance so that a transferred pattern agrees with a design pattern (an OPC (Optical Proximity Correction) technique) may be used. Specifically, with the OPC technique, a pattern for correction is added to a corner portion or the like of a figure on a mask pattern.

The above is the description of the pixel layout.

At least part of this embodiment can be implemented in appropriate combination with the other embodiments described in this specification.

Embodiment 4

In this embodiment, other structure examples of a display apparatus (display panel) that can be used for the electronic device of one embodiment of the present invention are described Display apparatuses (display panels) described below as examples can be used as the display apparatus 511, the display apparatus 521, and the like in Embodiment 1.

Display apparatuses in this embodiment can be high-definition display apparatuses. For example, display apparatuses according to one embodiment of the present invention can be used for display portions of information terminal devices (wearable devices) such as wristwatch-type and bracelet-type information terminal devices and display portions of wearable devices that can be worn on a head, such as VR devices like head-mounted displays and glasses-type AR devices.

[Display Module]

Figure 35A:
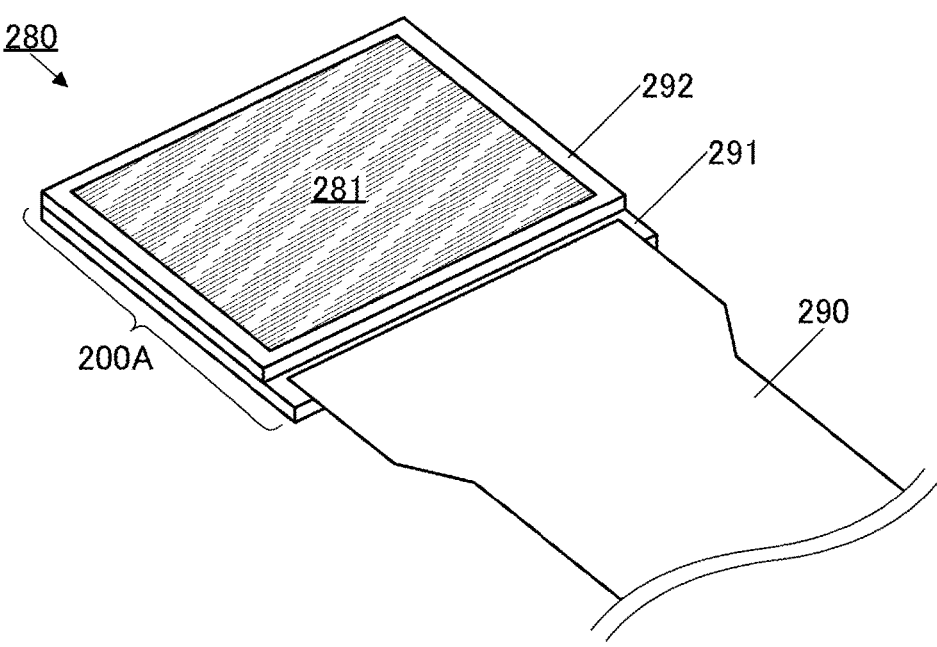
FIG. 35A and FIG. 35B are diagrams illustrating a structure example of a display apparatus.

FIG. 35A is a perspective view of a display module 280. The display module 280 includes a display apparatus 200A and an FPC 290. Note that a display panel included in the display module 280 is not limited to the display apparatus 200A and may be any of a display apparatus 200B to a display apparatus 200F described later.

The display module 280 includes a substrate 291 and a substrate 292. The display module 280 includes a display portion 281. The display portion 281 is a region where an image is displayed.

Figure 35B:
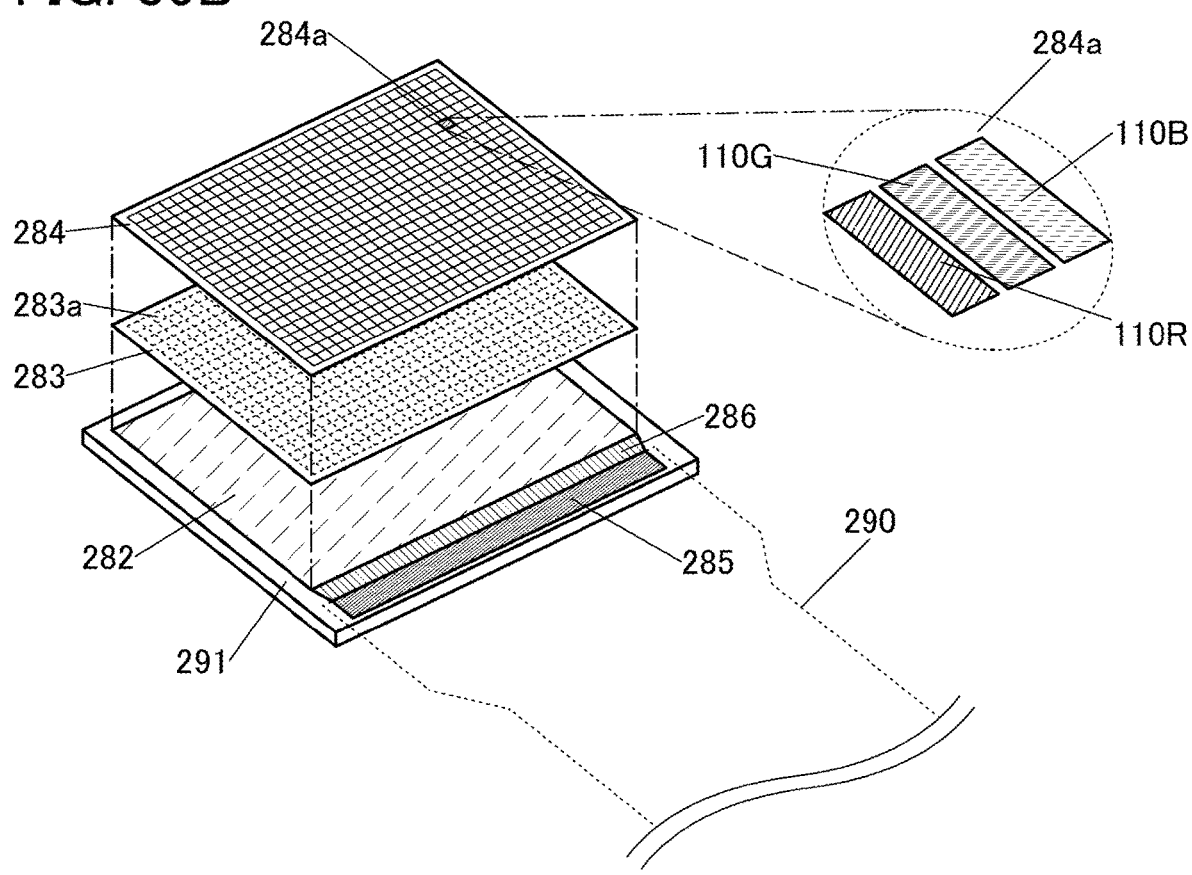

FIG. 35B is a perspective view schematically illustrating a structure on the substrate 291 side. Over the substrate 291, a circuit portion 282, a pixel circuit portion 283 over the circuit portion 282, and a pixel portion 284 over the pixel circuit portion 283 are stacked. In addition, a terminal portion 285 to be connected to the FPC 290 is provided in a portion over the substrate 291 that is not overlapped with the pixel portion 284. The terminal portion 285 and the circuit portion 282 are electrically connected to each other through a wiring portion 286 formed of a plurality of wirings.

The pixel portion 284 includes a plurality of pixels 284a arranged periodically. An enlarged view of one pixel 284a is illustrated on the right side in FIG. 35B. The pixel 284a includes the light-emitting element 110R that emits red light, the light-emitting element 110G that emits green light, and the light-emitting element 110B that emits blue light.

The pixel circuit portion 283 includes a plurality of pixel circuits 283a arranged periodically. One pixel circuit 283a is a circuit for controlling light emission of three light-emitting devices included in one pixel 284a. One pixel circuit 283a may be provided with three circuits for controlling light emission of one light-emitting device. For example, the pixel circuit 283a can include at least one selection transistor, one current control transistor (driving transistor), and a capacitor for one light-emitting device. In that case, a gate signal is input to a gate of the selection transistor, and a source signal is input to a source of the selection transistor. Thus, an active-matrix display panel is achieved.

The circuit portion 282 includes a circuit for driving the pixel circuits 283a in the pixel circuit portion 283. For example, the circuit portion 282 preferably includes one or both of a gate line driver circuit and a source line driver circuit. The circuit portion 282 may further include at least one of an arithmetic circuit, a memory circuit, a power supply circuit, and the like. In addition, a transistor provided in the circuit portion 282 may constitute part of the pixel circuit 283a. That is, the pixel circuit 283a may be constituted by a transistor included in the pixel circuit portion 283 and a transistor included in the circuit portion 282.

The FPC 290 functions as a wiring for supplying a video signal, a power supply potential, and the like to the circuit portion 282 from the outside. In addition, an IC may be mounted on the FPC 290.

The display module 280 can have a structure in which one or both of the pixel circuit portion 283 and the circuit portion 282 are provided to be stacked below the pixel portion 284; thus, the aperture ratio (effective display area ratio) of the display portion 281 can be significantly high. For example, the aperture ratio of the display portion 281 can be greater than or equal to 40% and less than 100%, preferably greater than or equal to 50% and less than or equal to 95%, further preferably greater than or equal to 60% and less than or equal to 95%. Furthermore, the pixels 284a can be arranged extremely densely and thus the display portion 281 can have extremely high definition. For example, the pixels 284a are preferably arranged in the display portion 281 with a definition higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi.

Such a display module 280 has extremely high definition, and thus can be suitably used for a VR device such as a head-mounted display or a glasses-type AR device. For example, even in the case of a structure in which the display portion of the display module 280 is seen through a lens, pixels of the extremely-high-definition display portion 281 included in the display module 280 are not seen even when the display portion is enlarged by the lens, so that display providing a high sense of immersion can be performed. Without being limited thereto, the display module 280 can be also suitably used for an electronic device having a comparatively small display portion. For example, the display module 280 can be suitably used for a display portion of a wearable electronic device, such as a wristwatch.

[Display Apparatus 200A]

Figure 36:
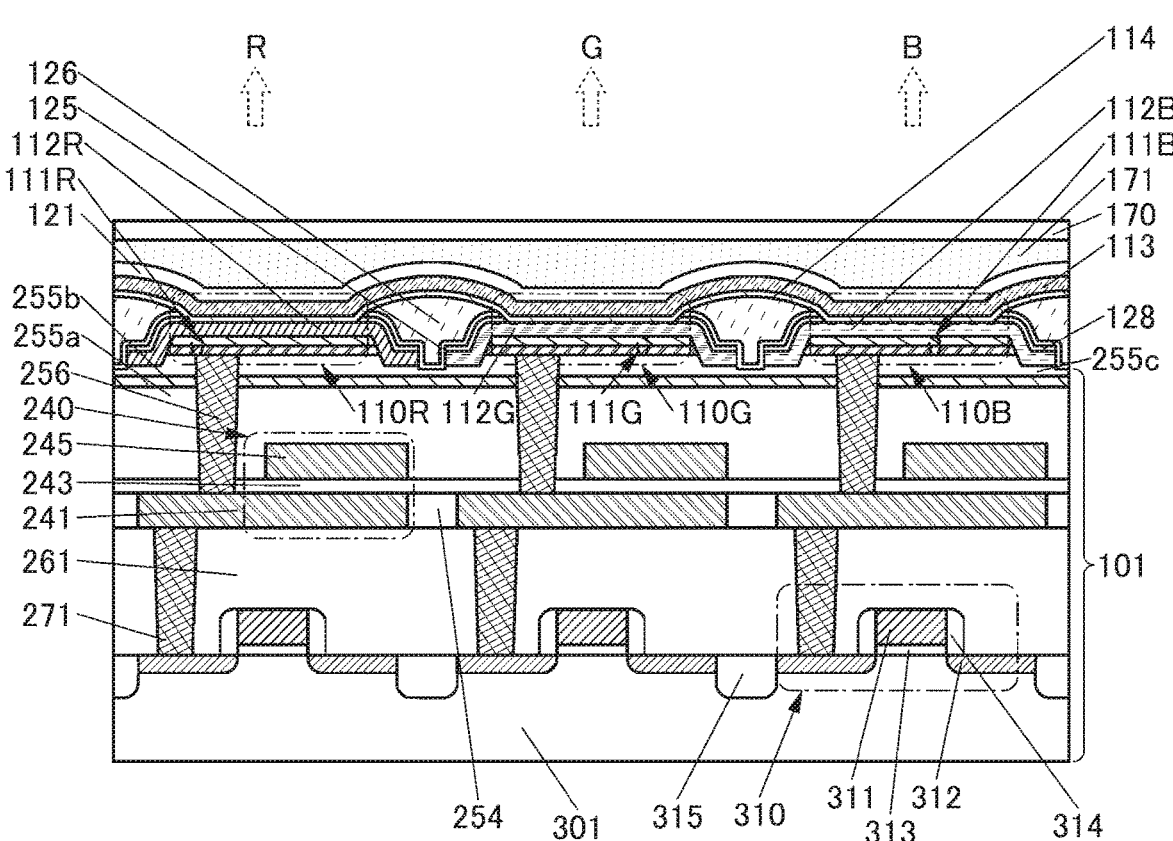
FIG. 36 is a diagram illustrating a structure example of a display apparatus.

The display apparatus 200A illustrated in FIG. 36A includes a substrate 301, the light-emitting elements 110R, 110G, and 110B, capacitors 240, and transistors 310.

The substrate 301 corresponds to the substrate 291 in FIG. 35A and FIG. 35B.

The transistor 310 is a transistor that includes a channel formation region in the substrate 301. As the substrate 301, a semiconductor substrate such as a single crystal silicon substrate can be used, for example. The transistor 310 includes part of the substrate 301, a conductive layer 311, low-resistance regions 312, an insulating layer 313, and insulating layers 314. The conductive layer 311 functions as a gate electrode. The insulating layer 313 is positioned between the substrate 301 and the conductive layer 311 and functions as a gate insulating layer. The low-resistance region 312 is a region where the substrate 301 is doped with an impurity, and functions as one of a source and a drain. The insulating layers 314 are provided to cover side surfaces of the conductive layer 311.

In addition, an element isolation layer 315 is provided between two adjacent transistors 310 to be embedded in the substrate 301.

Furthermore, an insulating layer 261 is provided to cover the transistors 310, and the capacitors 240 are provided over the insulating layer 261.

The capacitor 240 includes a conductive layer 241, a conductive layer 245, and an insulating layer 243 positioned therebetween. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapped with the conductive layer 241 with the insulating layer 243 therebetween.

An insulating layer 255a is provided to cover the capacitor 240. An insulating layer 255b is provided over the insulating layer 255a. An insulating layer 255c is provided over the insulating layer 255b.

An inorganic insulating film can be suitably used for each of the insulating layer 255a, the insulating layer 255b, and the insulating layer 255c. For example, it is preferable that a silicon oxide film be used for each of the insulating layer 255a and the insulating layer 255c and that a silicon nitride film be used for the insulating layer 255b. This enables the insulating layer 255b to function as an etching protective film. Although this embodiment shows an example in which the insulating layer 255c is partly etched and a concave portion is formed, the concave portion is not necessarily provided in the insulating layer 255c.

The light-emitting element 110R, the light-emitting element 110G, and the light-emitting element 110B are provided over the insulating layer 255c. Embodiment 1 can be referred to for the structures of the light-emitting element 110R, the light-emitting element 110G, and the light-emitting element 110B.

In the display apparatus 200A, since the light-emitting devices of different colors are separately formed, a change in chromaticity between light emission at low luminance and light emission at high luminance is small. Furthermore, since the organic layers 112R, 112G, and 112B are separated from each other, crosstalk generated between adjacent subpixels can be inhibited while the display panel has high definition. It is thus possible to achieve a display apparatus that has high definition and high display quality.

In a region between adjacent light-emitting elements, the insulating layer 125, the resin layer 126, and the layer 128 are provided.

The pixel electrode 111R, the pixel electrode 111G, and the pixel electrode 111B of the light-emitting elements are each electrically connected to one of the source and the drain of the transistor 310 through a plug 256 that is embedded in the insulating layer 255a, the insulating layer 255b, and the insulating layer 255c, the conductive layer 241 that is embedded in the insulating layer 254, and the plug 271 that is embedded in the insulating layer 261. The top surface of the insulating layer 255c and the top surface of the plug 256 are level with or substantially level with each other. A variety of conductive materials can be used for the plugs.

In addition, the protective layer 121 is provided over the light-emitting elements 110R, 110G, and 110B. A substrate 170 is attached onto the protective layer 121 with an adhesive layer 171.

An insulating layer covering an end portion of the top surface of the pixel electrode 111 is not provided between two adjacent pixel electrodes 111. Thus, the distance between adjacent light-emitting elements can be extremely narrowed. Accordingly, the display apparatus can have high definition or high resolution.

[Display Apparatus 200B]

Figure 37:
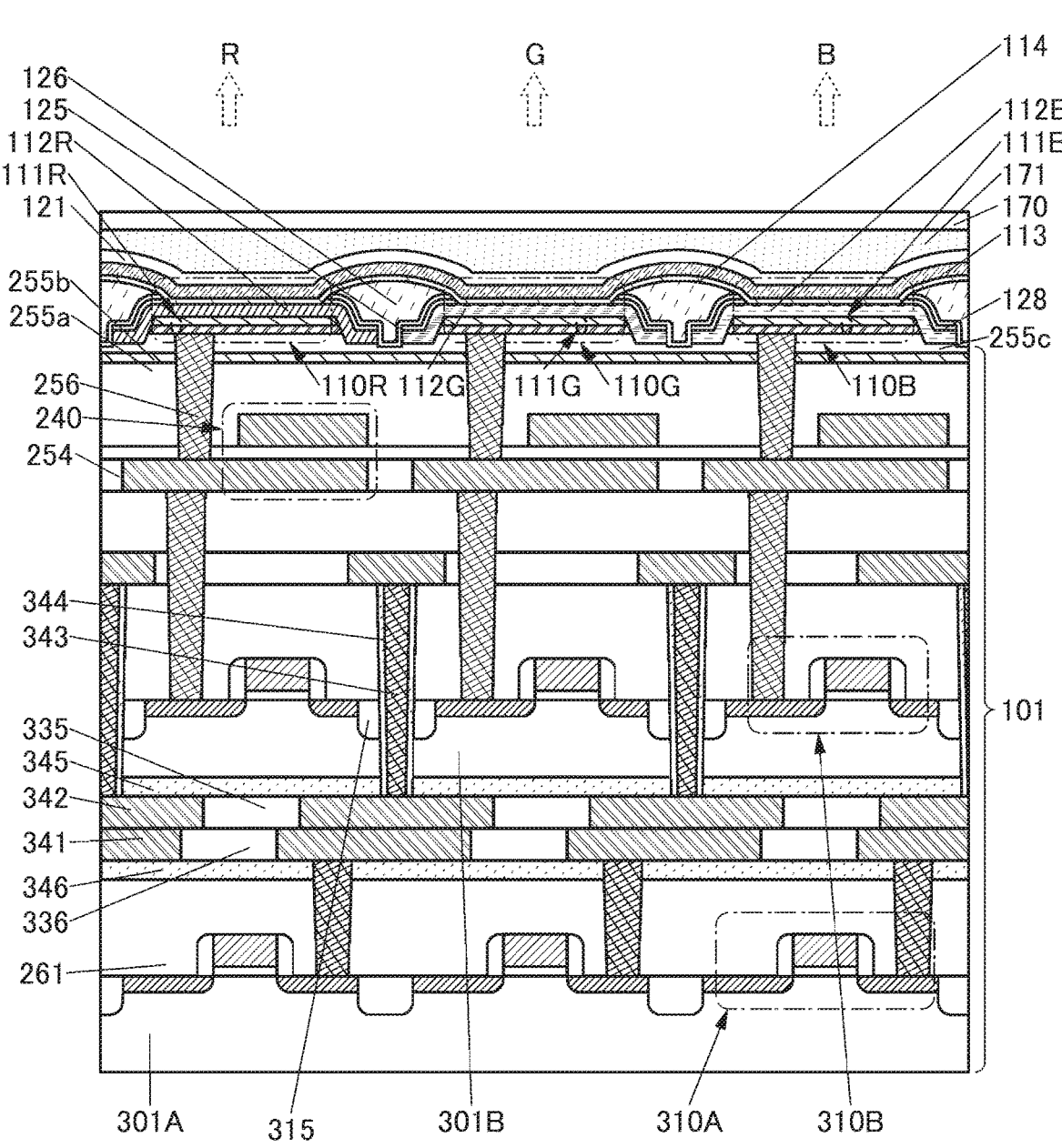
FIG. 37 is a diagram illustrating a structure example of a display apparatus.

The display apparatus 200B illustrated in FIG. 37 has a structure where transistors 310A and transistors 310B in each of which a channel is formed in a semiconductor substrate are stacked. Note that in the following description of the display panel, the description of portions similar to those of the above display panel is omitted in some cases.

The display apparatus 200B has a structure where a substrate 301B provided with the transistors 310B, the capacitors 240, and the light-emitting devices is attached to a substrate 301A provided with the transistors 310A.

Here, an insulating layer 345 is provided on a bottom surface of the substrate 301B, and an insulating layer 346 is provided over the insulating layer 261 provided over the substrate 301A. The insulating layers 345 and 346 are insulating layers functioning as protective layers and can inhibit diffusion of impurities into the substrate 301B and the substrate 301A. For the insulating layers 345 and 346, an inorganic insulating film that can be used for the protective layer 121 or an insulating layer 332 can be used.

The substrate 301B is provided with plugs 343 that penetrate the substrate 301B and the insulating layer 345. Here, insulating layers 344 each functioning as a protective layer are preferably provided to cover side surfaces of the plugs 343.

In addition, a conductive layer 342 is provided under the insulating layer 345 on the substrate 301B. The conductive layer 342 is embedded in an insulating layer 335, and bottom surfaces of the conductive layer 342 and the insulating layer 335 are planarized. Furthermore, the conductive layer 342 is electrically connected to the plug 343.

In contrast, a conductive layer 341 is provided over the insulating layer 346 over the substrate 301A. The conductive layer 341 is embedded in an insulating layer 336, and the top surfaces of the conductive layer 341 and the insulating layer 336 are planarized.

The same conductive material is preferably used for the conductive layer 341 and the conductive layer 342. A metal film containing an element selected from Al, Cr, Cu, Ta, Ti, Mo, and W, a metal nitride film containing the above element as a component (a titanium nitride film, a molybdenum nitride film, or a tungsten nitride film), or the like can be used, for example. Copper is particularly preferably used for the conductive layer 341 and the conductive layer 342. Accordingly, it is possible to employ a Cu-to-Cu (copper-to-copper) direct bonding technique (a technique for achieving electrical continuity by connecting Cu (copper) pads to each other).

[Display Apparatus 200C]

Figure 38:
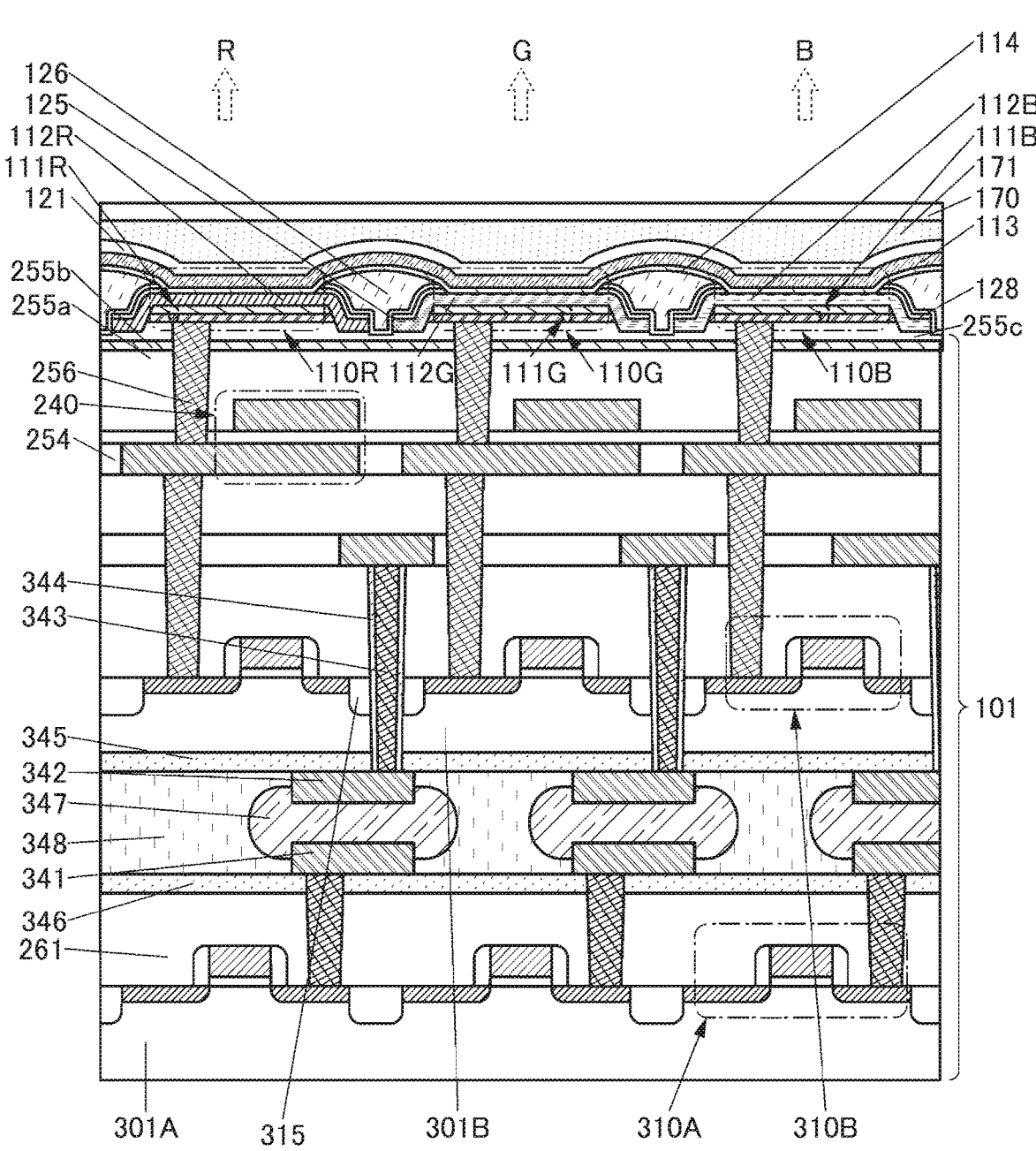
FIG. 38 is a diagram illustrating a structure example of a display apparatus.

The display apparatus 200C illustrated in FIG. 38 has a structure where the conductive layer 341 and the conductive layer 342 are bonded to each other with a bump 347.

As illustrated in FIG. 38, providing the bump 347 between the conductive layer 341 and the conductive layer 342 enables the conductive layer 341 and the conductive layer 342 to be electrically connected to each other. The bump 347 can be formed using a conductive material containing gold (Au), nickel (Ni), indium (In), tin (Sn), or the like, for example. As another example, solder is used for the bump 347 in some cases. In addition, an adhesive layer 348 may be provided between the insulating layer 345 and the insulating layer 346. Furthermore, in the case where the bump 347 is provided, a structure without the insulating layer 335 and the insulating layer 336 may be employed.

[Display Apparatus 200D]

Figure 39:
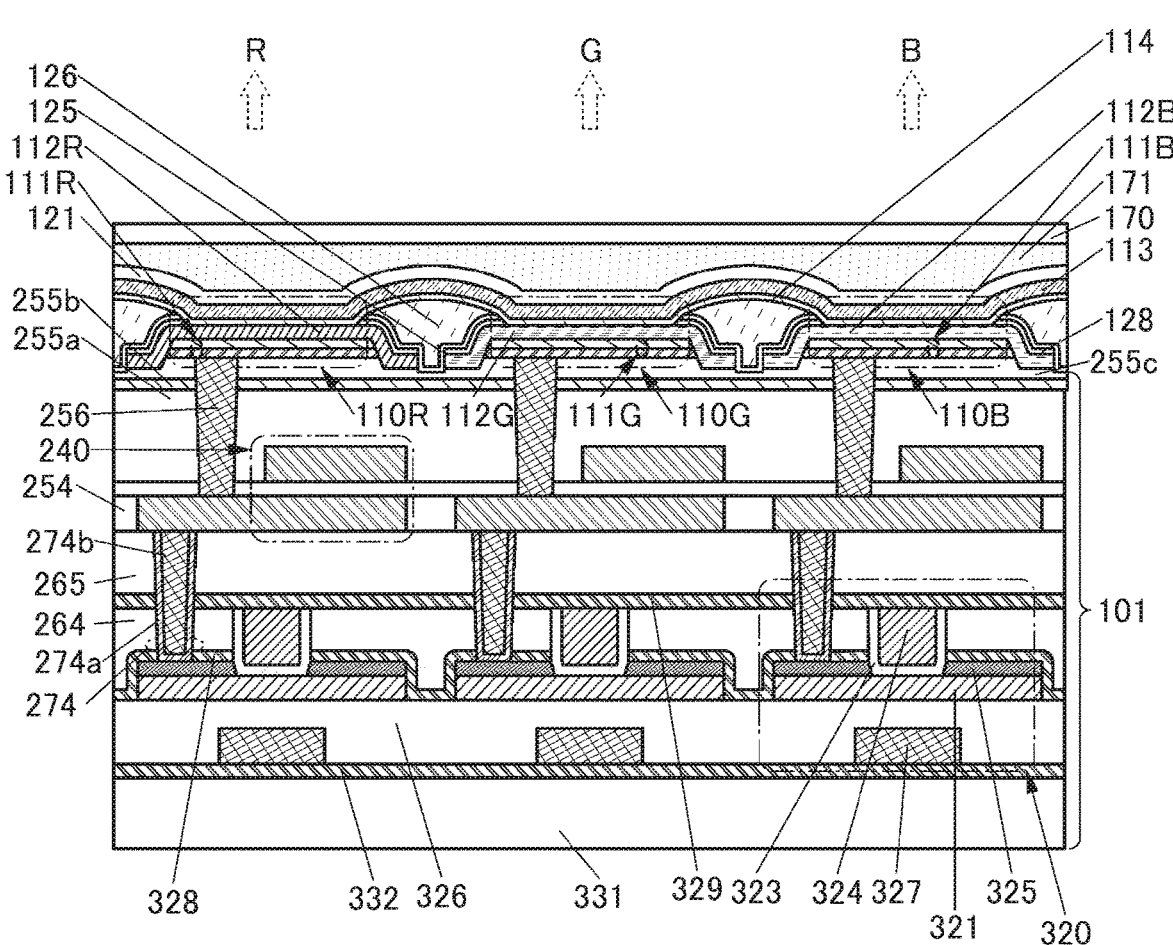
FIG. 39 is a diagram illustrating a structure example of a display apparatus.

The display apparatus 200D illustrated in FIG. 39 differs from the display apparatus 200A mainly in a transistor structure.

A transistor 320 is a transistor (an OS transistor) in which a metal oxide (also referred to as an oxide semiconductor) is employed in a semiconductor layer where a channel is formed.

The transistor 320 includes a semiconductor layer 321, an insulating layer 323, a conductive layer 324, a pair of conductive layers 325, an insulating layer 326, and a conductive layer 327.

A substrate 331 corresponds to the substrate 291 in FIG. 35A and FIG. 35B.

The insulating layer 332 is provided over the substrate 331. The insulating layer 332 functions as a barrier layer that prevents diffusion of impurities such as water or hydrogen from the substrate 331 into the transistor 320 and release of oxygen from the semiconductor layer 321 to the insulating layer 332 side. As the insulating layer 332, for example, a film in which hydrogen or oxygen is less likely to diffuse than in a silicon oxide film, such as an aluminum oxide film, a hafnium oxide film, or a silicon nitride film, can be used.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used for at least part of the insulating layer 326 that is in contact with the semiconductor layer 321. The top surface of the insulating layer 326 is preferably planarized.

The semiconductor layer 321 is provided over the insulating layer 326. The semiconductor layer 321 preferably includes a metal oxide (also referred to as an oxide semiconductor) film exhibiting semiconductor characteristics. The pair of conductive layers 325 is provided on and in contact with the semiconductor layer 321, and functions as a source electrode and a drain electrode.

An insulating layer 328 is provided to cover the top surfaces and side surfaces of the pair of conductive layers 325, side surfaces of the semiconductor layer 321, and the like, and an insulating layer 264 is provided over the insulating layer 328. The insulating layer 328 functions as a barrier layer that prevents diffusion of impurities such as water or hydrogen from the insulating layer 264 or the like into the semiconductor layer 321 and release of oxygen from the semiconductor layer 321. For the insulating layer 328, an insulating film similar to the insulating layer 332 can be used.

An opening reaching the semiconductor layer 321 is provided in the insulating layer 328 and the insulating layer 264. The conductive layer 324 and the insulating layer 323 that is in contact with the top surface of the semiconductor layer 321 are embedded in the opening. The conductive layer 324 functions as a second gate electrode, and the insulating layer 323 functions as a second gate insulating layer.

The top surface of the conductive layer 324, the top surface of the insulating layer 323, and the top surface of the insulating layer 264 are subjected to planarization treatment so that they are level with or substantially level with each other, and an insulating layer 329 and an insulating layer 265 are provided to cover these layers.

The insulating layer 264 and the insulating layer 265 each function as an interlayer insulating layer. The insulating layer 329 functions as a barrier layer that prevents diffusion of impurities such as water or hydrogen from the insulating layer 265 or the like to the transistor 320. For the insulating layer 329, an insulating film similar to the insulating layer 328 and the insulating layer 332 can be used.

A plug 274 electrically connected to one of the pair of conductive layers 325 is provided to be embedded in the insulating layer 265, the insulating layer 329, and the insulating layer 264. Here, the plug 274 preferably includes a conductive layer 274a that covers side surfaces of openings in the insulating layer 265, the insulating layer 329, the insulating layer 264, and the insulating layer 328 and part of the top surface of the conductive layer 325, and a conductive layer 274b in contact with the top surface of the conductive layer 274a. In that case, a conductive material in which hydrogen and oxygen are less likely to diffuse is preferably used for the conductive layer 274a.

[Display Apparatus 200E]

Figure 40:
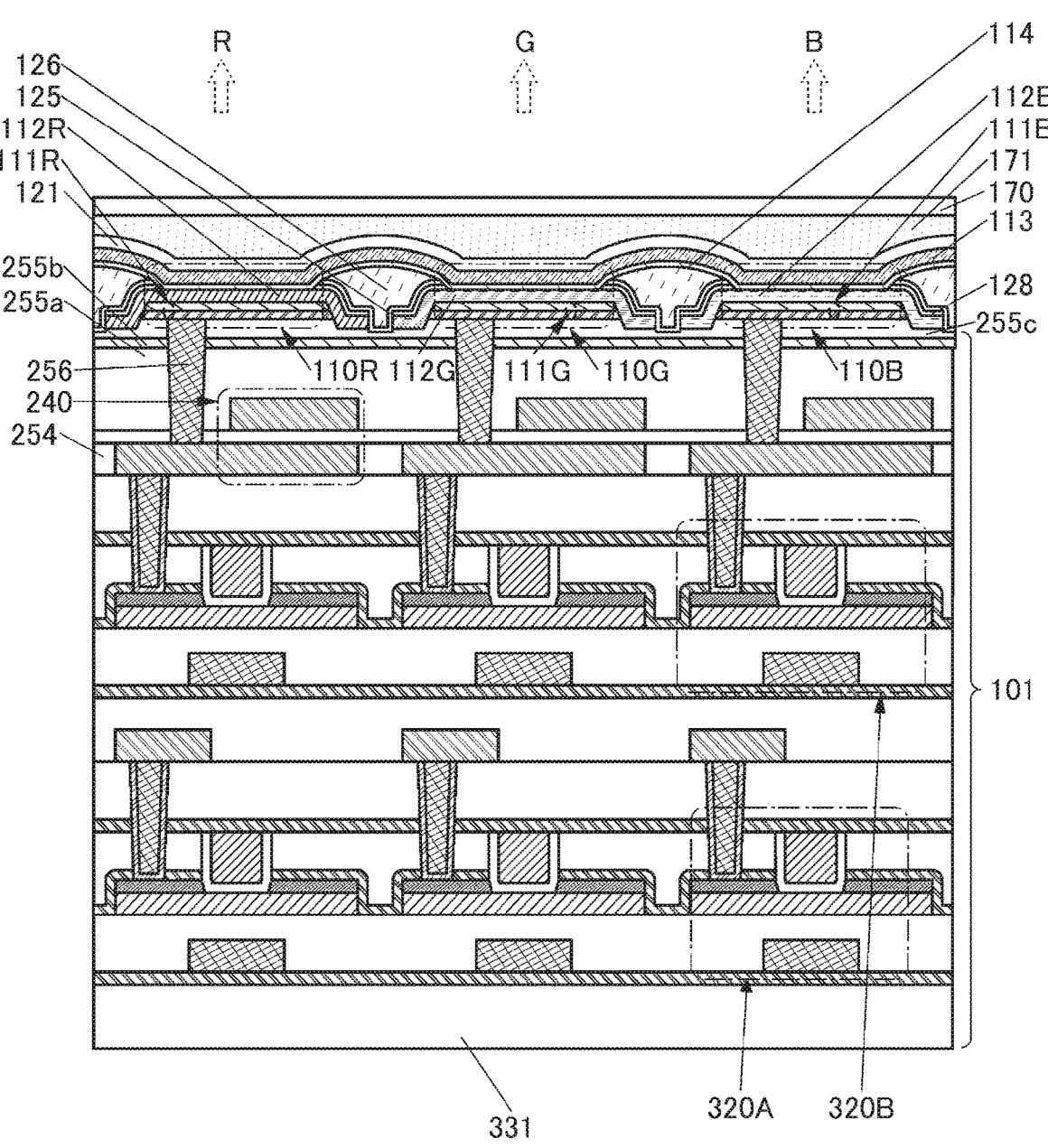
FIG. 40 is a diagram illustrating a structure example of a display apparatus.

The display apparatus 200E illustrated in FIG. 40 has a structure in which a transistor 320A and a transistor 320B each including an oxide semiconductor in a semiconductor where a channel is formed are stacked.

The display apparatus 200D described above can be referred to for the transistor 320A, the transistor 320B, and other peripheral structures.

Note that although the structure in which two transistors including an oxide semiconductor are stacked is described here, the present invention is not limited thereto. For example, a structure may be employed in which three or more transistors are stacked.

[Display Apparatus 200F]

Figure 41:
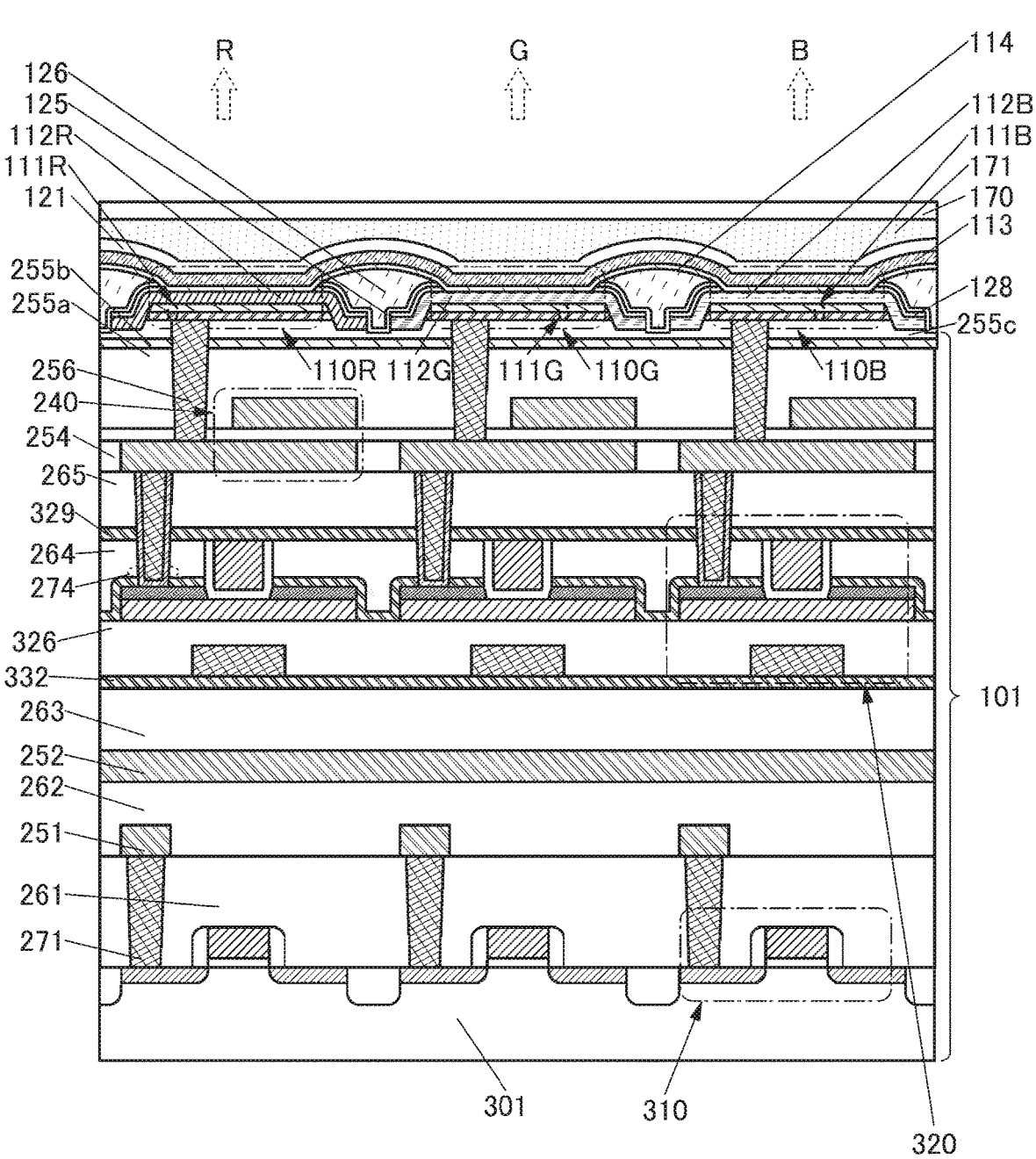
FIG. 41 is a diagram illustrating a structure example of a display apparatus.

The display apparatus 200F illustrated in FIG. 41 has a structure in which the transistor 310 whose channel is formed in the substrate 301 and the transistor 320 including a metal oxide in the semiconductor layer where the channel is formed are stacked.

The insulating layer 261 is provided to cover the transistor 310, and a conductive layer 251 is provided over the insulating layer 261. In addition, an insulating layer 262 is provided to cover the conductive layer 251, and a conductive layer 252 is provided over the insulating layer 262. The conductive layer 251 and the conductive layer 252 each function as a wiring. Furthermore, an insulating layer 263 and the insulating layer 332 are provided to cover the conductive layer 252, and the transistor 320 is provided over the insulating layer 332. Moreover, the insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in a pixel circuit. In addition, the transistor 310 can be used as a transistor included in a pixel circuit or a transistor included in a driver circuit (a gate line driver circuit or a source line driver circuit) for driving the pixel circuit. Furthermore, the transistor 310 and the transistor 320 can be used as transistors included in a variety of circuits such as an arithmetic circuit or a memory circuit.

With such a structure, not only the pixel circuit but also the driver circuit and the like can be formed directly under the light-emitting devices; thus, the display panel can be downsized as compared with the case where the driver circuit is provided around a display region.

[Display Apparatus 200G]

Figure 42:
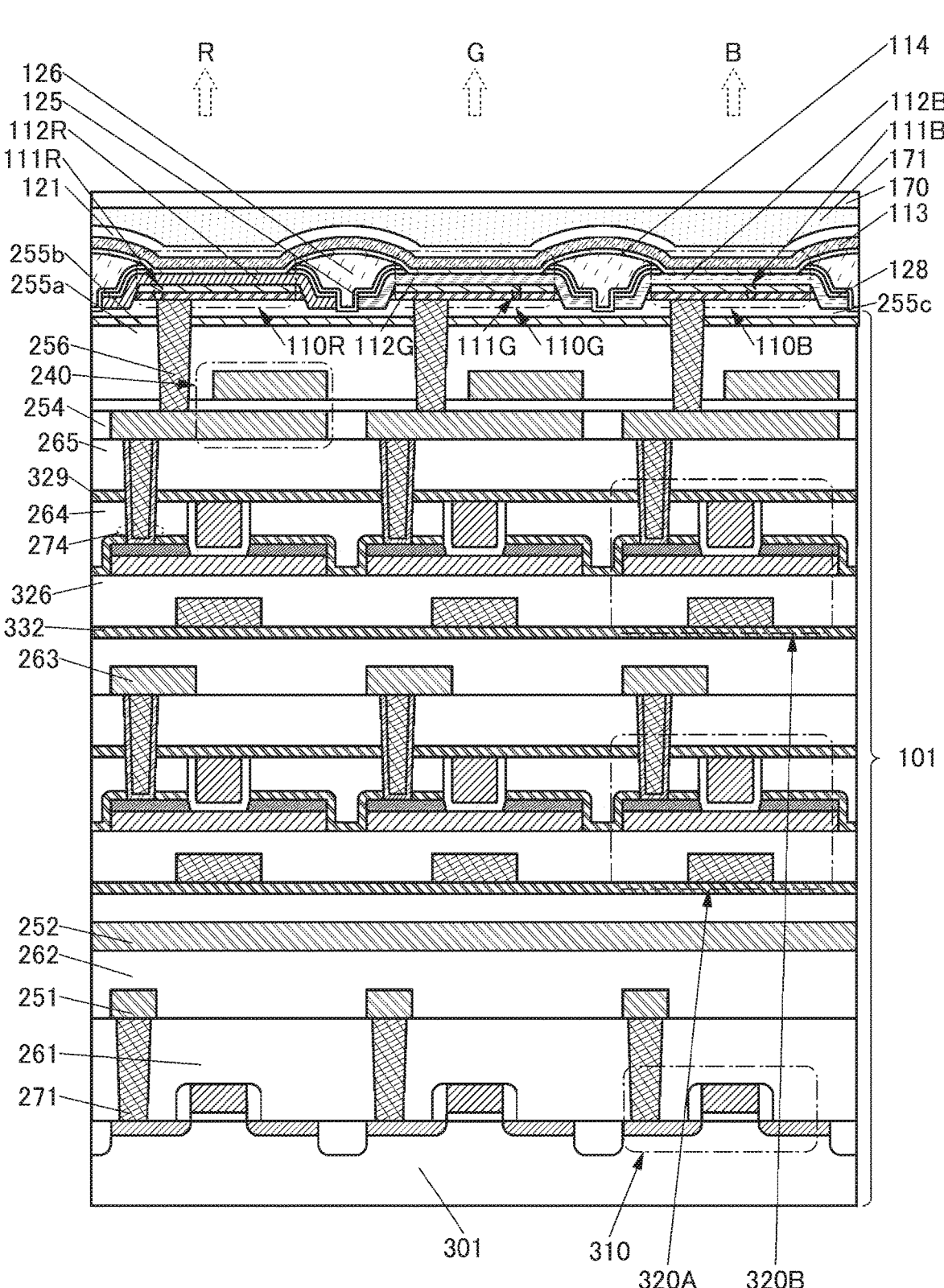
FIG. 42 is a diagram illustrating a structure example of a display apparatus.

A display apparatus 200G illustrated in FIG. 42 has a structure in which the transistor 310 whose channel is formed in the substrate 301, the transistor 320A including a metal oxide in the semiconductor layer where the channel is formed, and the transistor 320B are stacked.

The transistor 320A can be used as a transistor included in the pixel circuit. The transistor 310 can be used as a transistor included in the pixel circuit or a transistor included in a driver circuit (a gate line driver circuit or a source line driver circuit) for driving the pixel circuit. The transistor 320B may be used as a transistor included in the pixel circuit or a transistor included in the driver circuit. The transistor 310, the transistor 320A, and the transistor 320B can also be used as transistors included in a variety of circuits such as an arithmetic circuit and a storage circuit.

At least part of this embodiment can be implemented in combination with the other embodiments described in this specification as appropriate.

Embodiment 5

In this embodiment, a light-emitting device (light-emitting element) that can be used in the display apparatus of one embodiment of the present invention will be described.

In this specification and the like, a device manufactured using a metal mask or an FMM (a fine metal mask, a high-resolution metal mask) may be referred to as a device having an MM (a metal mask) structure. In this specification and the like, a device manufactured without using a metal mask or an FMM may be referred to as a device having an MML (a metal maskless) structure.

In this specification and the like, a structure in which at least light-emitting layers of light-emitting devices with different emission wavelengths are separately formed may be referred to as a side-by-side (SBS) structure. The SBS structure can optimize materials and structures of light-emitting devices and thus can extend freedom of choice of materials and structures, whereby the luminance and the reliability can be easily improved.

In this specification and the like, a hole or an electron is sometimes referred to as a "carrier". Specifically, a hole-injection layer or an electron-injection layer may be referred to as a "carrier-injection layer", a hole-transport layer or an electron-transport layer may be referred to as a "carrier-transport layer", and a hole-blocking layer or an electron-blocking layer may be referred to as a "carrier-blocking layer". Note that the above-described carrier-injection layer, carrier-transport layer, and carrier-blocking layer cannot be clearly distinguished from each other on the basis of the cross-sectional shape, properties, or the like in some cases. One layer may have two or three functions of the carrier-injection layer, the carrier-transport layer, and the carrier-blocking layer in some cases.

In this specification and the like, a light-emitting device (also referred to as a light-emitting element) includes an EL layer between a pair of electrodes. The EL layer includes at least a light-emitting layer. Examples of layers (also referred to as functional layers) included in the EL layer include a light-emitting layer, carrier-injection layers (a hole-injection layer and an electron-injection layer), carrier-transport layers (a hole-transport layer and an electron-transport layer), and carrier-blocking layers (a hole-blocking layer and an electron-blocking layer).

As the light-emitting device, an organic light-emitting diode (OLED) or a quantum-dot light-emitting diode (QLED) is preferably used, for example. Examples of a light-emitting substance contained in the light-emitting device include a substance exhibiting fluorescence (fluorescent material), a substance exhibiting phosphorescence (phosphorescent material), a substance exhibiting thermally activated delayed fluorescence (thermally activated delayed fluorescent (TADF) material), and an inorganic compound (e.g., a quantum dot material). A light-emitting diode (LED) such as a micro-LED can also be used as the light-emitting device.

The emission color of the light-emitting device can be infrared, red, green, blue, cyan, magenta, yellow, white, or the like. When the light-emitting device has a microcavity structure, the color purity can be increased.

Figures 43A, 43B, 43C, 43D, 43E, 43F:
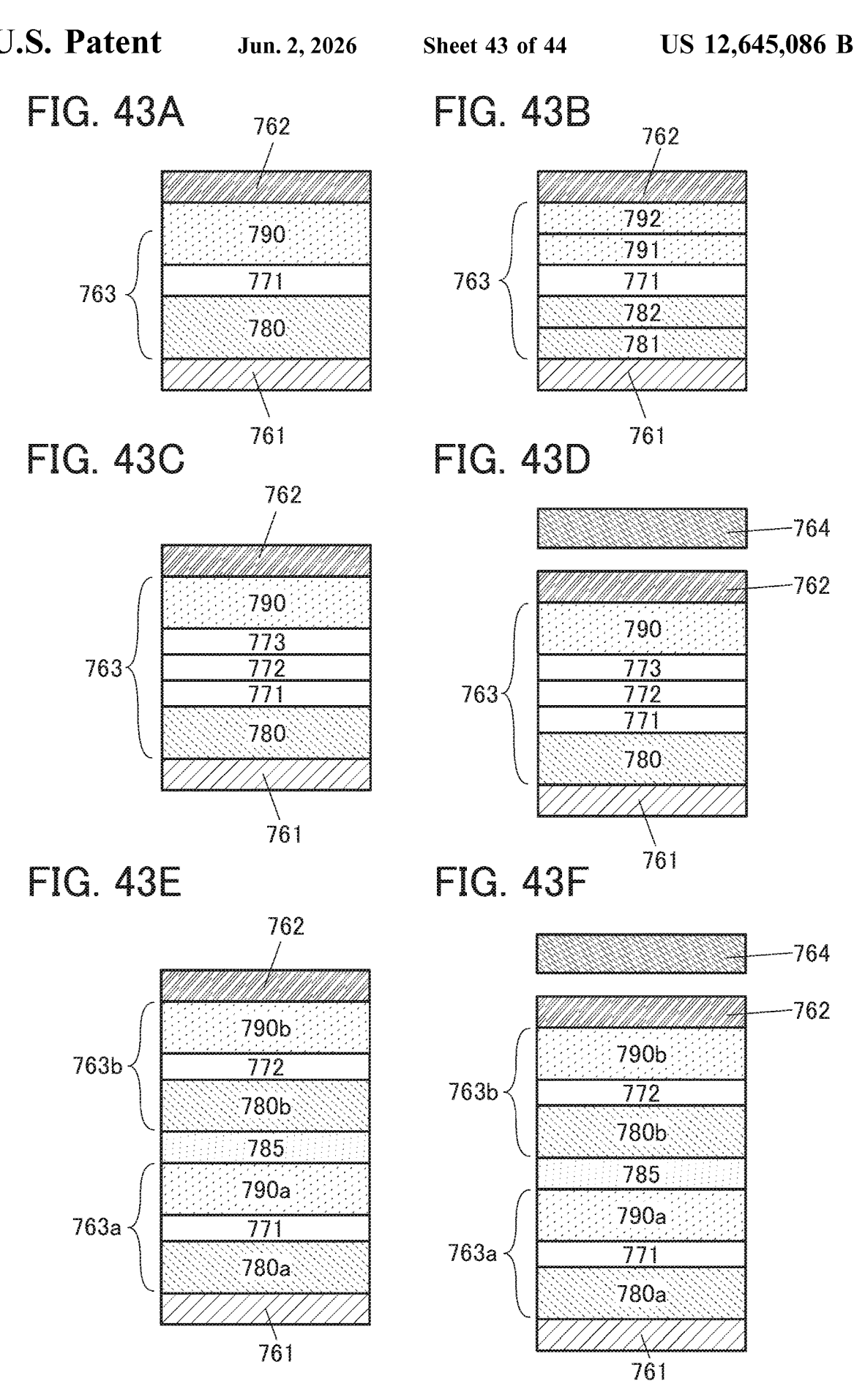
FIG. 43A to FIG. 43F are diagrams illustrating structure examples of a light-emitting device.

As illustrated in FIG. 43A, the light-emitting device includes an EL layer 763 between a pair of electrodes (a lower electrode 761 and an upper electrode 762). The EL layer 763 can be formed of a plurality of layers such as a layer 780, a light-emitting layer 771, and a layer 790.

The light-emitting layer 771 contains at least a light-emitting substance (also referred to as a light-emitting material).

In the case where the lower electrode 761 is an anode and the upper electrode 762 is a cathode, the layer 780 includes one or more of a layer containing a substance having a high hole-injection property (a hole-injection layer), a layer containing a substance having a high hole-transport property (a hole-transport layer), and a layer containing a substance having a high electron-blocking property (an electron-blocking layer). Furthermore, the layer 790 includes one or more of a layer containing a substance having a high electron-injection property (an electron-injection layer), a layer containing a substance having a high electron-transport property (an electron-transport layer), and a layer containing a substance having a high hole-blocking property (a hole-blocking layer). In the case where the lower electrode 761 is a cathode and the upper electrode 762 is an anode, the structures of the layer 780 and the layer 790 are replaced with each other.

The structure including the layer 780, the light-emitting layer 771, and the layer 790, which is provided between the pair of electrodes, can function as a single light-emitting unit, and the structure in FIG. 43A is referred to as a single structure in this specification.

FIG. 43B is a modification example of the EL layer 763 included in the light-emitting device illustrated in FIG. 43A. Specifically, the light-emitting device illustrated in FIG. 43B includes a layer 781 over the lower electrode 761, a layer 782 over the layer 781, the light-emitting layer 771 over the layer 782, a layer 791 over the light-emitting layer 771, a layer 792 over the layer 791, and the upper electrode 762 over the layer 792.

In the case where the lower electrode 761 is an anode and the upper electrode 762 is a cathode, the layer 781 can be a hole-injection layer, the layer 782 can be a hole-transport layer, the layer 791 can be an electron-transport layer, and the layer 792 can be an electron-injection layer, for example. In the case where the lower electrode 761 is a cathode and the upper electrode 762 is an anode, the layer 781 can be an electron-injection layer, the layer 782 can be an electron-transport layer, the layer 791 can be a hole-transport layer, and the layer 792 can be a hole-injection layer. With such a layered structure, carriers can be efficiently injected to the light-emitting layer 771, and the efficiency of the recombination of carriers in the light-emitting layer 771 can be enhanced.

Note that structures in which a plurality of light-emitting layers (light-emitting layers 771, 772, and 773) are provided between the layer 780 and the layer 790 as illustrated in FIG. 43C and FIG. 43D are other variations of the single structure. Although FIG. 43C and FIG. 43D illustrate the examples where three light-emitting layers are included, the light-emitting device having a single structure may include two or four or more light-emitting layers. In addition, the light-emitting device having a single structure may include a buffer layer between two light-emitting layers.

A structure where a plurality of light-emitting units (a light-emitting unit 763a and a light-emitting unit 763b) are connected in series with a charge-generation layer 785 (also referred to as an intermediate layer) therebetween as illustrated in FIG. 43E and FIG. 43F is referred to as a tandem structure in this specification. Note that a tandem structure may be referred to as a stack structure. The tandem structure enables a light-emitting device capable of high-luminance light emission. Furthermore, the tandem structure reduces the amount of current needed for obtaining the same luminance as compared with a single structure, and thus can improve the reliability.

Note that FIG. 43D and FIG. 43F illustrate examples where the display apparatus includes a layer 764 overlapping with the light-emitting device. FIG. 43D illustrates an example where the layer 764 overlaps with the light-emitting device illustrated in FIG. 43C, and FIG. 43F illustrates an example where the layer 764 overlaps with the light-emitting device illustrated in FIG. 43E.

One or both of a color conversion layer and a color filter (a coloring layer) can be used as the layer 764.

In FIG. 43C and FIG. 43D, light-emitting substances that emit light of the same color, or moreover, the same light-emitting substance may be used for the light-emitting layer 771, the light-emitting layer 772, and the light-emitting layer 773. For example, a light-emitting substance that emits blue light may be used for the light-emitting layer 771, the light-emitting layer 772, and the light-emitting layer 773. In a subpixel that emits blue light, blue light emitted from the light-emitting device can be extracted. In a subpixel that emits red light and a subpixel that emits green light, by providing a color conversion layer as the layer 764 illustrated in FIG. 43D, blue light emitted from the light-emitting device can be converted into light with a longer wavelength, and red or green light can be extracted.

Alternatively, light-emitting substances that emit light of different colors may be used for the light-emitting layer 771, the light-emitting layer 772, and the light-emitting layer 773. White light can be obtained when the light-emitting layer 771, the light-emitting layer 772, and the light-emitting layer 773 emit light of complementary colors. The light-emitting device having a single structure preferably includes a light-emitting layer containing a light-emitting substance emitting blue light and a light-emitting layer containing a light-emitting substance emitting visible light with a longer wavelength than blue light, for example.

In the case where the light-emitting device having a single structure includes three light-emitting layers, for example, a light-emitting layer containing a light-emitting substance emitting red (R) light, a light-emitting layer containing a light-emitting substance emitting green (G) light, and a light-emitting layer containing a light-emitting substance emitting blue (B) light are preferably included. The stacking order of the light-emitting layers can be RGB or RBG from an anode side, for example. In that case, a buffer layer may be provided between R and G or between R and B.

In the case where the light-emitting device having a single structure includes two light-emitting layers, for example, a light-emitting layer containing a light-emitting substance emitting blue (B) light and a light-emitting layer containing a light-emitting substance emitting yellow light are preferably included. Such a structure may be referred to as a BY single structure.

A color filter may be provided as the layer 764 illustrated in FIG. 43D. When white light passes through the color filter, light of a desired color can be obtained.

The light-emitting device that emits white light preferably contains two or more kinds of light-emitting substances. To obtain white light emission, two or more kinds of light-emitting substances are selected such that they emit light of complementary colors. For example, when an emission color of a first light-emitting layer and an emission color of a second light-emitting layer are complementary colors, the light-emitting device can emit white light as a whole. The same applies to a light-emitting device including three or more light-emitting layers.

In FIG. 43E and FIG. 43F, light-emitting substances that emit light of the same color, or moreover, the same light-emitting substance may be used for the light-emitting layer 771 and the light-emitting layer 772.

For example, in light-emitting devices included in sub-pixels emitting light of different colors, a light-emitting substance that emits blue light can be used for each of the light-emitting layer 771 and the light-emitting layer 772. In a subpixel that emits blue light, blue light emitted from the light-emitting device can be extracted. In the subpixel that emits red light and the subpixel that emits green light, by providing a color conversion layer as the layer 764 illustrated in FIG. 43F, blue light emitted from the light-emitting device can be converted into light with a longer wavelength, and red or green light can be extracted.

In the case where the light-emitting device having the structure illustrated in FIG. 43E or FIG. 43F is used for the subpixels emitting different colors, the subpixels may use different light-emitting substances. Specifically, in the light-emitting device included in the subpixel emitting red light, a light-emitting substance that emits red light can be used for each of the light-emitting layer 771 and the light-emitting layer 772. Similarly, in the light-emitting device included in the subpixel emitting green light, a light-emitting substance that emits green light can be used for each of the light-emitting layer 771 and the light-emitting layer 772. In the light-emitting device included in the subpixel emitting blue light, a light-emitting substance that emits blue light can be used for each of the light-emitting layer 771 and the light-emitting layer 772. A display apparatus with such a structure includes a light-emitting device with a tandem structure and can be regarded to have an SBS structure. Thus, the display apparatus can take advantages of both the tandem structure and the SBS structure. Accordingly, a highly reliable light-emitting device capable of high luminance light emission can be obtained.

In FIG. 43E and FIG. 43F, light-emitting substances emitting light of different colors may be used for the light-emitting layer 771 and the light-emitting layer 772. White light can be obtained when the light-emitting layer 771 and the light-emitting layer 772 emit light of complementary colors. A color filter may be provided as the layer 764 illustrated in FIG. 43F. When white light passes through the color filter, light of a desired color can be obtained.

Although FIG. 43E and FIG. 43F illustrate examples where the light-emitting unit 763*a* includes one light-emitting layer 771 and the light-emitting unit 763*b* includes one the light-emitting layer 772, one embodiment of the present invention is not limited thereto. Each of the light-emitting unit 763*a* and the light-emitting unit 763*b* may include two or more light-emitting layers.

In addition, although FIG. 43E and FIG. 43F each illustrate the light-emitting device including two light-emitting units, one embodiment of the present invention is not limited thereto. The light-emitting device may include three or more light-emitting units.

Figure 44A:
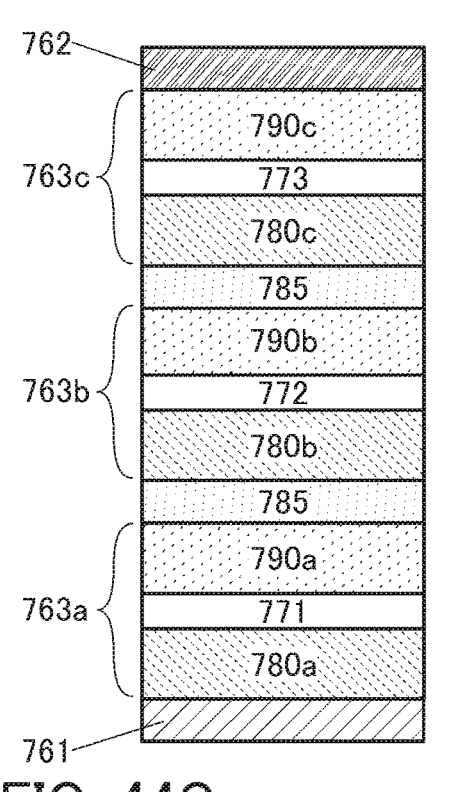
FIG. 44A to FIG. 44C are diagrams illustrating structure examples of a light-emitting device.
Figure 44B:
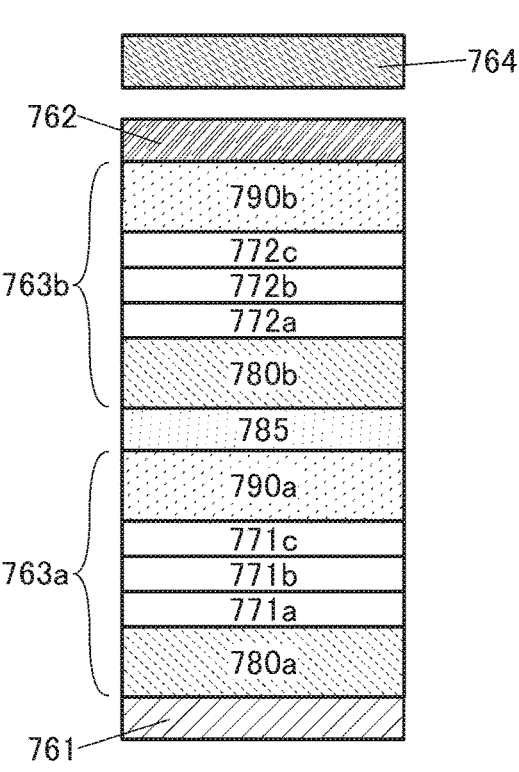
Figure 44C:
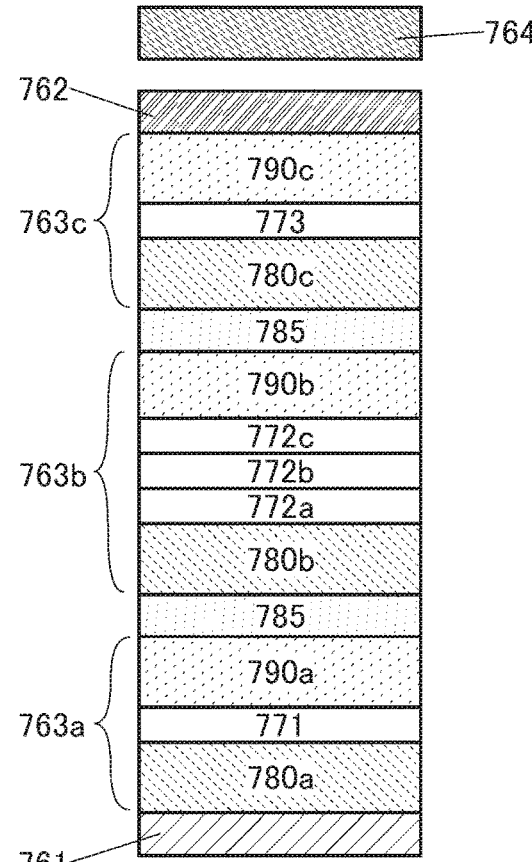

Specifically, light-emitting device with structures illustrated in FIG. 44A to 44C can be given.

FIG. 44A illustrates a structure including three light-emitting units. Note that a structure including two light-emitting units and a structure including three light-emitting units may be referred to as a two-unit tandem structure and a three-unit tandem structure, respectively.

As illustrated in FIG. 44A, a plurality of light-emitting units (the light-emitting unit 763*a*, the light-emitting unit 763*b*, and the light-emitting unit 763*c*) are connected in series through the charge-generation layers 785. The light-emitting unit 763*a* includes a layer 780*a*, the light-emitting layer 771, and a layer 790*a*. The light-emitting unit 763*b* includes a layer 780*b*, the light-emitting layer 772, and a layer 790*b*. The light-emitting unit 763*c* includes a layer 780*c*, the light-emitting layer 773, and a layer 790*c*.

Note that in the structure illustrated in FIG. 44A, the light-emitting layer 771, the light-emitting layer 772, and the light-emitting layer 773 preferably contain light-emitting substances that emit light of the same color. Specifically, a structure in which the light-emitting layer 771, the light-emitting layer 772, and the light-emitting layer 773 each contain a red (R) light-emitting substance (what is called a three-unit tandem structure of R\R\R), a structure in which the light-emitting layer 771, the light-emitting layer 772, and the light-emitting layer 773 each contain a green (G) light-emitting substance (what is called a three-unit tandem structure of G\G\G), or a structure in which the light-emitting layer 771, the light-emitting layer 772, and the light-emitting layer 773 each contain a blue (B) light-emitting substance (what is called a three-unit tandem structure of B\B\B) can be employed.

Note that the structure containing the light-emitting substances that emit light of the same color is not limited to the above structure. For example, a light-emitting device with a tandem structure may be employed in which light-emitting units each containing a plurality of light-emitting substances are stacked as illustrated in FIG. 44B. FIG. 44B illustrates a structure in which a plurality of light-emitting units (the light-emitting unit 763*a* and the light-emitting unit 763*b*) are connected in series with the charge-generation layer 785 therebetween. The light-emitting unit 763*a* includes the layer 780*a*, a light-emitting layer 771*a*, a light-emitting layer 771*b*, a light-emitting layer 771*c*, and the layer 790*a*, and the light-emitting unit 763*b* includes the layer 780*b*, a light-emitting layer 772*a*, a light-emitting layer 772*b*, a light-emitting layer 772*c*, and the layer 790*b*.

In the structure illustrated in FIG. 44B, light-emitting substances for the light-emitting layer 771*a*, the light-emitting layer 771*b*, and the light-emitting layer 771*c* are selected so as to emit light of complementary colors to obtain white (W) light emission. Furthermore, light-emitting substances for the light-emitting layer 772*a*, the light-emitting layer 772*b*, and the light-emitting layer 772*c* are selected so as to emit light of complementary colors to obtain white (W) light emission. That is, the structure illustrated in FIG. 44C is a two-unit tandem structure of WWW. Note that there is no particular limitation on the stacking order of the light-emitting substances emitting light of complementary colors for the light-emitting layer 771*a*, the light-emitting layer 771*b*, and the light-emitting layer 771*c*. The practitioner can select the optimal stacking order as appropriate. Although not illustrated, a three-unit tandem structure of W\W\W\W or a tandem structure with four or more units may be employed.

In the case of a light-emitting device with a tandem structure, any of the following structure may be employed, for example: a two-unit tandem structure of BY including a light-emitting unit that emits yellow (Y) light and a light-emitting unit that emits blue (B) light; a two-unit tandem structure of R·G\B including a light-emitting unit that emits red (R) and green (G) light and a light-emitting unit that emits blue (B) light; a three-unit tandem structure of B\Y\B including a light-emitting unit that emits blue (B) light, a light-emitting unit that emits yellow (Y) light, and a light-emitting unit that emits blue (B) light in this order; a three-unit tandem structure of B\YG\B including a light-emitting unit that emits blue (B) light, a light-emitting unit that emits yellow-green (YG) light, and a light-emitting unit that emits blue (B) light in this order; and a three-unit tandem structure of B\G\B including a light-emitting unit that emits blue (B) light, a light-emitting unit that emits green (G) light, and a light-emitting unit that emits blue (B) light in this order.

Alternatively, a light-emitting unit containing one light-emitting substance and a light-emitting unit containing a plurality of light-emitting substances may be used in combination as illustrated in FIG. 44C.

Specifically, in the structure illustrated in FIG. 44C, a plurality of light-emitting units (the light-emitting unit 763*a*, the light-emitting unit 763*b*, and the light-emitting unit 763*c*) are connected in series through the charge-generation layers 785. The light-emitting unit 763*a* includes the layer 780*a*, the light-emitting layer 771, and the layer 790*a*. The light-emitting unit 763*b* includes a layer 780*b*, the light-emitting layer 772*a*, the light-emitting layer 772*b*, the light-emitting layer 772*c*, and the layer 790*b*. The light-emitting unit 763*c* includes the layer 780*c*, the light-emitting layer 773, and the layer 790*c*.

As the structure illustrated in FIG. 44C, for example, a three-unit tandem structure of B\R·G·YG\B in which the light-emitting unit 763*a* is a light-emitting unit emitting blue (B) light, the light-emitting unit 763*b* is a light-emitting unit emitting red (R), green (G), and yellow-green (YG) light, and the light-emitting unit 763*c* is a light-emitting unit emitting blue (B) light can be employed.

Examples of the number of stacked light-emitting units and the order of colors from the anode side include a two-unit structure of B and Y, a two-unit structure of B and a light-emitting unit X, a three-unit structure of B, Y, and B, and a three-unit structure of B, X, and B. Examples of the number of light-emitting layers stacked in the light-emitting unit X and the order of colors from an anode side include a two-layer structure of R and Y, a two-layer structure of R and G, a two-layer structure of G and R, a three-layer structure of G, R, and G, and a three-layer structure of R, G, and R. Another layer may be provided between two light-emitting layers.

Also in FIG. 43C and FIG. 43D, the layer 780 and the layer 790 may each independently have a stacked-layer structure of two or more layers as illustrated in FIG. 43B.

In FIG. 43E and FIG. 43F, the light-emitting unit 763*a* includes the layer 780*a*, the light-emitting layer 771, and the layer 790*a*, and the light-emitting unit 763*b* includes the layer 780*b*, the light-emitting layer 772, and the layer 790*b*.

In the case where the lower electrode 761 is an anode and the upper electrode 762 is a cathode, the layer 780*a* and the layer 780*b* each include one or more of a hole-injection layer, a hole-transport layer, and an electron-blocking layer. The layer 790*a* and the layer 790*b* each include one or more of an electron-injection layer, an electron-transport layer, and a hole-blocking layer. In the case where the lower electrode 761 is a cathode and the upper electrode 762 is an anode, the structures of the layer 780*a* and the layer 790*a* are replaced with each other, and the structures of the layer 780*b* and the layer 790*b* are also replaced with each other.

In the case where the lower electrode 761 is an anode and the upper electrode 762 is a cathode, for example, the layer 780*a* includes a hole-injection layer and a hole-transport layer over the hole-injection layer, and may further include an electron-blocking layer over the hole-transport layer. The layer 790*a* includes an electron-transport layer, and may further include a hole-blocking layer between the light-emitting layer 771 and the electron-transport layer. The layer 780*b* includes a hole-transport layer, and may further include an electron-blocking layer over the hole-transport layer. The layer 790*b* includes an electron-transport layer and an electron-injection layer over the electron-transport layer, and may further include a hole-blocking layer between the light-emitting layer 771 and the electron-transport layer. In the case where the lower electrode 761 is a cathode and the upper electrode 762 is an anode, for example, the layer 780*a* includes an electron-injection layer and an electron-transport layer over the electron-injection layer, and may further include a hole-blocking layer over the electron-transport layer. The layer 790*a* includes a hole-transport layer and may further include an electron-blocking layer between the light-emitting layer 771 and the hole-transport layer. The layer 780*b* includes an electron-transport layer, and may further include a hole-blocking layer over the electron-transport layer. The layer 790*b* includes a hole-transport layer and a hole-injection layer over the hole-transport layer, and may further include an electron-blocking layer between the light-emitting layer 771 and the hole-transport layer.

In the case of fabricating the light-emitting device with a tandem structure, two light-emitting units are stacked with the charge-generation layer 785 therebetween. The charge-generation layer 785 includes at least a charge-generation region. The charge-generation layer 785 has a function of injecting electrons into one of the two light-emitting units and injecting holes into the other when voltage is applied between the pair of electrodes.

Next, materials that can be used for the light-emitting device will be described.

A conductive film transmitting visible light is used as the electrode through which light is extracted, which is either the lower electrode 761 or the upper electrode 762. A conductive film that reflects visible light is preferably used for the electrode through which light is not extracted. In the case where a display apparatus includes a light-emitting device emitting infrared light, a conductive film transmitting visible light and infrared light is preferably used as the electrode through which light is extracted, and a conductive film reflecting visible light and infrared light is preferably used as the electrode through which light is not extracted.

A conductive film transmitting visible light may be used also for the electrode through which light is not extracted. In this case, this electrode is preferably provided between the reflective layer and the EL layer 763. In other words, light emitted from the EL layer 763 may be reflected by the reflective layer to be extracted from the display apparatus.

As a material that forms the pair of electrodes of the light-emitting device, a metal, an alloy, an electrically conductive compound, a mixture thereof, and the like can be used as appropriate. Specific examples of the material include metals such as aluminum, titanium, chromium, manganese, iron, cobalt, nickel, copper, gallium, zinc, indium, tin, molybdenum, tantalum, tungsten, palladium, gold, platinum, silver, yttrium, and neodymium, and an alloy containing appropriate combination of any of these metals. Other examples of the material include indium tin oxide (also referred to as In—Sn oxide or ITO), In—Si—Sn oxide (also referred to as ITSO), indium zinc oxide (In—Zn oxide), and In—W—Zn oxide. Other examples of the material include an alloy containing aluminum (aluminum alloy) such as an alloy of aluminum, nickel, and lanthanum (Al—Ni—La), and an alloy of silver, palladium, and copper (Ag—Pd—Cu, also referred to as APC). Other examples of the material include elements belonging to Group 1 or Group 2 of the periodic table, which are not exemplified above (e.g., lithium, cesium, calcium, and strontium), rare earth metals such as europium and ytterbium, an alloy containing any of these metals in appropriate combination, and graphene.

The light-emitting device preferably employs a microcavity structure. Accordingly, one of the pair of electrodes of the light-emitting device preferably includes an electrode having a transmitting property and a reflecting property with respect to visible light (transflective electrode), and the other is preferably an electrode having a reflecting property with respect to visible light (reflective electrode). When the light-emitting device has a microcavity structure, light obtained from the light-emitting layer can be resonated between the electrodes, whereby light emitted from the light-emitting device can be intensified.

Note that the transflective electrode can have a stacked-layer structure of a conductive layer that can be used as a reflective electrode and a conductive layer having a visible-light-transmitting property (also referred to as a transparent electrode).

The light transmittance of the transparent electrode is higher than or equal to 40%. For example, an electrode having a visible light (light with wavelengths greater than or equal to 400 nm and less than 750 nm) transmittance higher than or equal to 40% is preferably used in the transparent electrode of the light-emitting device. The transflective electrode has a visible light reflectance higher than or equal to 10% and lower than or equal to 95%, preferably higher than or equal to 30% and lower than or equal to 80%. The reflective electrode has a visible light reflectance higher than or equal to 40% and lower than or equal to 100%, preferably higher than or equal to 70% and lower than or equal to 100%. These electrodes preferably have a resistivity lower than or equal to $1 \times 10^{-2}$ $\Omega$cm.

The light-emitting device includes at least a light-emitting layer. In addition to the light-emitting layer, the light-emitting device may further include a layer containing any of a substance having a high hole-injection property, a substance having a high hole-transport property, a hole-blocking material, a substance having a high electron-transport property, a substance having a high electron-injection property, an electron-blocking material, a substance having a bipolar property (a substance with a high electron- and hole-transport property), and the like. For example, the light-emitting device can include one or more of a hole-injection layer, a hole-transport layer, a hole-blocking layer, a charge-generation layer, an electron-blocking layer, an electron-transport layer, and an electron-injection layer in addition to the light-emitting layer.

Either a low molecular compound or a high molecular compound can be used in the light-emitting device, and an inorganic compound may also be contained. Each layer included in the light-emitting device can be formed, for example, by an evaporation method (including a vacuum evaporation method), a transfer method, a printing method, an inkjet method, or a coating method.

The light-emitting layer contains one or more kinds of light-emitting substances. As the light-emitting substance, a substance whose emission color is blue, violet, bluish violet, green, yellowish green, yellow, orange, red, or the like is appropriately used. Alternatively, as the light-emitting substance, a substance that emits near-infrared light can be used.

Examples of the light-emitting substance include a fluorescent material, a phosphorescent material, a TADF material, and a quantum dot material.

Examples of a fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of a phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material or an assist material) in addition to the light-emitting substance (guest material). As one or more kinds of organic compounds, one or both of a substance having a high hole-transport property (a hole-transport material) and a substance having a high electron-transport property (an electron-transport material) can be used. As the hole-transport material, it is possible to use a material with a high hole-transport property which can be used for the hole-transport layer and will be described later. As the electron-transport material, it is possible to use a material having a high electron-transport property which can be used for the electron-transport layer and will be described later. Alternatively, as one or more kinds of organic compounds, a bipolar material or a TADF material may be used.

The light-emitting layer preferably includes, for example, a phosphorescent material and a combination of a hole-transport material and an electron-transport material that easily forms an exciplex. With such a structure, light emission can be efficiently obtained by ExTET (Exciplex-Triplet Energy Transfer), which is energy transfer from an exciplex to a light-emitting substance (a phosphorescent material). When a combination of materials is selected so as to form an exciplex that exhibits light emission whose wavelength overlaps with the wavelength of a lowest-energy-side absorption band of the light-emitting substance, energy can be transferred smoothly and light emission can be obtained efficiently. With the above structure, high efficiency, low-voltage driving, and a long lifetime of a light-emitting device can be achieved at the same time.

The hole-injection layer is a layer that injects holes from an anode to the hole-transport layer and contains a material with a high hole-injection property. Examples of the material with a high hole-injection property include an aromatic amine compound and a composite material containing a hole-transport material and an acceptor material (electron-accepting material).

As the hole-transport material, it is possible to use a material with a high hole-transport property which can be used for the hole-transport layer and will be described later.

As the acceptor material, an oxide of a metal belonging to any of Group 4 to Group 8 of the periodic table can be used, for example. Specific examples include molybdenum oxide, vanadium oxide, niobium oxide, tantalum oxide, chromium oxide, tungsten oxide, manganese oxide, and rhenium oxide. Among these, molybdenum oxide is especially preferable because it is stable in the air, has a low hygroscopic property, and is easy to handle. Alternatively, an organic acceptor material containing fluorine can be used. Alternatively, organic acceptor materials such as a quinodimethane derivative, a chloranil derivative, and a hexaazatriphenylene derivative can also be used.

For example, a hole-transport material and a material containing an oxide of a metal belonging to Group 4 to Group 8 of the periodic table (typically, molybdenum oxide) may be used as the material having a high hole-injection property.

The hole-transport layer is a layer transporting holes, which are injected from the anode by the hole-injection layer, to the light-emitting layer. The hole-transport layer is a layer that contains a hole-transport material. As the hole-transport material, a substance having a hole mobility greater than or equal to $1\times10^{-6}$ cm$^2$/Vs is preferable. Note that other substances can also be used as long as they have a property of transporting more holes than electrons. As the hole-transport material, materials with a high hole-transport property, such as a π-electron rich heteroaromatic compound (e.g., a carbazole derivative, a thiophene derivative, and a furan derivative) and an aromatic amine (a compound having an aromatic amine skeleton), are preferable.

The electron-blocking layer is provided in contact with the light-emitting layer. The electron-blocking layer has a hole-transport property and contains a material capable of blocking electrons. Any of the materials having an electron-blocking property among the above hole-transport materials can be used for the electron-blocking layer.

The electron-blocking layer has a hole-transport property, and thus can also be referred to as a hole-transport layer. A layer having an electron-blocking property among the hole-transport layers can also be referred to as an electron-blocking layer.

The electron-transport layer is a layer transporting electrons, which are injected from the cathode by the electron-injection layer, to the light-emitting layer. The electron-transport layer is a layer that contains an electron-transport material. As the electron-transport material, a substance having an electron mobility greater than or equal to $1\times10^{-6}$ cm$^2$/Vs is preferable. Note that other substances can also be used as long as they have a property of transporting more electrons than holes. As the electron-transport material, it is possible to use a material with a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a T-electron deficient heteroaromatic compound such as a nitrogen-containing heteroaromatic compound.

The hole-blocking layer is provided in contact with the light-emitting layer. The hole-blocking layer is a layer having an electron-transport property and containing a material that can block holes. Any of the materials having a hole-blocking property among the above electron-transport materials can be used for the hole-blocking layer.

The hole-blocking layer has an electron-transport property, and thus can also be referred to as an electron-transport layer. A layer having a hole-blocking property among the electron-transport layers can also be referred to as a hole-blocking layer.

The electron-injection layer is a layer that injects electrons from the cathode to the electron-transport layer and contains a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

The difference between the LUMO level of the substance with a high electron-injection property and the work function value of the material used for the cathode is preferably small (specifically, smaller than or equal to 0.5 eV).

The electron-injection layer can be formed using an alkali metal, an alkaline earth metal, or a compound thereof, such as lithium, cesium, ytterbium, lithium fluoride (LiF), cesium fluoride (CsF), calcium fluoride (CaF$_x$, where x is a given number), 8-(quinolinolato)lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl) phenolatolithium (abbreviation: LiPPP), lithium oxide (LiO$_x$), or cesium carbonate, for example. The electron-injection layer may have a stacked-layer structure of two or more layers. As an example of the stacked-layer structure, a structure in which lithium fluoride is used for the first layer and ytterbium is used for the second layer is given.

The electron-injection layer may contain an electron-transport material. For example, a compound having an unshared electron pair and an electron deficient heteroaromatic ring can be used as the electron-transport material. Specifically, it is possible to use a compound having at least one of a pyridine ring, a diazine ring (a pyrimidine ring, a pyrazine ring, or a pyridazine ring), and a triazine ring.

Note that the lowest unoccupied molecular orbital (LUMO) level of the organic compound having an unshared electron pair is preferably greater than or equal to –3.6 eV and less than or equal to –2.3 eV. In addition, in general, the highest occupied molecular orbital (HOMO) level and the LUMO level of an organic compound can be estimated by cyclic voltammetry (CV), photoelectron spectroscopy, optical absorption spectroscopy, inverse photoelectron spectroscopy, or the like.

For example, 4,7-diphenyl-1,10-phenanthroline (abbreviation: BPhen), 2,9-di(naphthalen-2-yl)-4,7-diphenyl-1,10-phenanthroline (abbreviation: NBPhen), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used as the organic compound having an unshared electron pair. Note that NBPhen has a higher glass transition point (Tg) than BPhen and thus has high heat resistance.

As described above, the charge-generation layer includes at least a charge-generation region. The charge-generation region preferably contains an acceptor material, and for example, preferably contains a hole-transport material and an acceptor material which can be used for the above-described hole-injection layer.

The charge-generation layer preferably includes a layer containing a material having a high electron-injection property. The layer can also be referred to as an electron-injection buffer layer. The electron-injection buffer layer is preferably provided between the charge-generation region and the electron-transport layer. By provision of the electron-injection buffer layer, an injection barrier between the charge-generation region and the electron-transport layer can be lowered; thus, electrons generated in the charge-generation region can be easily injected into the electron-transport layer.

The electron-injection buffer layer preferably contains an alkali metal or an alkaline earth metal, and for example, can be configured to contain an alkali metal compound or an alkaline earth metal compound. Specifically, the electron-injection buffer layer preferably contains an inorganic compound containing an alkali metal and oxygen or an inorganic compound containing an alkaline earth metal and oxygen, further preferably contains an inorganic compound containing lithium and oxygen (e.g., lithium oxide (LizO)). Alternatively, a material that can be used for the electron-injection layer can be favorably used for the electron-injection buffer layer.

The charge-generation layer preferably includes a layer containing a material having a high electron-transport property. The layer can also be referred to as an electron-relay layer. The electron-relay layer is preferably provided between the charge-generation region and the electron-injection buffer layer. In the case where the charge-generation layer does not include an electron-injection buffer layer, the electron-relay layer is preferably provided between the charge-generation region and the electron-transport layer. The electron-relay layer has a function of preventing interaction between the charge-generation region and the electron-injection buffer layer (or the electron-transport layer) and smoothly transferring electrons.

A phthalocyanine-based material such as copper(II) phthalocyanine (abbreviation: CuPc) or a metal complex having a metal-oxygen bond and an aromatic ligand is preferably used for the electron-relay layer.

Note that the charge-generation region, the electron-injection buffer layer, and the electron-relay layer cannot be clearly distinguished from each other in some cases on the basis of the cross-sectional shapes, properties, or the like.

Note that the charge-generation layer may contain a donor material instead of an acceptor material. For example, the charge-generation layer may include a layer containing an electron-transport material and a donor material, which can be used for the electron-injection layer.

When the light-emitting units are stacked, provision of a charge-generation layer between two light-emitting units can suppress an increase in driving voltage.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

REFERENCE NUMERALS

500A: electronic device, 500B: electronic device, 500C: electronic device, 500: electronic device, 501: housing, 502: first portion, 503: second portion, 504: optical member, 505: wearing tool, 506: portion, 507: battery, 511: display apparatus, 512: lens, 520: cable, 521: display apparatus, 522: reflective plate, 523: reflective surface, 524: optical member, 525: optical member, 526: lens, 530L: left hand, 530R: right hand, 531: camera, 532: camera, 533: camera, 540L: left hand, 540R: right hand, 540: user, 550A: terminal, 550B: terminal, 550C: terminal, 550: terminal, 551: control unit, 552: storage unit, 553: open/close sensor, 554: communication unit, 555: brain wave sensor, 556: audio output unit, 557: microphone, 558: communication unit, 560: field of view, 561: image information, 562: image information, 563: image, 564: object, 565: menu icon, 570: housing, 571: control unit, 572: storage unit, 573: communication unit, 574: communication unit, 575: display apparatus, 576: camera, 577: sensor, 578: band, 579: earphone, 580: controller

The invention claimed is:

1. An electronic device comprising:
a first display apparatus;
a second display apparatus;
a lens;
a screen;
a wearing tool; and
a housing,
wherein the wearing tool is configured to fix the housing to a head, wherein the housing is configured to be transformed into a first mode that closes to block view and a second mode that opens to allow a front side to be viewed, and
wherein the electronic device is configured to:
provide a first image displayed on the first display apparatus through the lens and the screen in the first mode; and
provide a second image projected to the screen from the second display apparatus in the second mode.

2. The electronic device according to claim 1,
wherein the housing comprises a first portion that opens and closes and a second portion that is fixed to the screen,
wherein the first display apparatus and the lens are provided in the first portion, and
wherein the second display apparatus is provided in the second portion.

3. The electronic device according to claim 1,
wherein a display region of the first display apparatus has a larger area than a display region of the second display apparatus.

4. The electronic device according to claim 1,
wherein the second display apparatus has a higher resolution than the first display apparatus.

5. The electronic device according to claim 1,
wherein each of the first display apparatus and the second display apparatus has a resolution greater than or equal to 3000 ppi and less than or equal to 10000 ppi.

6. The electronic device according to claim 1,
wherein a display region of the first display apparatus has a diagonal size greater than or equal to 1.3 inches and less than or equal to 1.7 inches.

7. The electronic device according to claim 1, further comprising:
a pair of first cameras; and
a pair of second cameras,
wherein the first camera is configured to capture an image of a front side of the housing,
wherein the second camera is configured to capture an image of a user's eye, and
wherein the electronic device is configured to:
obtain gesture information using the first camera; and
obtain information on an iris or information on movement of a visual line using the second camera.

8. The electronic device according to claim 7, further comprising:
a pair of third cameras,
wherein the third camera is configured to capture an image of a front side of the housing, and
wherein the third camera has a narrower angle of view than the first camera.

9. An electronic device comprising:
a first display apparatus;
a second display apparatus;
a lens;
a screen;
a wearing tool;
a housing; and
a communication unit,
wherein the wearing tool is configured to fix the housing to a head,
wherein the housing is configured to be transformed into a first mode that closes to block a field of view and a second mode that opens to allow a front side to be viewed,
wherein the electronic device is configured to:

provide a first image displayed on the first display apparatus through the lens and the screen in the first mode; and provide a second image projected to the screen from the second display apparatus in the second mode, wherein the communication unit is configured to perform wired or wireless communication with a terminal, and wherein first image data supplied to the first display apparatus and second image data supplied to the second display apparatus are each supplied from the terminal.

10. A communication system comprising:

the electronic device and the terminal according to claim 9; and a server, wherein the electronic device and the terminal are capable of other communication, and wherein the terminal and the server are connected to each other via a network.

11. The electronic device according to claim 9, wherein the housing comprises a first portion that opens and closes and a second portion that is fixed to the screen, wherein the first display apparatus and the lens are provided in the first portion, and wherein the second display apparatus is provided in the second portion.

12. The electronic device according to claim 9, wherein a display region of the first display apparatus has a larger area than a display region of the second display apparatus.

13. The electronic device according to claim 9, wherein the second display apparatus has a higher resolution than the first display apparatus.

14. The electronic device according to claim 9, wherein each of the first display apparatus and the second display apparatus has a resolution greater than or equal to 3000 ppi and less than or equal to 10000 ppi.

15. The electronic device according to claim 9, wherein a display region of the first display apparatus has a diagonal size greater than or equal to 1.3 inches and less than or equal to 1.7 inches.

* * * * *